(12) United States Patent
Zhuang et al.

(10) Patent No.: US 10,886,223 B2
(45) Date of Patent: Jan. 5, 2021

(54) SEMICONDUCTOR PACKAGE

(71) Applicant: Advanced Semiconductor Engineering, Inc., Kaohsiung (TW)

(72) Inventors: Chun-Jun Zhuang, Kaohsiung (TW); Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/430,365

(22) Filed: Jun. 3, 2019

(65) Prior Publication Data

US 2020/0381359 A1 Dec. 3, 2020

(51) Int. Cl.
*H01L 21/56* (2006.01)
*H01L 23/528* (2006.01)
*H01L 23/31* (2006.01)
*H01L 23/00* (2006.01)
*H01L 25/065* (2006.01)

(52) U.S. Cl.
CPC ........ *H01L 23/5283* (2013.01); *H01L 21/566* (2013.01); *H01L 23/3128* (2013.01); *H01L 24/08* (2013.01); *H01L 24/17* (2013.01); *H01L 24/32* (2013.01); *H01L 24/73* (2013.01); *H01L 25/0657* (2013.01); *H01L 2224/0231* (2013.01); *H01L 2224/02381* (2013.01); *H01L 2224/73253* (2013.01)

(58) Field of Classification Search
CPC ............ H01L 23/5283; H01L 23/3128; H01L 21/566; H01L 24/08; H01L 24/17; H01L 24/32; H01L 24/73; H01L 25/0657; H01L 2224/0231; H01L 2224/02381; H01L 2224/73253
USPC ...................................................... 257/690
See application file for complete search history.

(56) References Cited

U.S. PATENT DOCUMENTS

| | | | |
|---|---|---|---|
| 2004/0183179 A1 | 9/2004 | Shieh et al. | |
| 2014/0217604 A1* | 8/2014 | Chou | H01L 21/486 257/774 |
| 2017/0221859 A1* | 8/2017 | Chen | H01L 23/552 |
| 2018/0286776 A1* | 10/2018 | Tai | H01L 21/561 |
| 2019/0088564 A1* | 3/2019 | Tai | H01L 21/6835 |
| 2019/0371766 A1* | 12/2019 | Liu | H01L 25/0657 |

* cited by examiner

*Primary Examiner* — Tong-Ho Kim
(74) *Attorney, Agent, or Firm* — Foley & Lardner LLP

(57) ABSTRACT

A semiconductor package includes a redistribution layer (RDL) structure, a first die, a molding compound and an interconnect structure. The first die is disposed on the RDL structure. The molding compound is disposed on the RDL structure. The interconnect structure electrically connects the first die to the RDL structure.

20 Claims, 66 Drawing Sheets

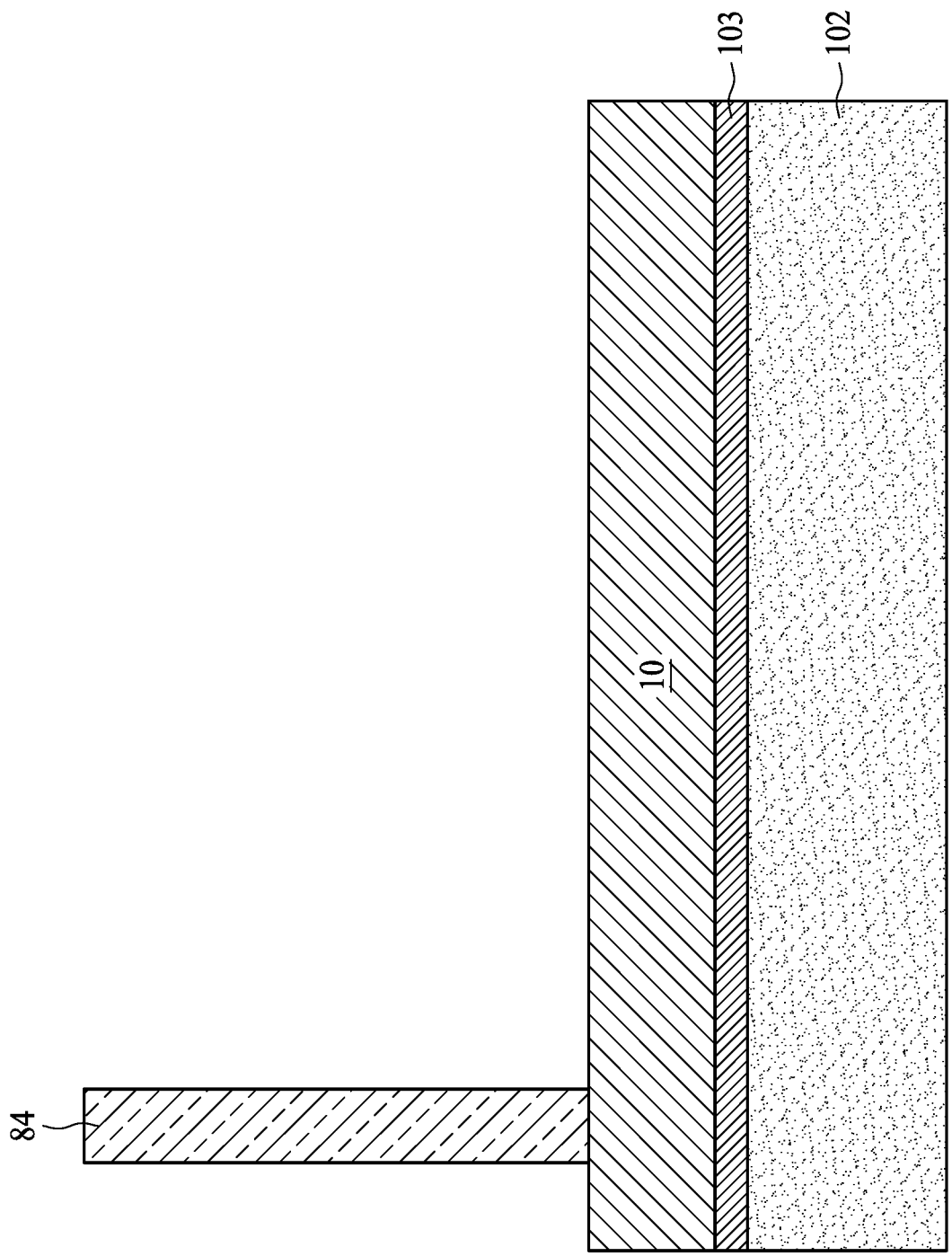

SEMICONDUCTOR PACKAGE

BACKGROUND

1. Technical Field

The present disclosure relates a semiconductor device. In particular, the present disclosure relates to a semiconductor device without using wire-bonds.

2. Description of the Related Art

Some semiconductor device packages may use wire-bonding technique. For example, wire-bonding technique may be used for electrical connection between semiconductor devices. However, loop height of the conductive wires may hinder miniaturization of the semiconductor device package. Moreover, the conductive wire is vulnerable to mold flow during manufacture of the semiconductor device package. Besides, relatively long wire(s) may cause parasitic inductance or parasitic effect, which may lead to relatively great impedance as the working or operating frequency increases. The relatively great impedance may adversely affect performance of these semiconductor device packages. An improved structure strength and reliability for the package is desired.

SUMMARY

In an aspect, a semiconductor package includes a redistribution layer (RDL) structure, a first die, a molding compound and an interconnect structure. The first die is disposed on the RDL structure. The molding compound is disposed on the RDL structure. The interconnect structure electrically connects the first die to the RDL structure.

In an aspect, a semiconductor package includes a RDL structure, a first die, a second die and an interconnect structure. The first die is disposed on the RDL structure. The second die is disposed on the first die. The interconnect structure is disposed to a side of the first die and provides electrical connection between the first die, the second die and the RDL structure.

In an aspect, a method for manufacturing a semiconductor package includes providing a redistribution layer (RDL) structure; providing a first die on the RDL structure; forming a conductive post on and electrically connected to the RDL structure; encapsulating the first die and the conductive post by a first molding compound; forming a lateral conductive structure extending from the conductive post to a conductive terminal of the first die.

BRIEF DESCRIPTION OF THE DRAWINGS

FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, and FIG. 5M illustrate a method of manufacturing a semiconductor package in accordance with an embodiment of the present disclosure.

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1A:
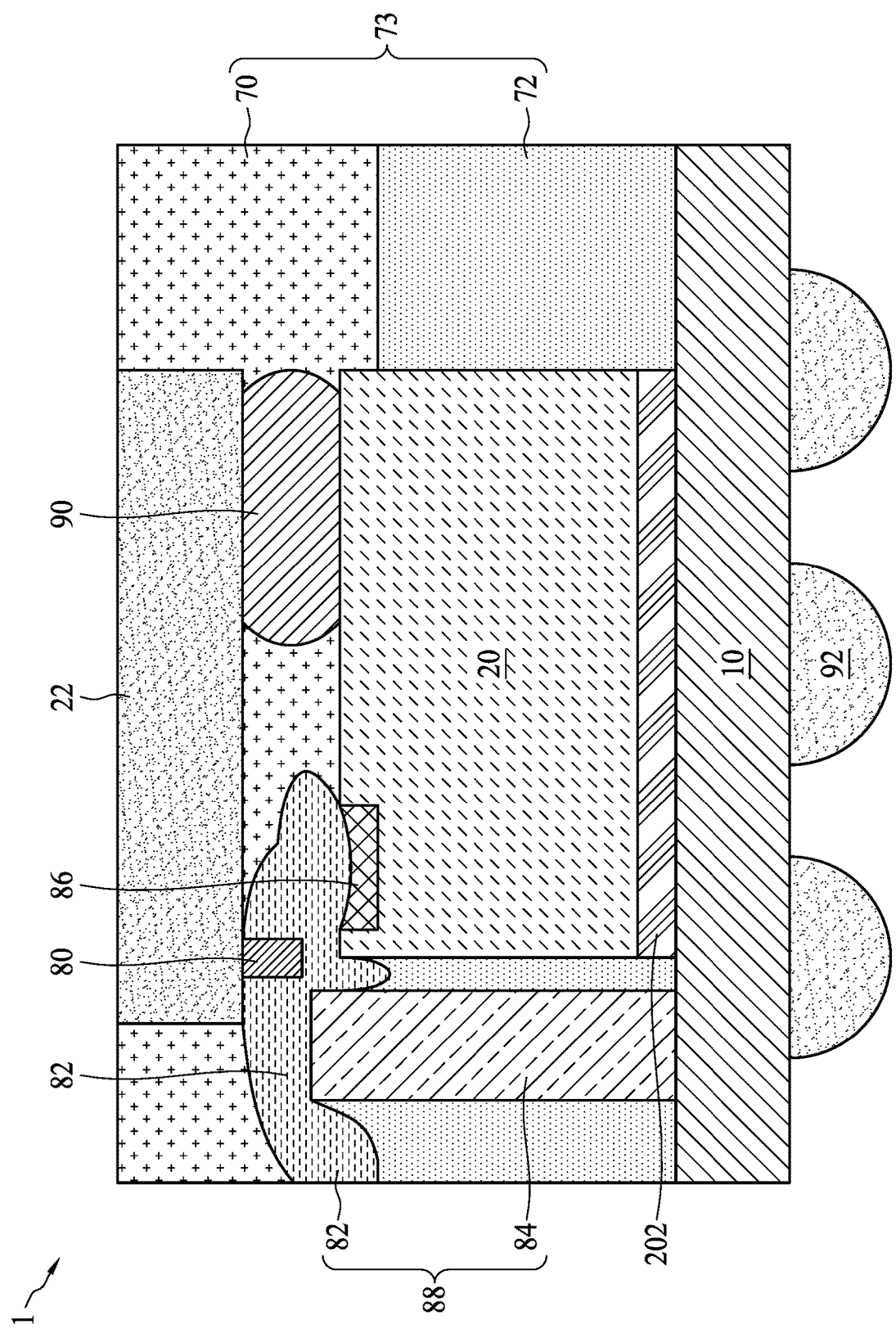
FIG. 1A is a cross-sectional view of a semiconductor package in accordance with an embodiment of the present disclosure.

FIG. 1A is a cross-sectional view of a semiconductor package 1 in accordance with an embodiment of the present disclosure. The semiconductor package 1 includes a redistribution layer (RDL) structure 10, dies 20 and 22, molding compound 73 and an interconnect structure 88, bumps 90 and 92. The substrate of the RDL structure 10 may include a semiconductor material, glass, a polymer (e.g., polypropylene (PP)), a resin (e.g., Bismaleimide-triazine (BT) resin or a glass-reinforced epoxy resin like FR-4 resin), a copper clad laminate (CCL) substrate or another suitable material to support components thereon.

In some embodiments, the die 20 is disposed on the RDL structure 10. The die 20 is attached to the top surface of the RDL structure 10 through an adhesion layer 202. The die 22 is disposed on the die 20. The die 20 includes a conductive pad 86. In one or more embodiments, a material of the conductive pad 86 may be, for example, copper (Cu), another metal, an alloy, or other suitable conductive materials. The die 22 includes a conductive post 80. In one or more embodiments, a material of the conductive post 80 may be, for example, Cu, another metal, an alloy, or other suitable conductive materials. Solder bumps 92 are attached to the bottom surface of the RDL structure 10.

The molding compound 73 is disposed on the RDL structure 10. The molding compound 73 includes a first molding compound 72 and a second molding compound 70. The second molding compound 70 is disposed on the first molding compound 72. A bump 90 is disposed between the die 20 and the die 22. In some embodiments, the bump 90 may be a non-conductive liquid gel, a non-conductive glue, a solder, or other suitable materials. The non-conductive liquid gel of bump 90 may have high viscosity and the curing temperature of the bump 90 may be around 220° C. The bump 90 may be a non-conductive dummy bump. The bump 90 may support the die 22 and prevent from the die 22 to be tilted. In some embodiments, the die 22 is electrically connected to the bump 90.

The interconnect structure 88 includes a solder paste 82 and a conductive post 84. In some embodiments, the solder paste 82 may be a lateral conductive structure extending from the conductive post 84 to a conductive terminal of the die 20. In some embodiments, the solder paste 82 may be formed by a soft/malleable conductive material.

In some embodiments, the conductive terminal of the die 20 may be a conductive pad 86. In some embodiments, a material of the conductive post 84 may be, for example, Cu, another metal, an alloy, or other suitable conductive materials. The conductive post 84 has a length and is extended from a direction perpendicular to the surface of RDL structure 10.

The top surface of the conductive post 84 is higher than the top surface of the die 20. The interconnect structure 88 electrically connects the die 20 to the RDL structure 10. The interconnect structure 88 electrically connects the die 22 to the RDL structure 10. The interconnect structure 88 electrically connects the die 22 to the die 20. The interconnect structure 88 provides electrical connection between the die 20, the die 22 and the RDL structure 10. The interconnect structure 88 electrically connects the die 20 to the RDL structure 10 and the die 22 without using the wire-bonds. The interconnect structure 88 is disposed to a side of the die 20.

The molding compound 73 encapsulates the die 20 and the conductive post 84. In some embodiments, the first molding compound 72 encapsulates a portion of the side wall of the die 20.

A portion of the die 20 and a portion of the conductive post 84 are exposed from the first molding compound 72. The top surface of the first molding compound 72 is non-coplanar with the top surface of the die 20. In some embodiments, the top surface of the first molding compound 72 is coplanar with the top surface of the die 20.

The top surface of the second molding compound 70 is coplanar with the top surface of the die 22. In some embodiments, the top surface of the second molding compound 72 may be greater than or lower than the top surface of the die 20.

Figure 1B:
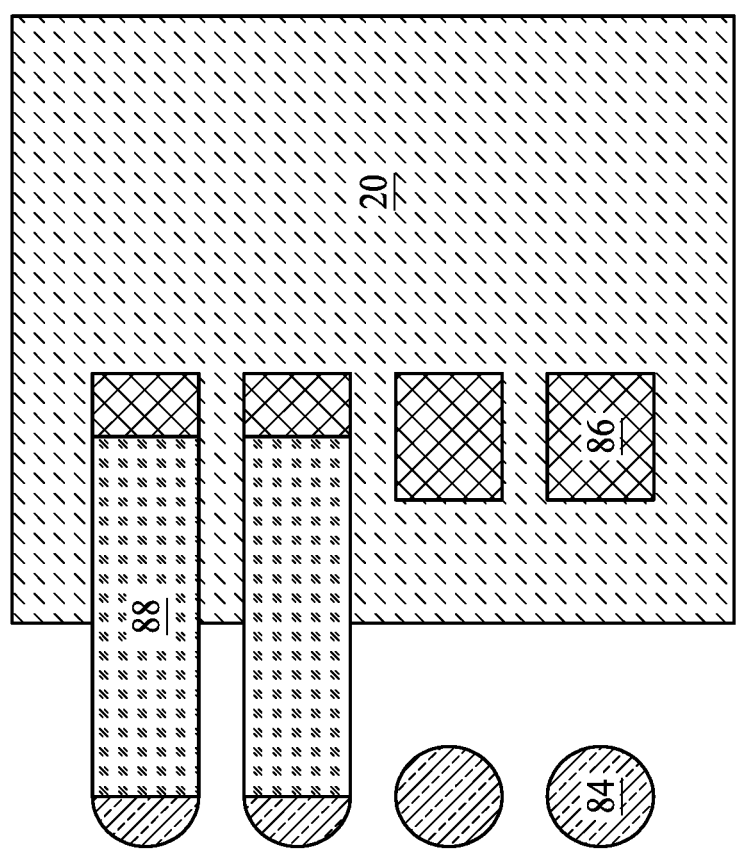
FIG. 1B is a top view of a semiconductor package in accordance with an embodiment of the present disclosure.

FIG. 1B is a top view of a semiconductor package 1 in accordance with an embodiment of the present disclosure. The interconnect structure 88 electrically connects the conductive post 84 to the die 20. The interconnect structure 88 contacts the conductive post 84, the die 20 and the die 22 (not shown).

Figure 2A:
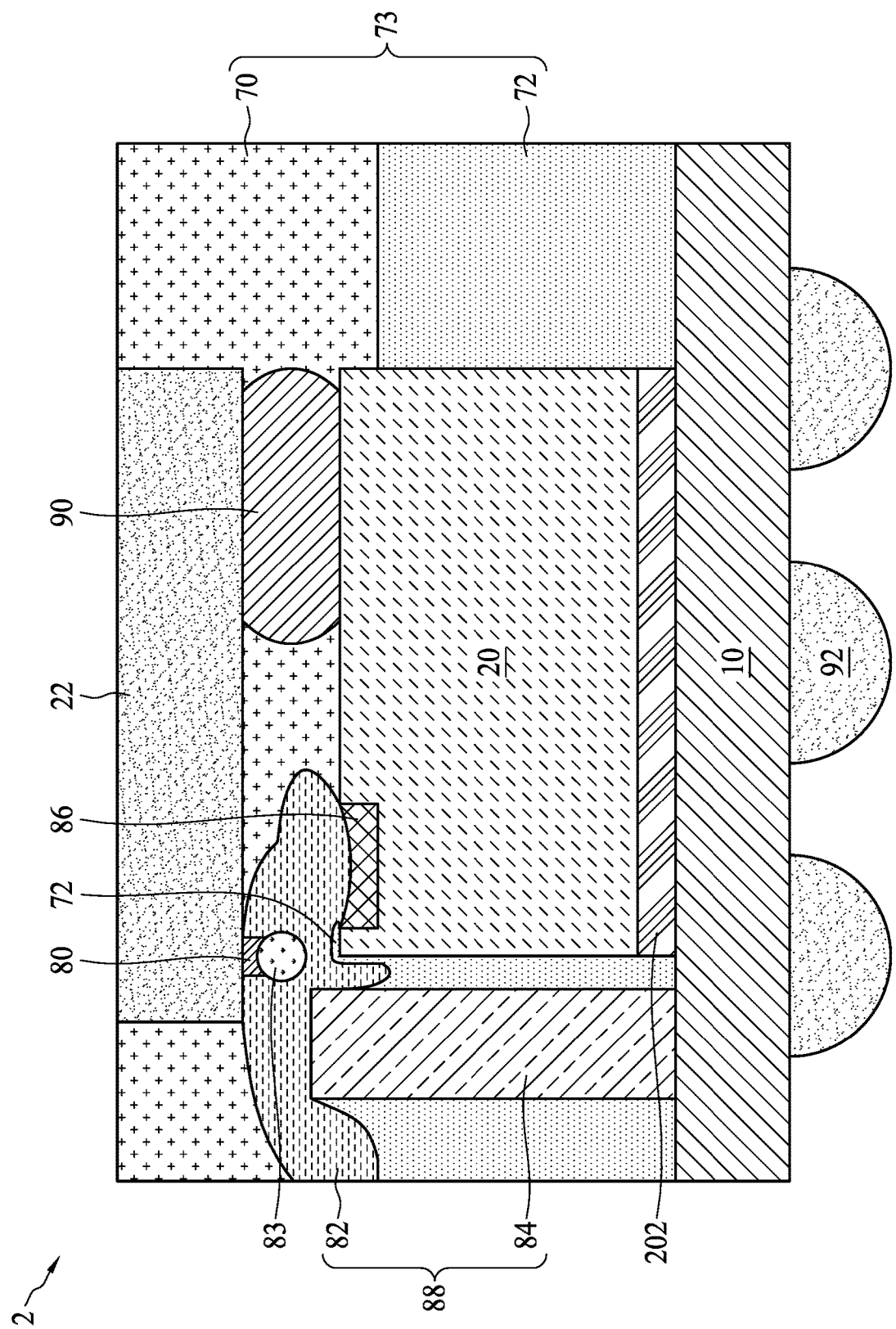
FIG. 2A is a cross-sectional view of a semiconductor package in accordance with an embodiment of the present disclosure.

FIG. 2A is a cross-sectional view of a semiconductor package 2 in accordance with an embodiment of the present disclosure. The semiconductor package 2 includes a RDL structure 10, dies 20 and 22, molding compound 73 and an interconnect structure 88, bumps 90 and 92. The structure of the semiconductor package 2 of FIG. 2A is similar to the structure of the semiconductor package 1 of FIG. 1A, except that a portion of the first molding compound 72 is disposed on the top surface of the die 20. A portion of the first molding compound 72 is disposed between the solder paste 82 and the top surface of the die 20.

Figure 2B:
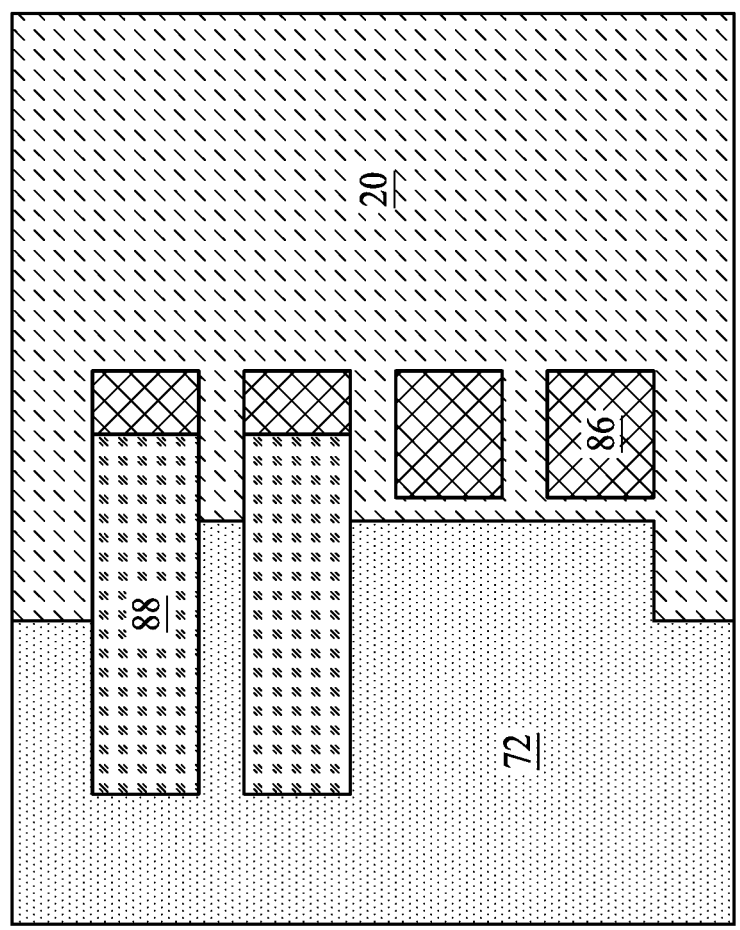
FIG. 2B is a top view of a semiconductor package in accordance with an embodiment of the present disclosure.

FIG. 2B is a top view of a semiconductor package 2 in accordance with an embodiment of the present disclosure. The interconnect structure 88 electrically connects the conductive post 84 to the die 20. The interconnect structure 88 contacts the conductive post 84, the die 20 and the die 22 (not shown). A portion of the first molding compound 72 is disposed on the top surface of the die 20. In some embodiments, the top surface of the first molding compound 72 includes a wax material so that the bridge between the plurality of interconnect structures 88 can be avoided.

Figure 3A:
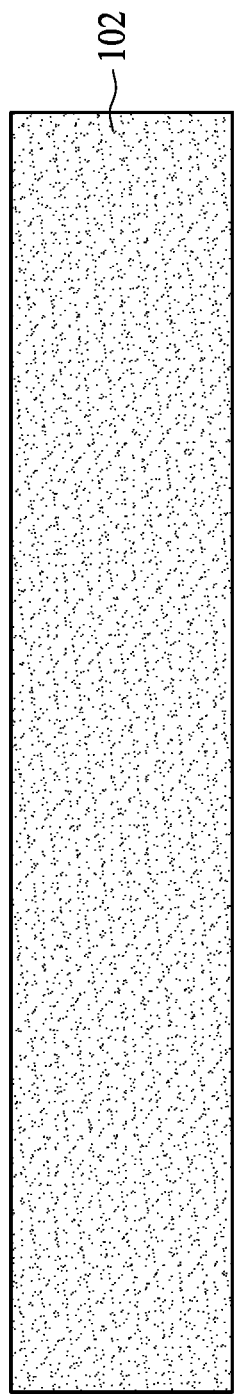
FIG. 3A, FIG. 3B, FIG. 3C, FIG. 3D, FIG. 3E, FIG. 3F, FIG. 3G, FIG. 3H, FIG. 3I, FIG. 3J, FIG. 3K, and FIG. 3L illustrate a method of manufacturing a device package in accordance with an embodiment of the present disclosure.
Figure 3B:
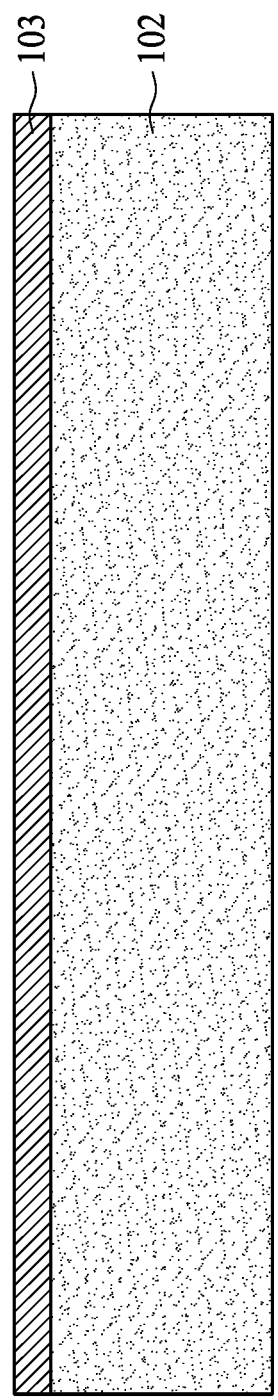
Figure 3C:
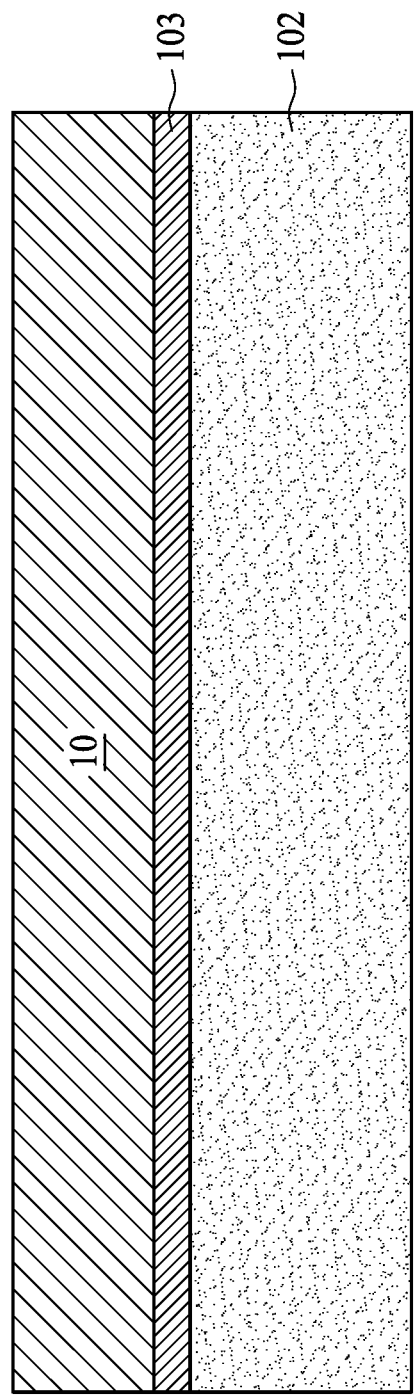

FIGS. 3A-3L illustrate a method of manufacturing a device package 1 in accordance with an embodiment of the present disclosure. Referring to FIG. 3A, a carrier 102 is provided. Referring to FIG. 3B, a release layer 103 is coated on the top surface of the carrier 102. Referring to FIG. 3C, a RDL structure 10 is disposed on the release layer 103.

Figure 3D:
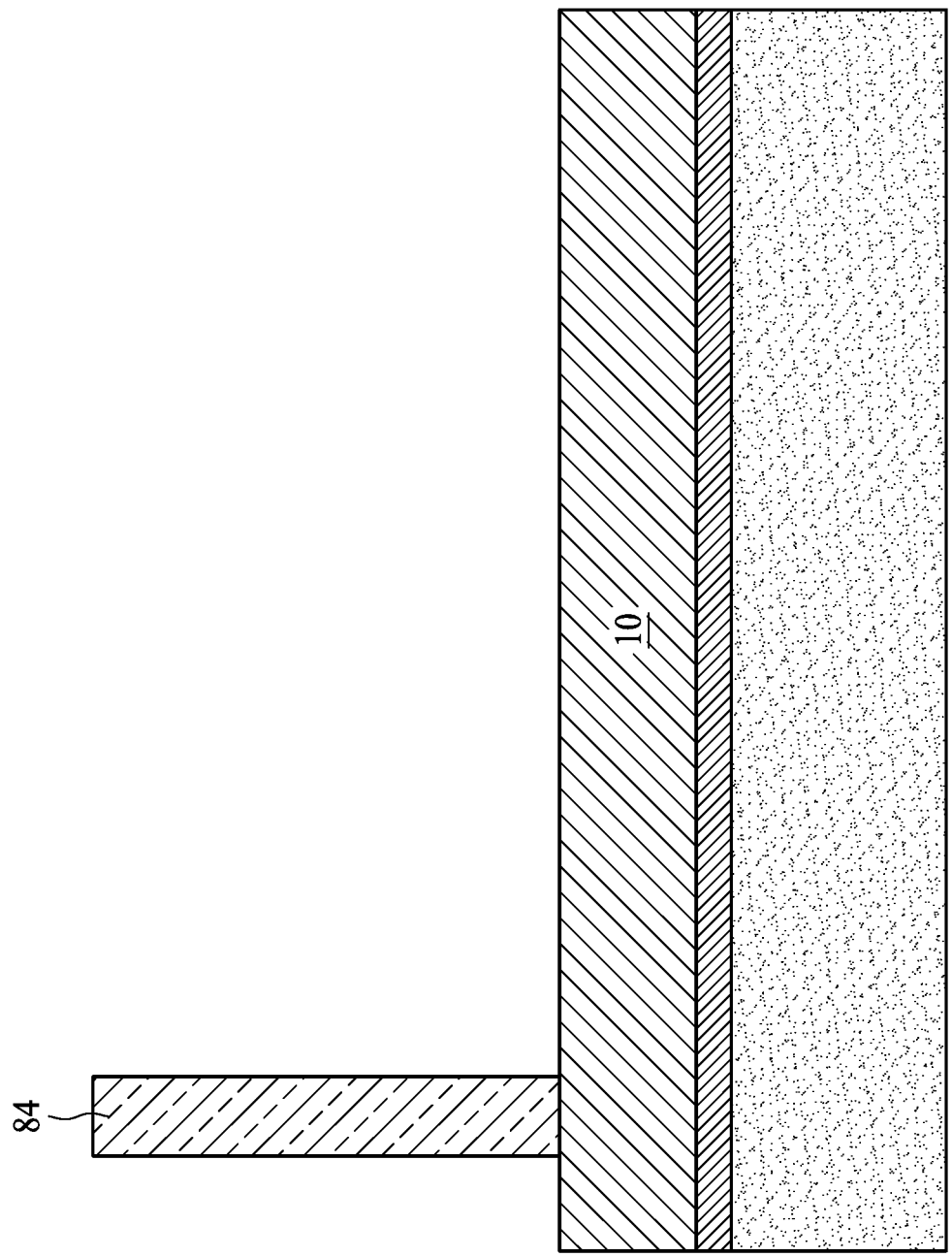

Referring to FIG. 3D, a conductive post 84 is formed on the top surface of the RDL structure 10. In some embodiments, a material of the conductive post 84 may be, for example, Cu, another metal, an alloy, or other suitable conductive materials.

Figure 3E:
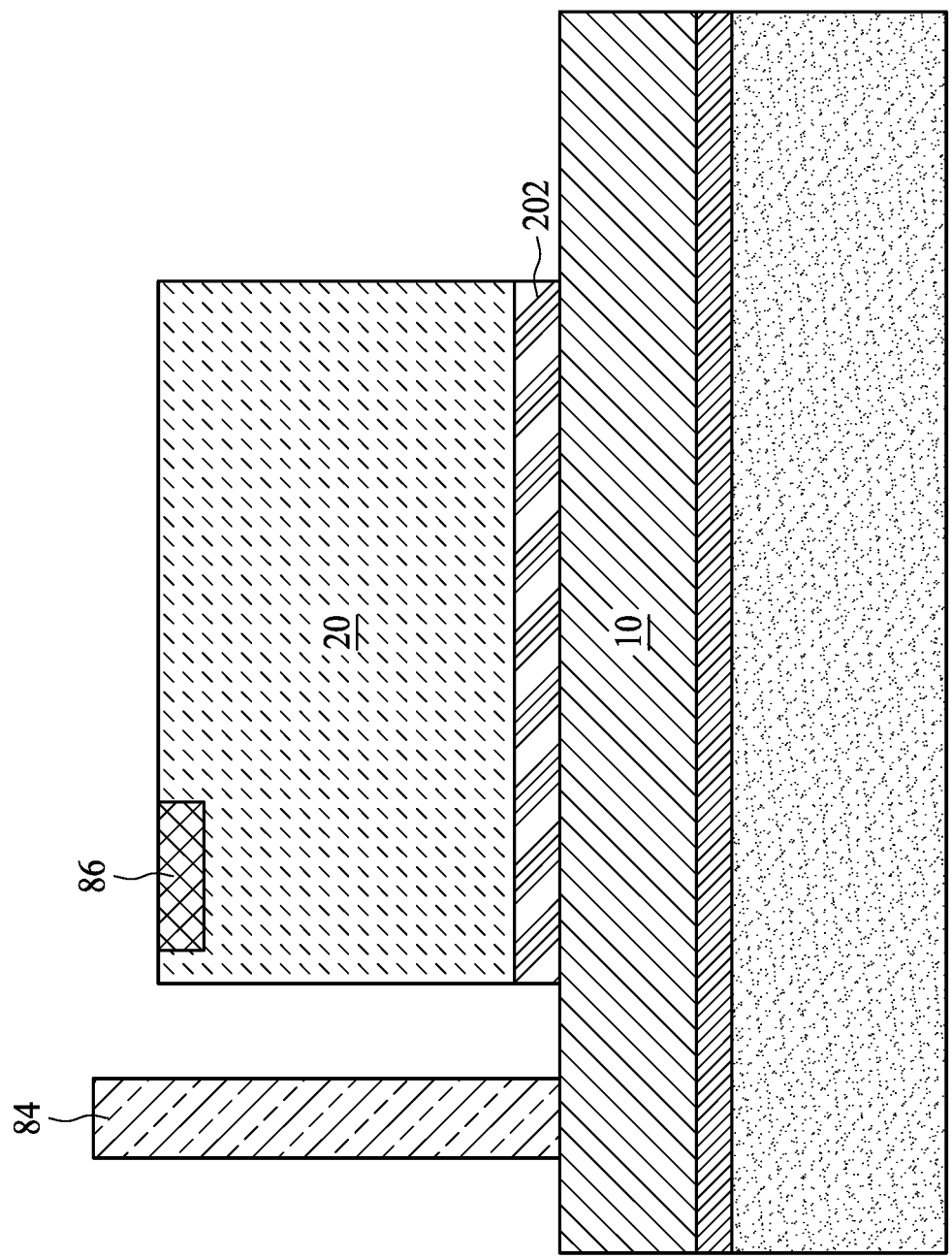

Referring to FIG. 3E, a die 20 is disposed on the top surface of the RDL structure 10. The die 20 includes a conductive pad 86. In some embodiments, the top surface of the conductive post 84 may be greater than the top surface of the die 20.

Figure 3F:
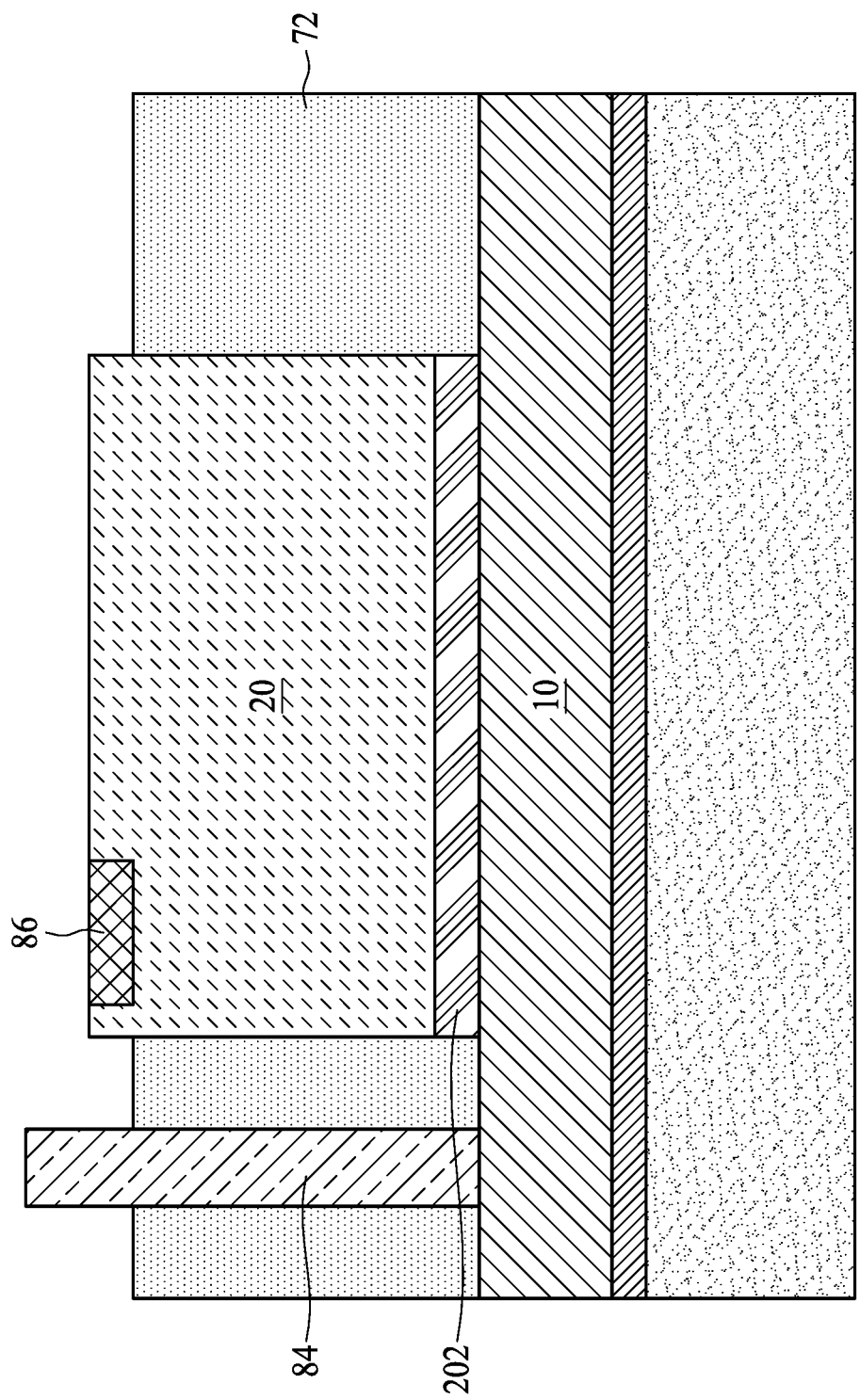
Figure 3G:
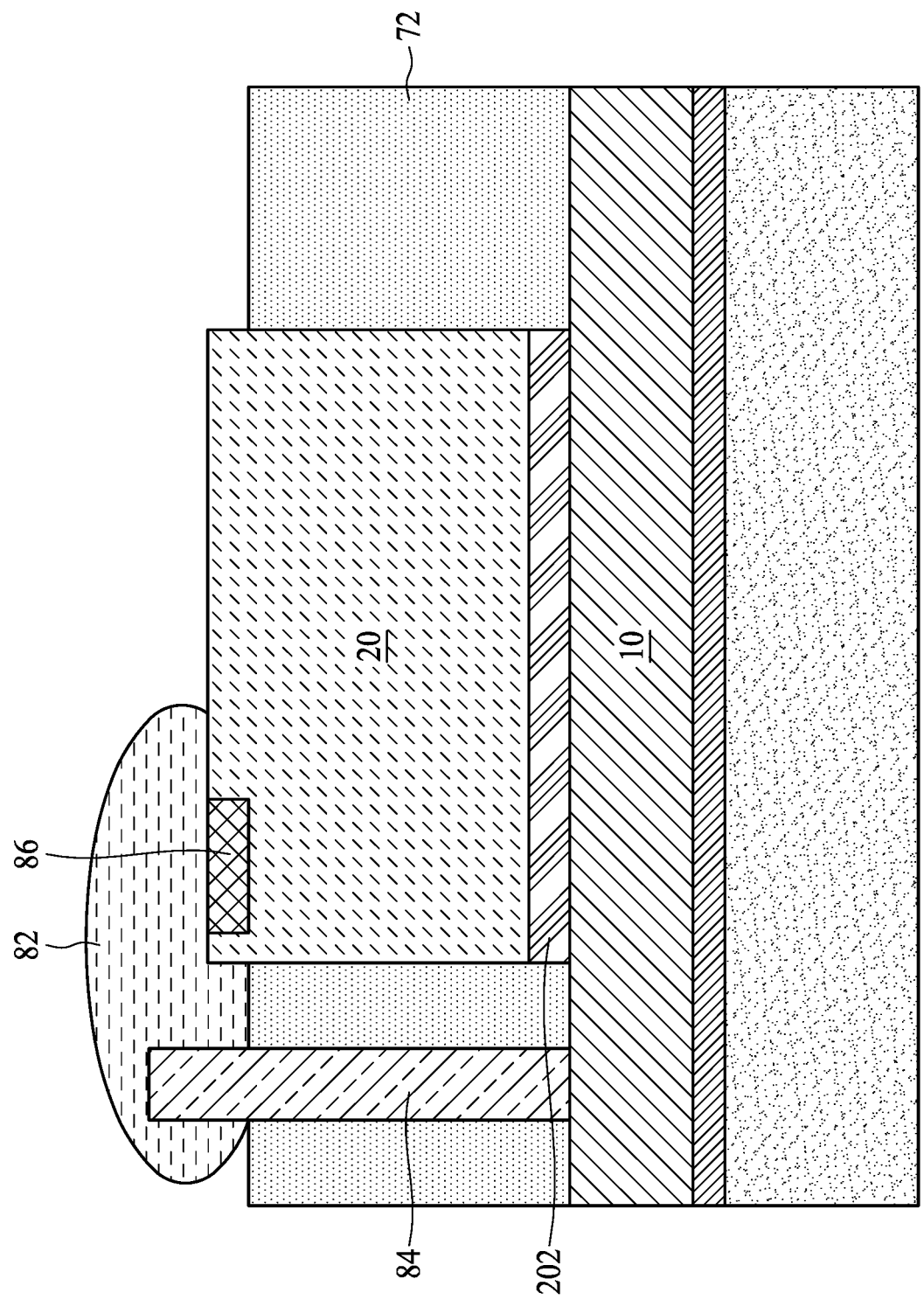

Referring to FIG. 3F, a first molding compound 72 is formed on the RDL structure 10. The first molding compound 72 encapsulates a portion of the die 20 and a portion of the conductive post 84. A portion of the die 20 and a portion of the conductive post 84 are encapsulated by using a mold having a release film (not shown) so that a molding material is filled to encapsulate the die 20 and the conductive post 84. A portion of the die 20 and a portion of the conductive post 84 are exposed from the first molding compound 72 through the release film of the mold. A portion of the conductive post 84 is surrounded by the release film of the mold when encapsulating the die 20 and the conductive post 84. In some embodiments, the top surface of the first molding compound 72 may be lower than the top surface of the die 20. Referring to FIG. 3G, a solder paste 82 is formed on the first molding compound 72. The solder paste 82 contacts the conductive pad 86 of die 20 and conductive post 84.

Figure 3H:
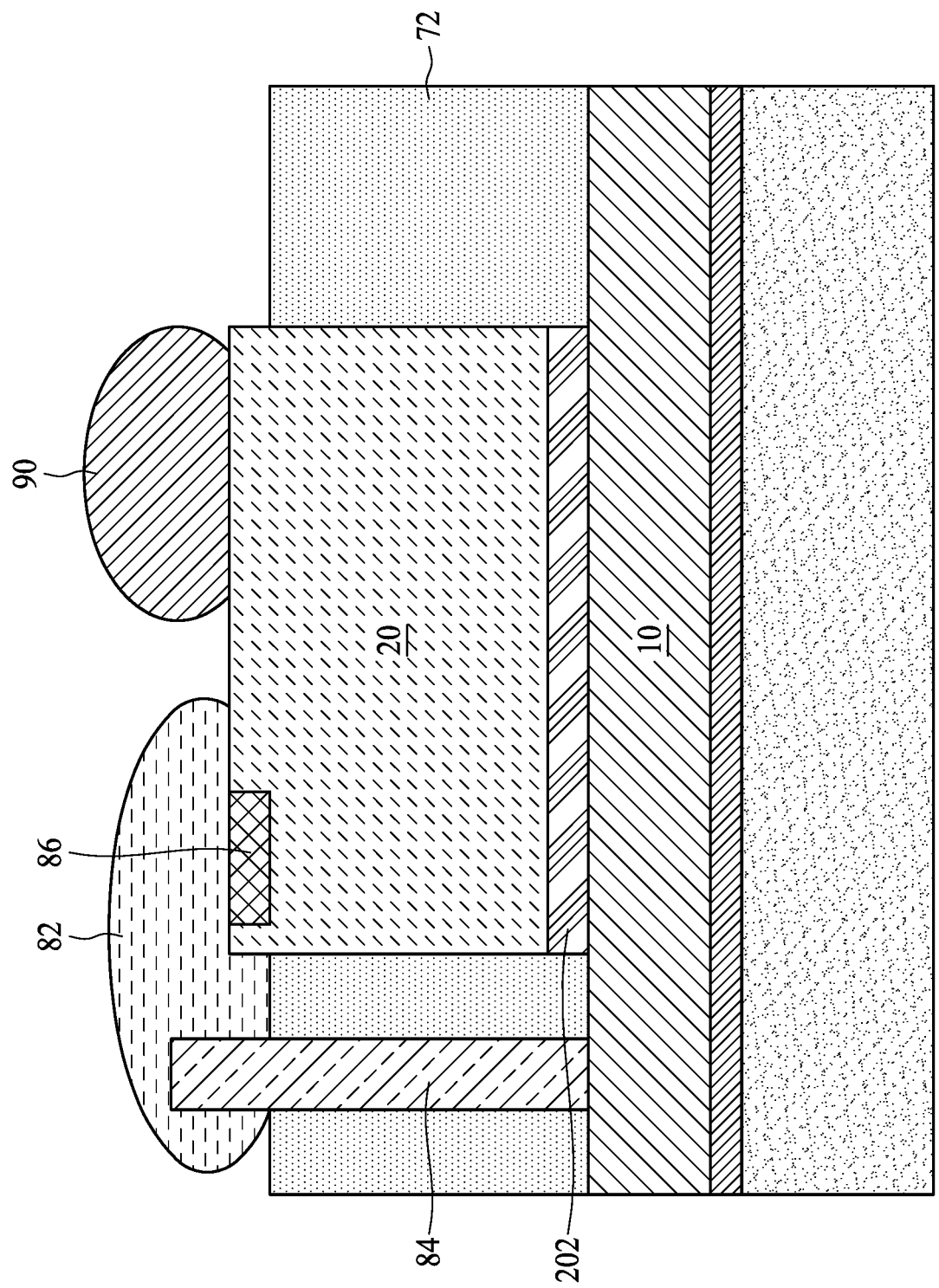

Referring to FIG. 3H, a bump 90 is disposed on the die 20. In some embodiments, the bump 90 may be a non-conductive liquid gel, a non-conductive glue, a solder, or other suitable materials.

Figure 3I:
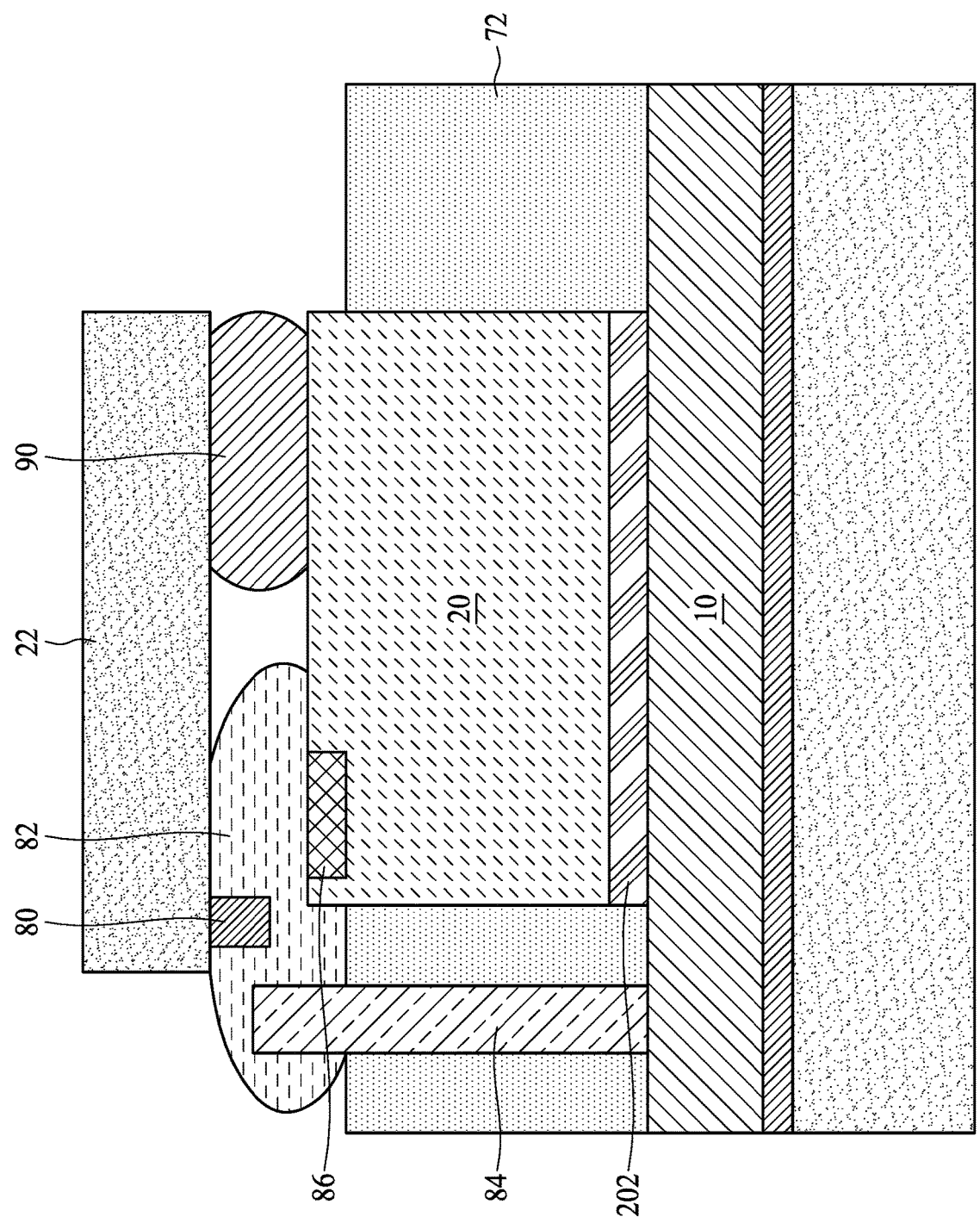

Referring to FIG. 3I, a die 22 is disposed on the bump 90 and solder paste 82. The die 22 includes a conductive post 80. The conductive post 80 is included in the solder paste 82. The solder paste 82 contacts the dies 20 and 22 and the conductive post 84.

Figure 3J:
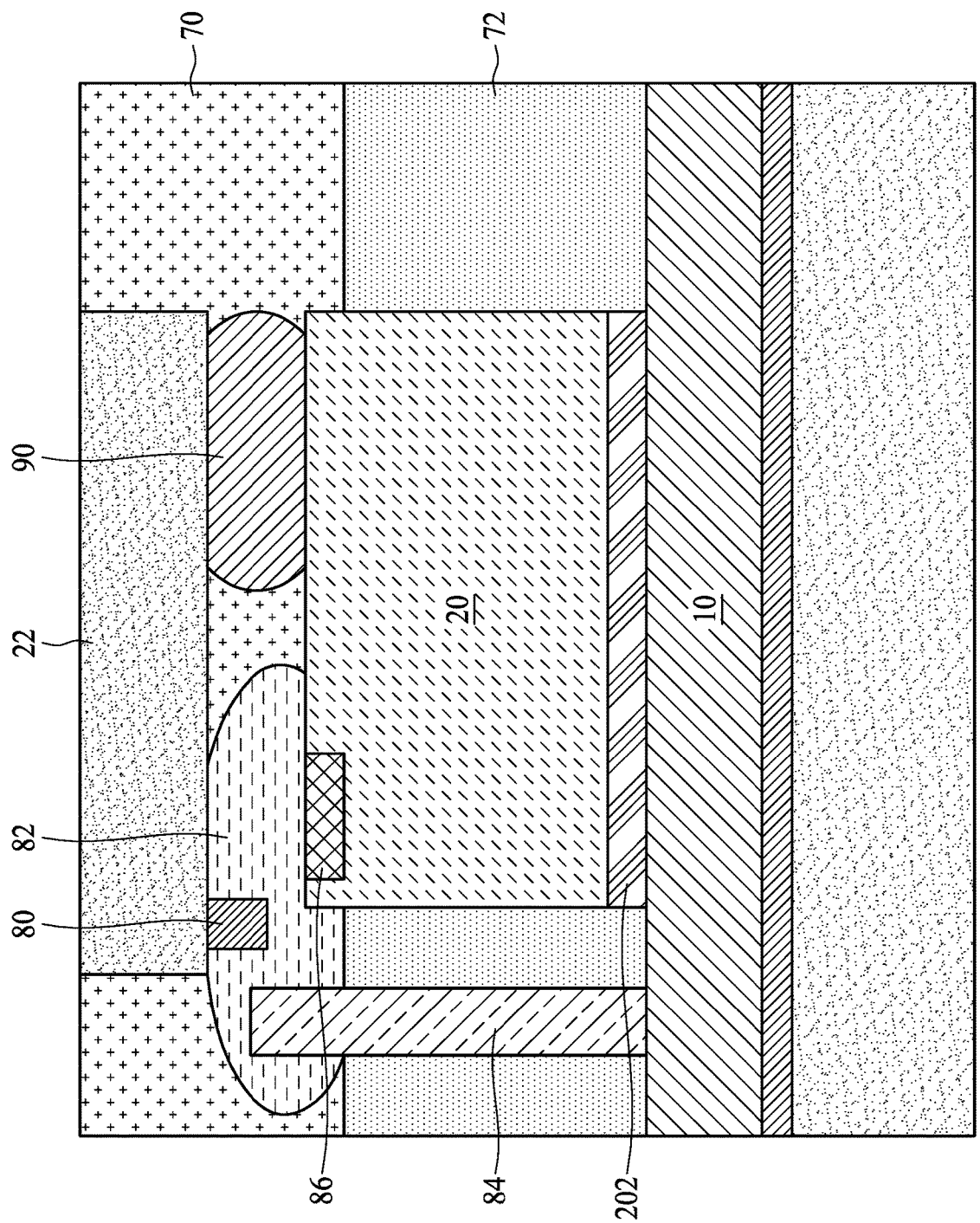

Referring to FIG. 3J, a second molding compound 70 is disposed on the first molding compound 72. The second molding compound 70 encapsulates the die 22, bump 90 and solder paste 82. The top surfaces of the second molding compound 70 and the die 22 are grinded. After the grinding, the top surface of the die 22 is exposed and the top surface of the second molding compound 70 is coplanar with the top surface of the second molding compound 70.

Figure 3K:
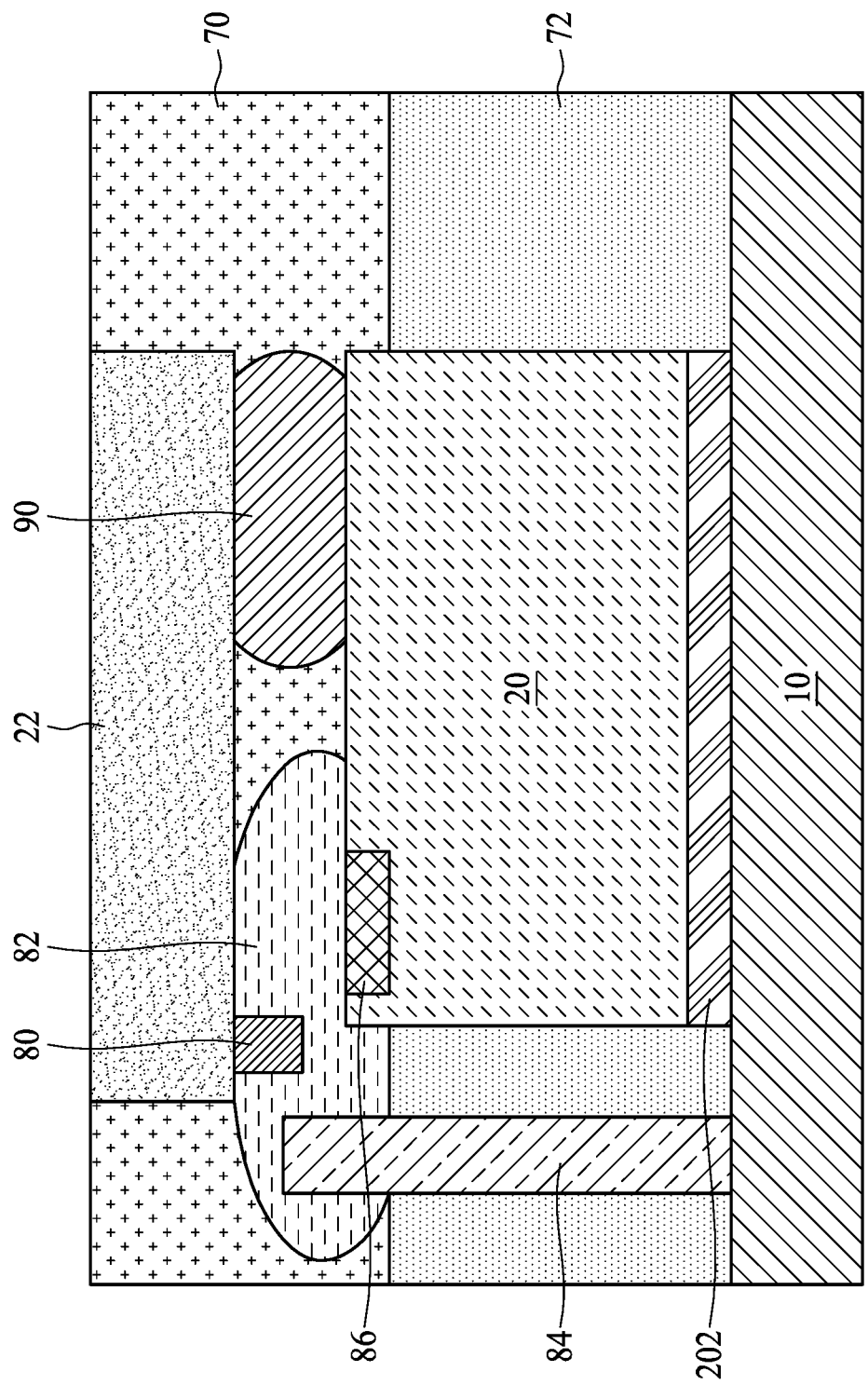

Referring to FIG. 3K, the carrier 102 and release layer 103 are removed.

Figure 3L:
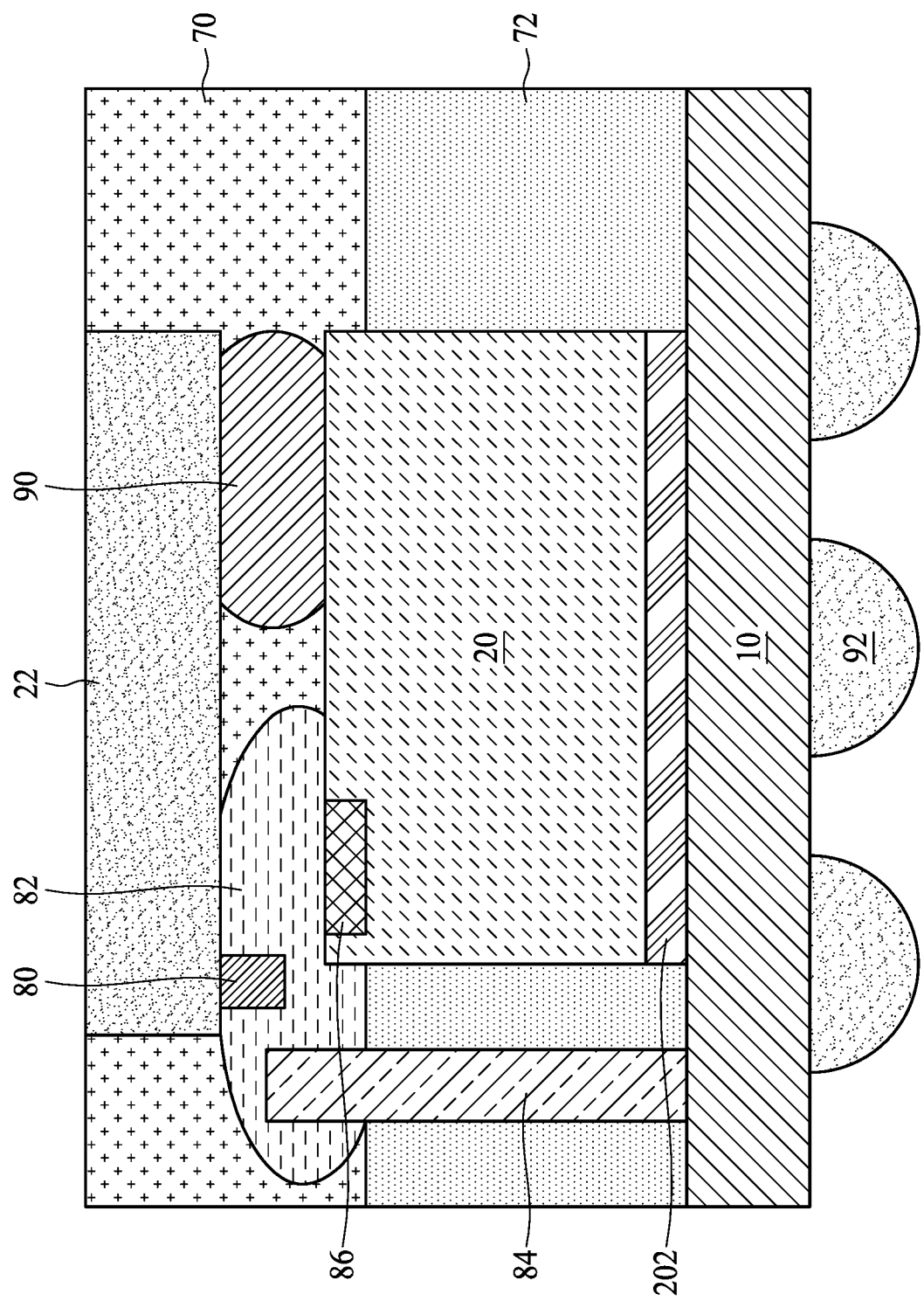

Referring to FIG. 3L, bumps 92 are attached to the bottom surface of the RDL structure 10 to obtain a semiconductor package 1 similar to the one illustrated in FIG. 1A.

Figure 4A:
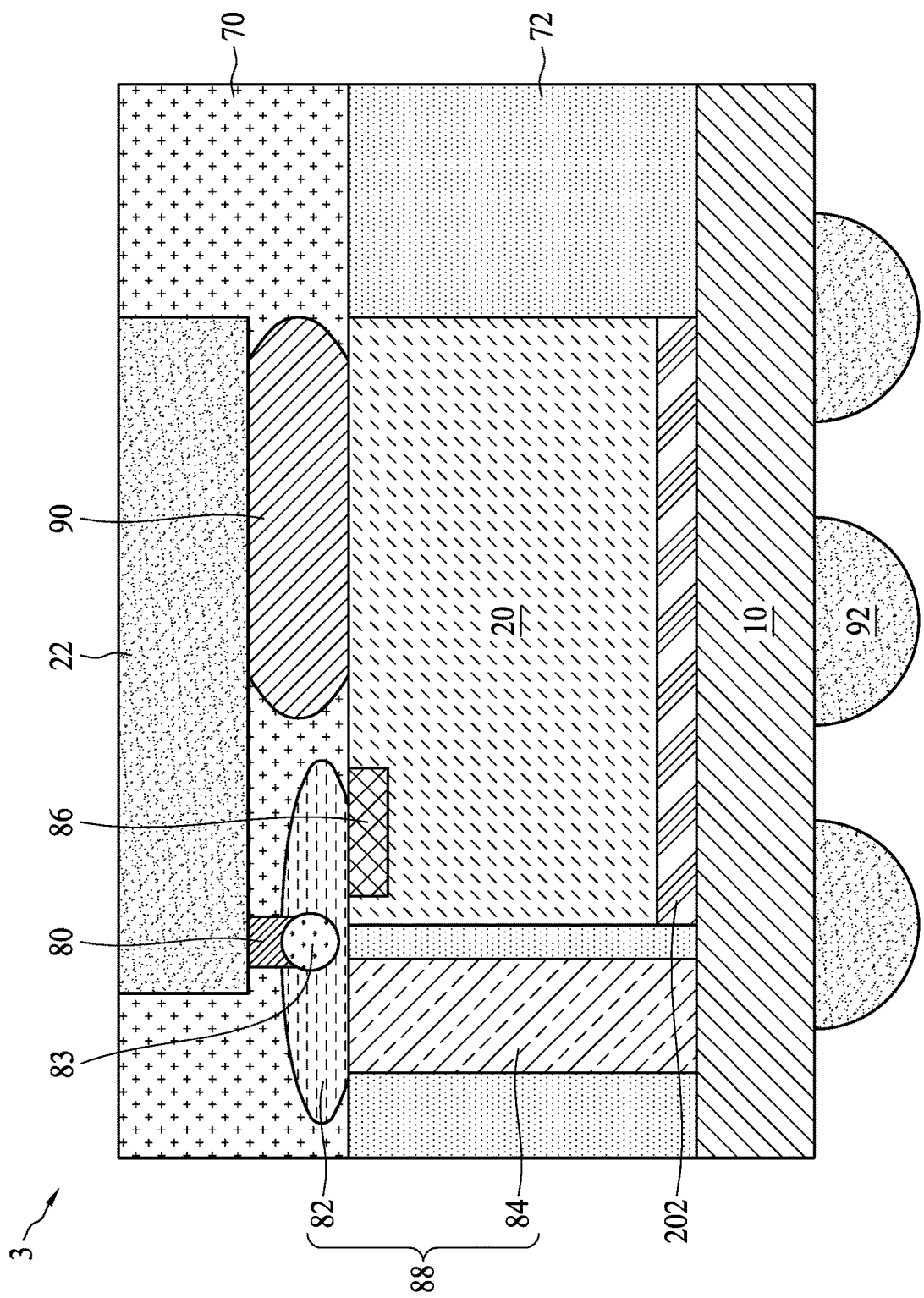
FIG. 4A is a cross-sectional view of a semiconductor package in accordance with an embodiment of the present disclosure.

FIG. 4A is a cross-sectional view of a semiconductor package 3 in accordance with an embodiment of the present disclosure. The semiconductor package 3 includes a RDL structure 10, dies 20 and 22, molding compound 73 and an interconnect structure 88, bumps 90 and 92. The structure of the semiconductor package 3 of FIG. 4A is similar to the structure of the semiconductor package 1 of FIG. 1A, except that the top surface of the conductive post 84 is coplanar with the top surface of the die 20. One end of the conductive post 80 of the die 22 includes a solder ball 83. The solder ball 83 is included in the solder paste 82.

Figure 4B:
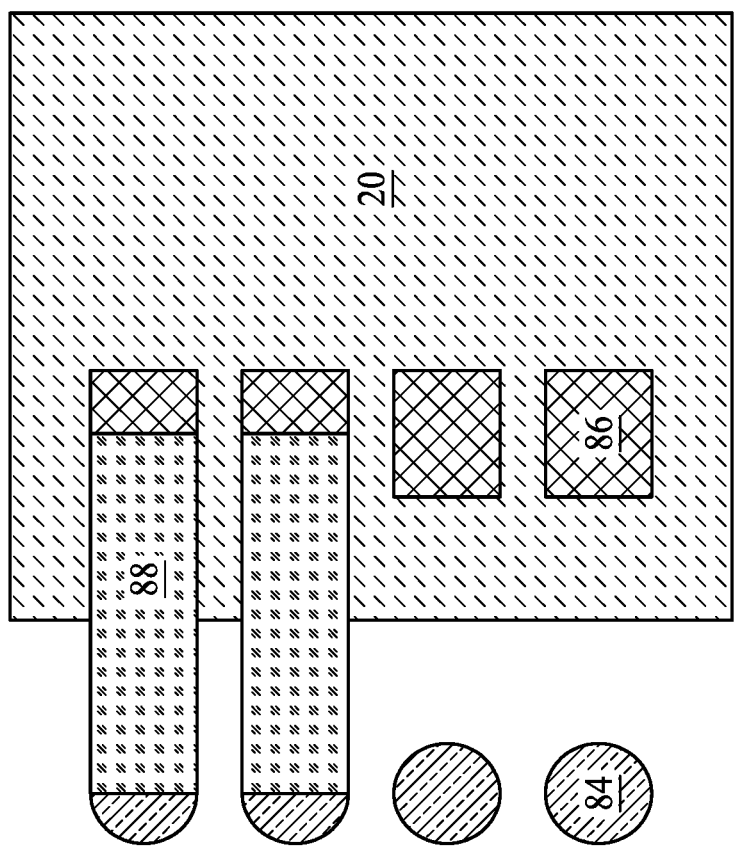
FIG. 4B is a top view of a semiconductor package in accordance with an embodiment of the present disclosure.

FIG. 4B is a top view of a semiconductor package 3 in accordance with an embodiment of the present disclosure. The interconnect structure 88 electrically connects the conductive post 84 to the die 20. The first molding compound 72 is not disposed on the top surface of the die 20.

Figure 5A:
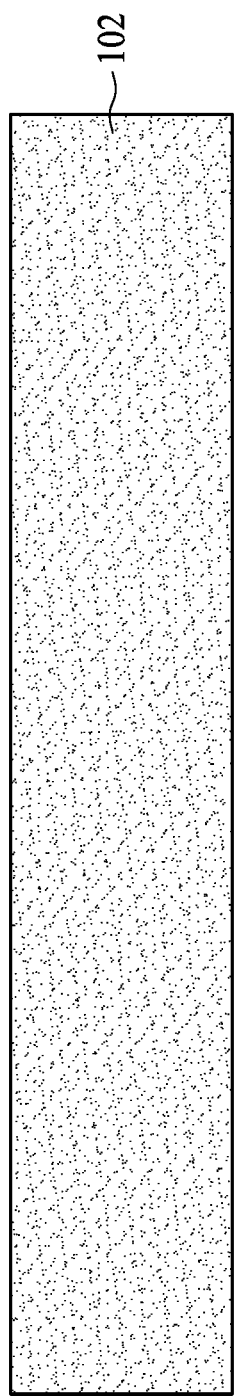
Figure 5B:
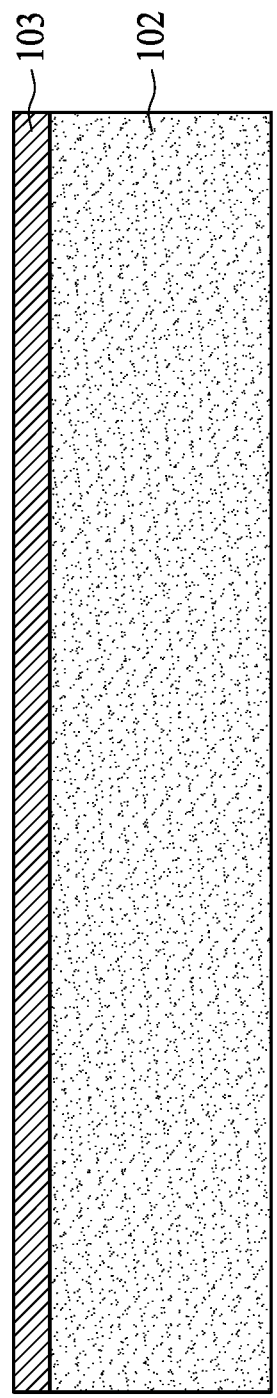
Figure 5C:
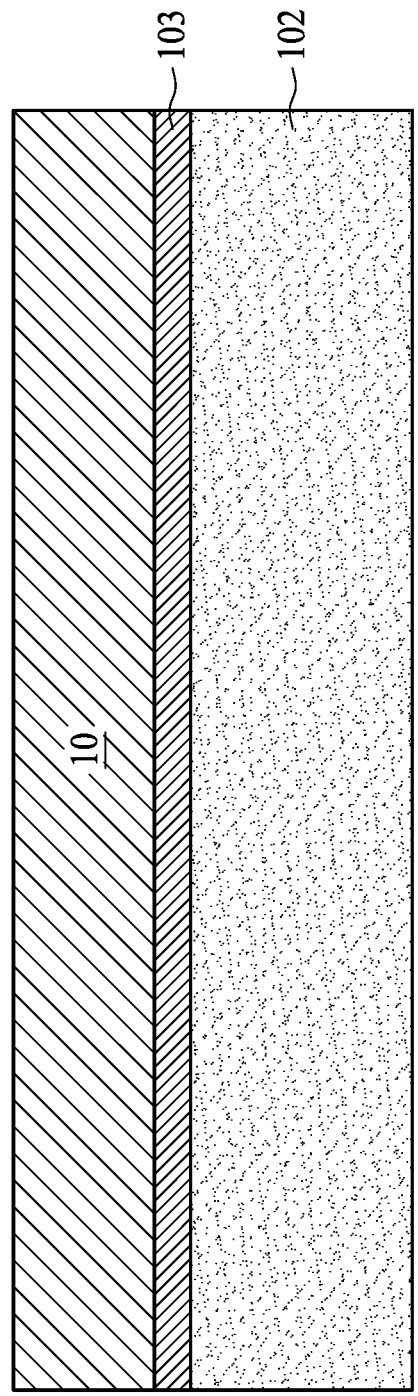

FIGS. 5A-5M illustrate a method of manufacturing a semiconductor package 3 in accordance with an embodiment of the present disclosure. Referring to FIG. 5A, a carrier 102 is provided. Referring to FIG. 5B, a release layer 103 is coated on the top surface of the carrier 102. Referring to FIG. 5C, a RDL structure 10 is disposed on the release layer 103.

Figure 5E:
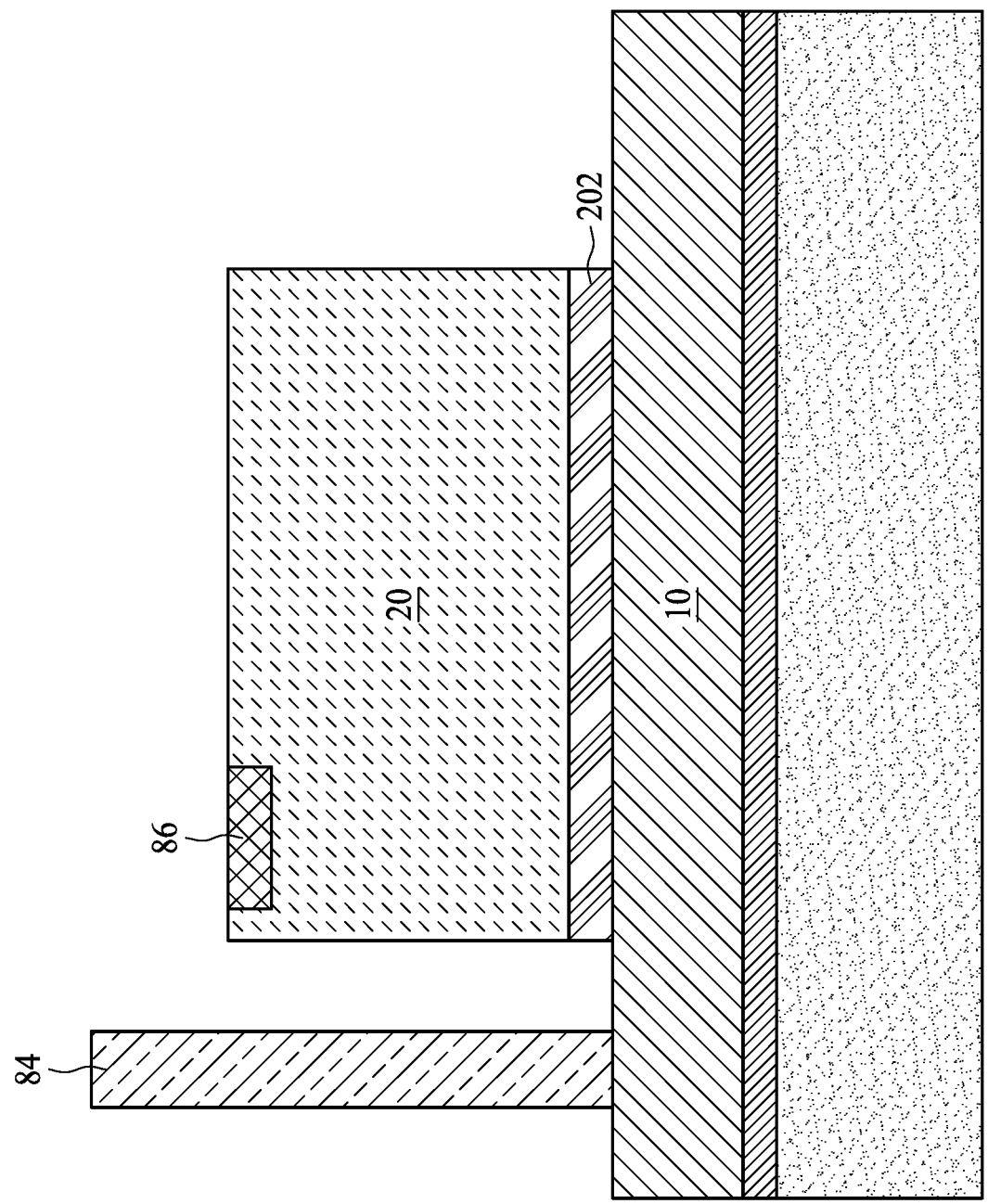

Referring to FIG. 5D, a conductive post 84 is formed on the top surface of the RDL structure 10. In some embodiments, a material of the conductive post 84 may be, for example, Cu, another metal, an alloy, or other suitable conductive materials. Referring to FIG. 5E, a die 20 is disposed on the top surface of the RDL structure 10. The die 20 includes a conductive pad 86. In some embodiments, the top surface of the conductive post 84 may be greater than the top surface of the die 20.

Figure 5F:
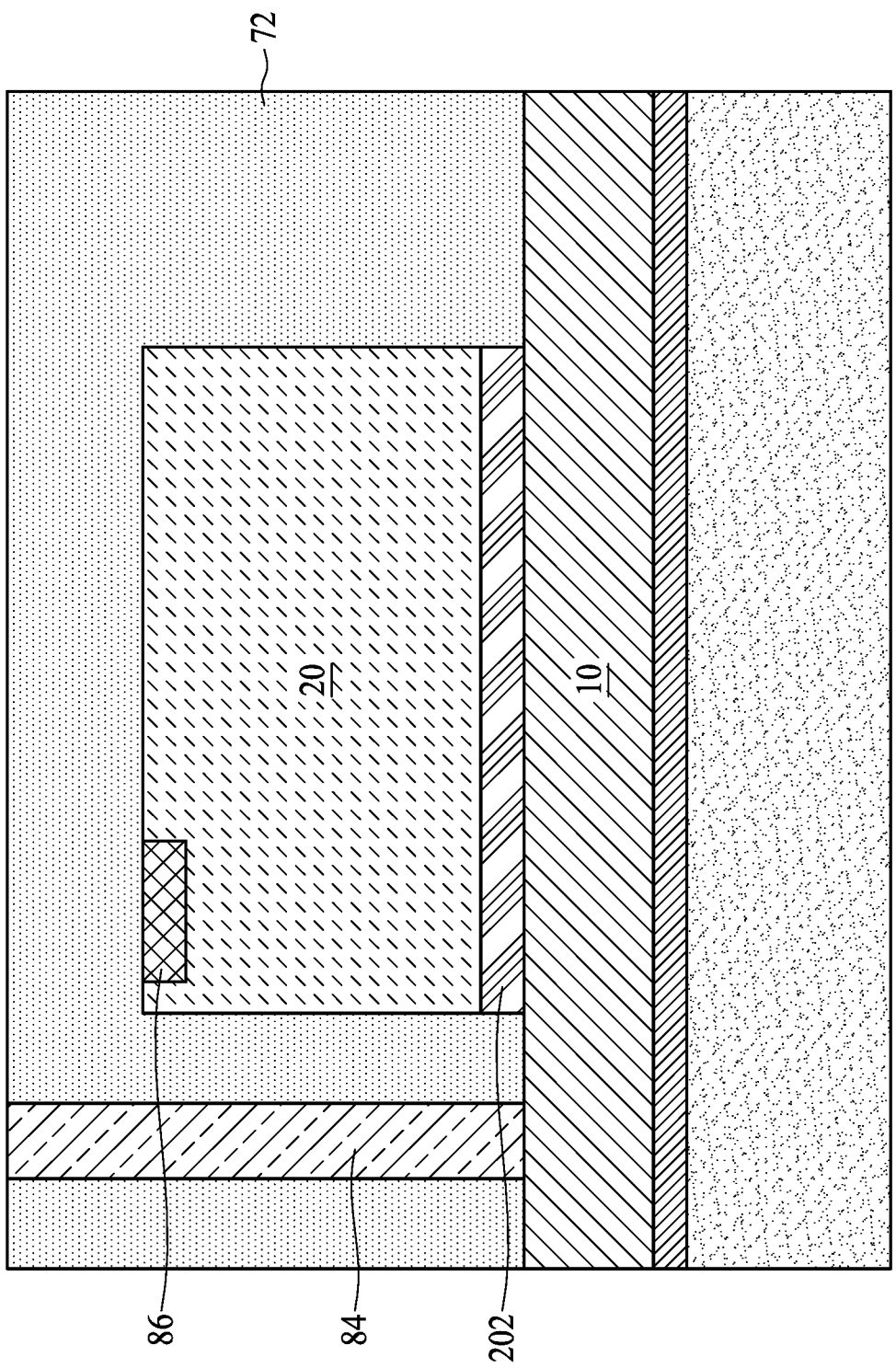
Figure 5G:
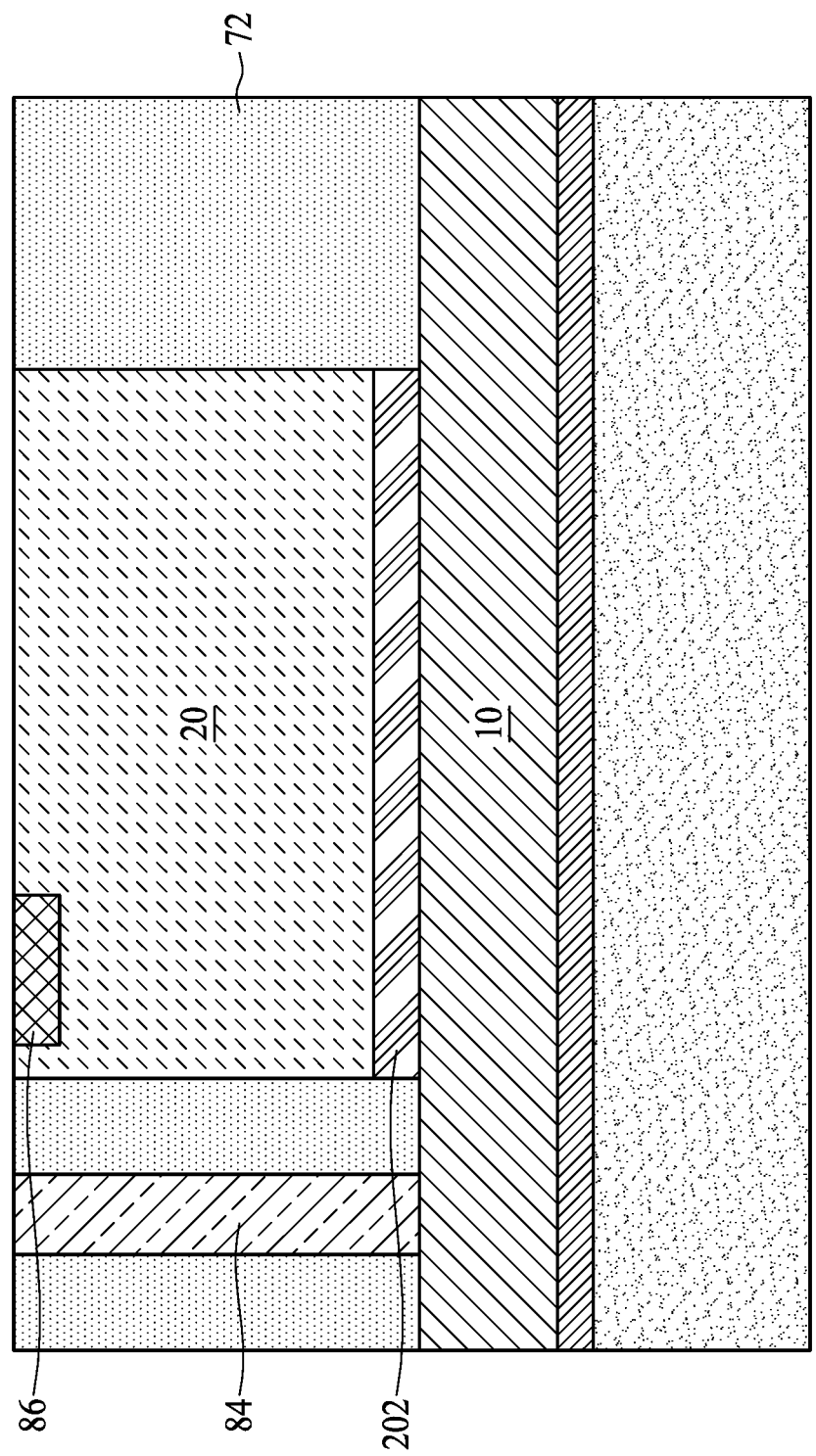

Referring to FIG. 5F, a first molding compound 72 is formed on the RDL structure 10. The first molding compound 72 encapsulates the die 20 and the conductive post 84. The top surface of the conductive post 84 is exposed. Referring to FIG. 5G, a grinding operation is performed on the first molding compound 72. After grinding, the top surface of the first molding compound 72 is coplanar with the top surface of the die 20.

Figure 5H:
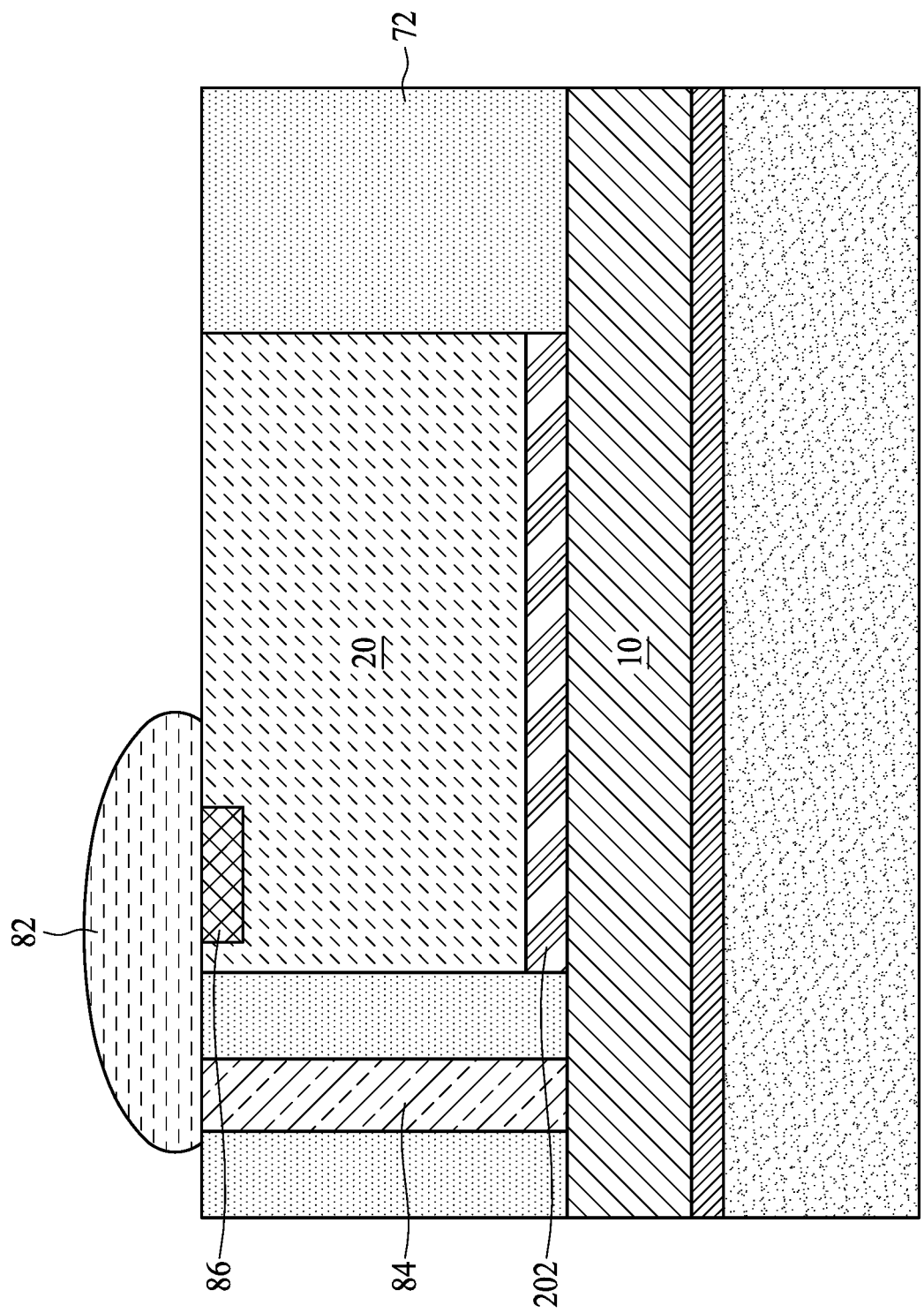

Referring to FIG. 5H, a solder paste 82 is formed on the first molding compound 72 by spraying. The solder paste 82 contacts the conductive pad 86 of die 20 and conductive post 84.

Figure 5I:
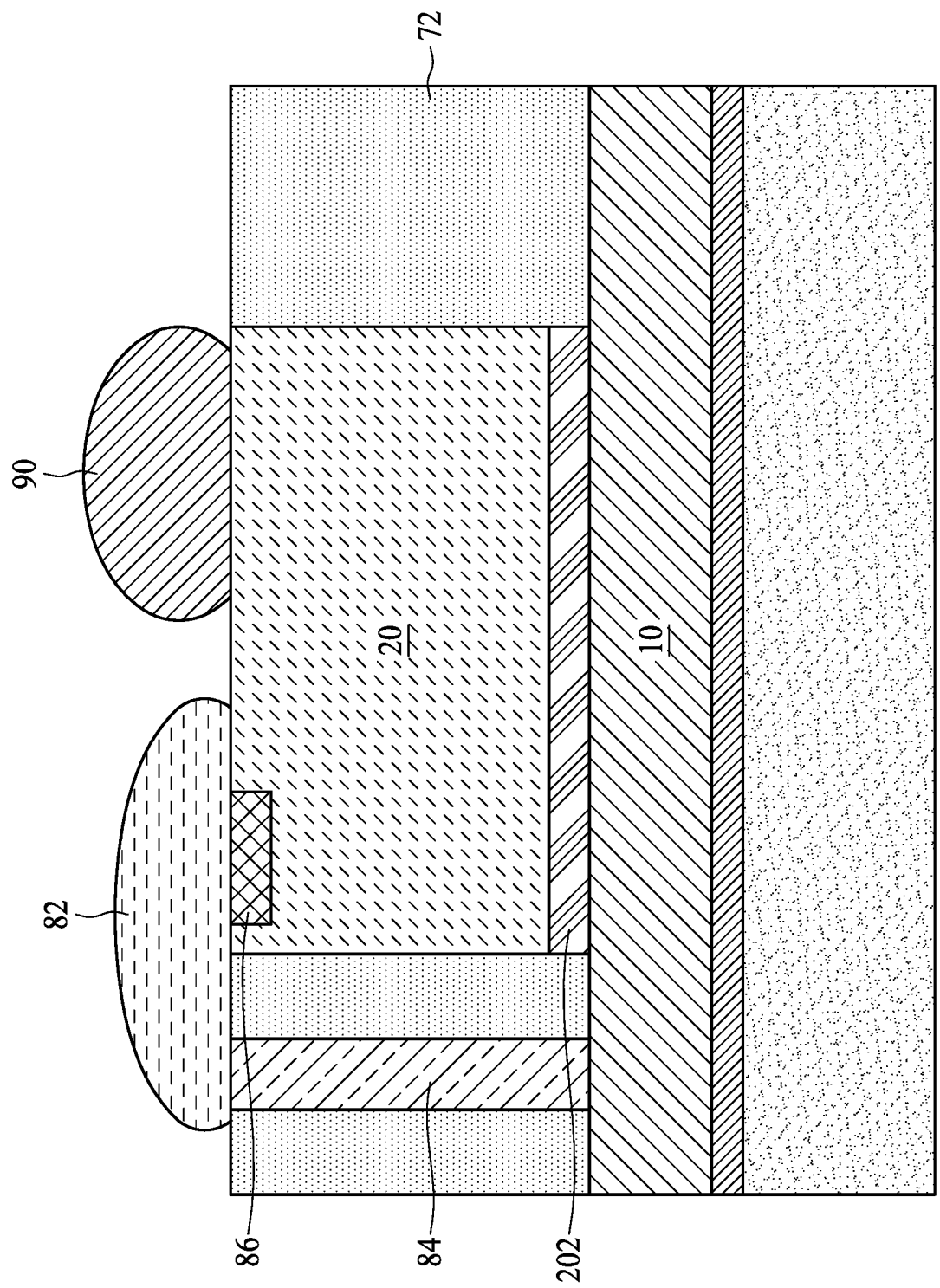

Referring to FIG. 5I, a bump 90 is disposed on the die 20. In some embodiments, the bump 90 may be a non-conductive liquid gel, a non-conductive glue, a solder, or other suitable materials.

Figure 5J:
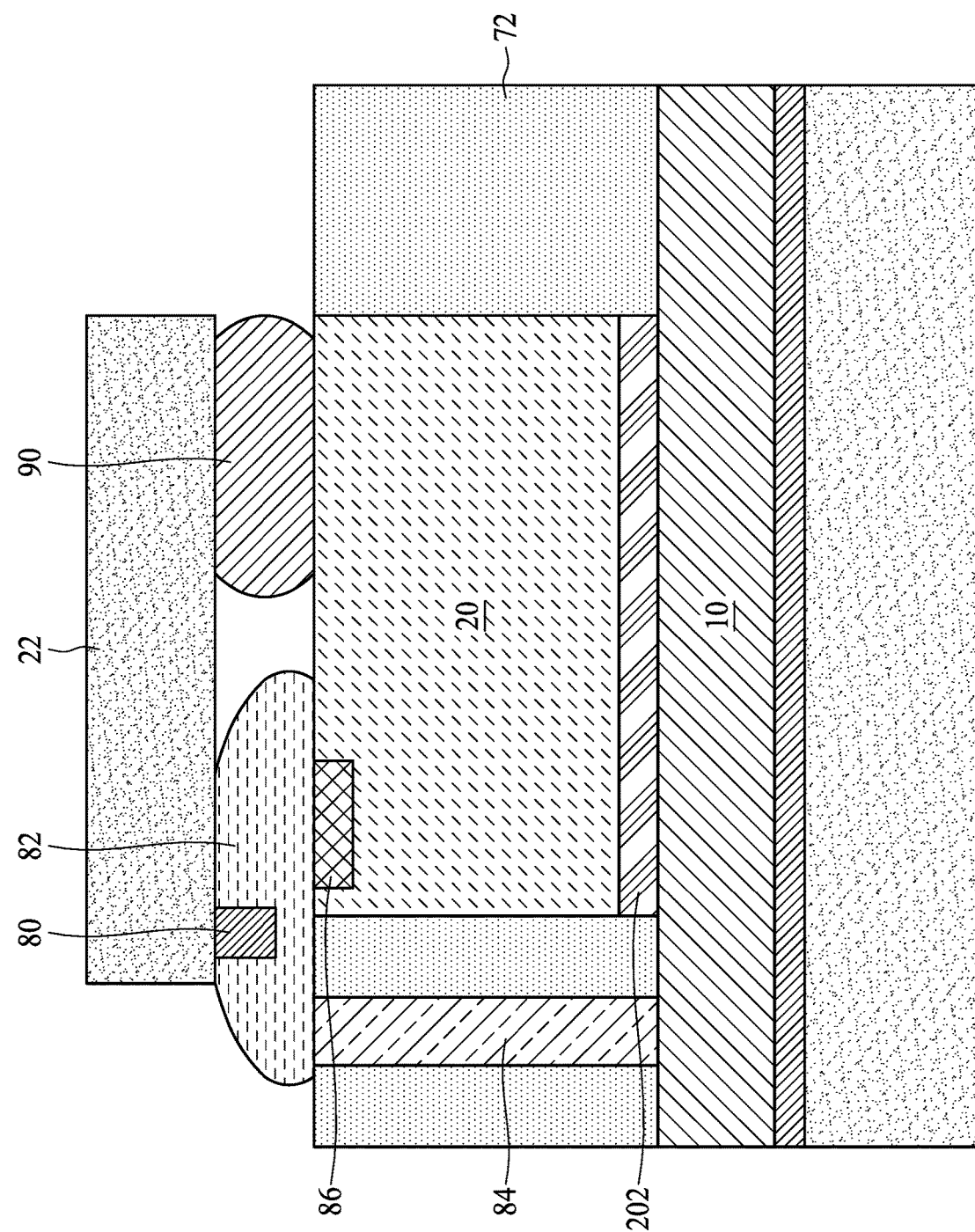

Referring to FIG. 5J, a die 22 is disposed on the bump 90 and solder paste 82. The die 22 includes a conductive post 80. The conductive post 80 is included in the solder paste 82. The solder paste 82 contacts the dies 20 and 22 and the conductive post 84.

Figure 5K:
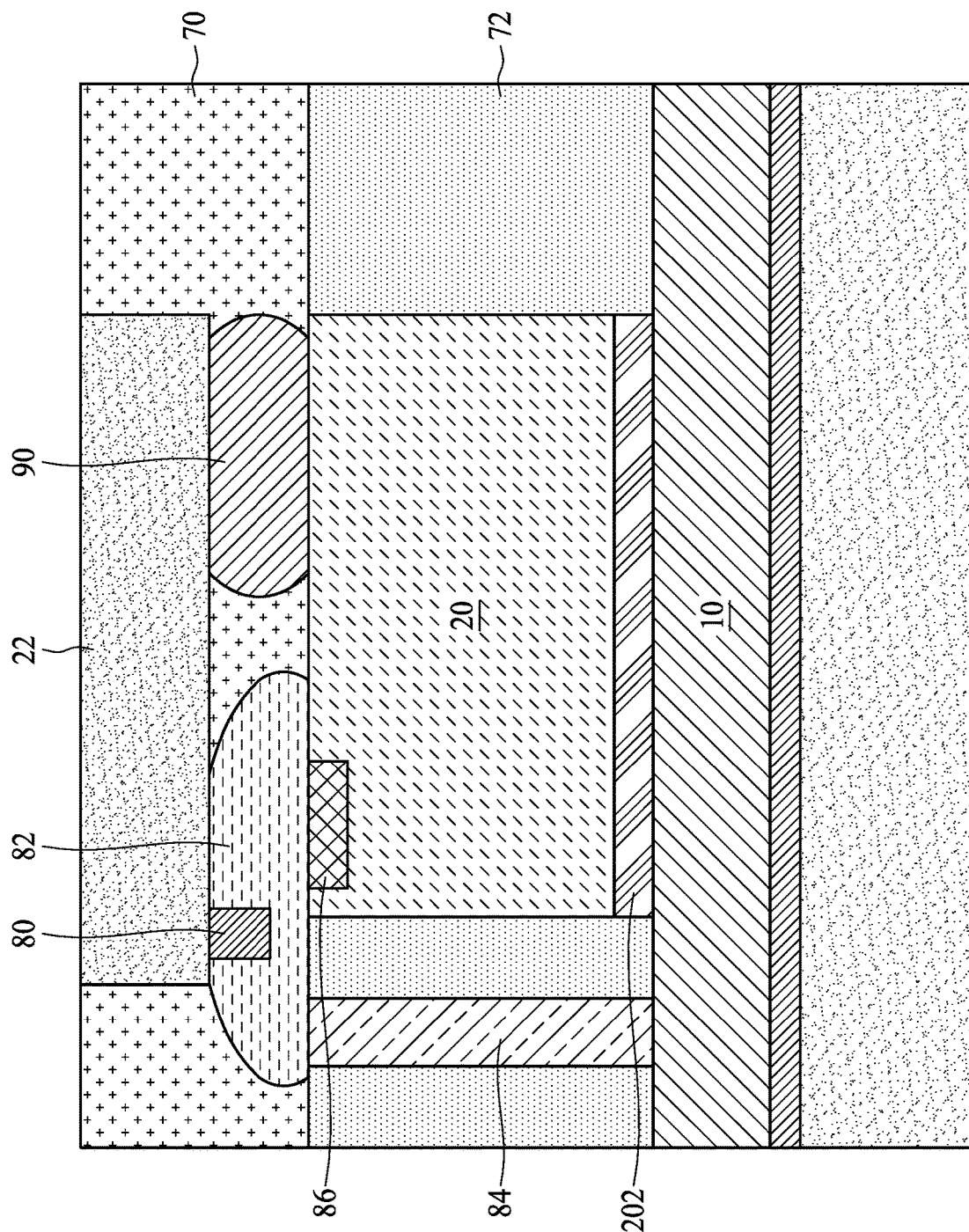

Referring to FIG. 5K, a second molding compound 70 is disposed on the first molding compound 72. The second molding compound 70 encapsulates the die 22, bump 90 and solder paste 82.

Figure 5L:
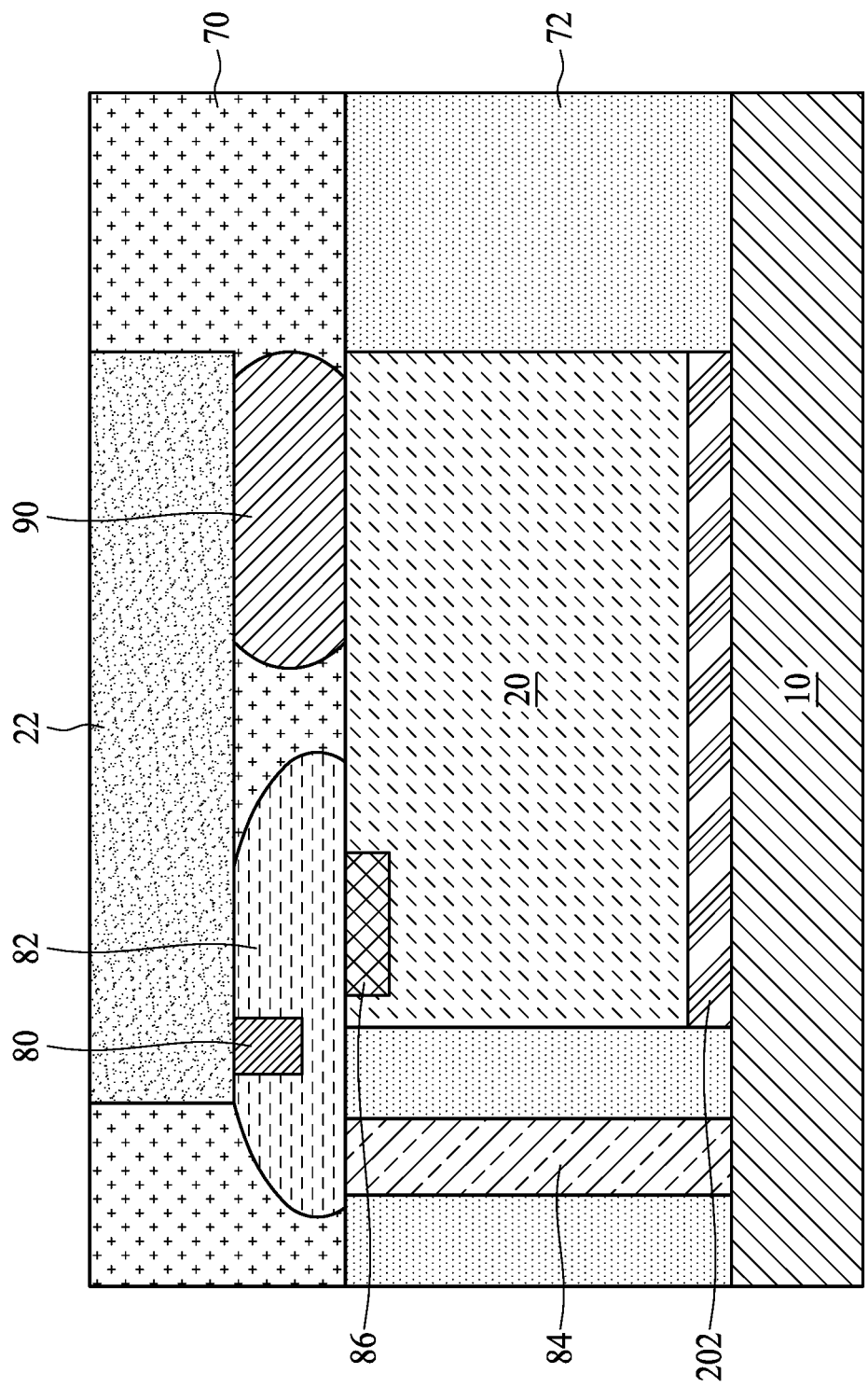
Figure 5M:
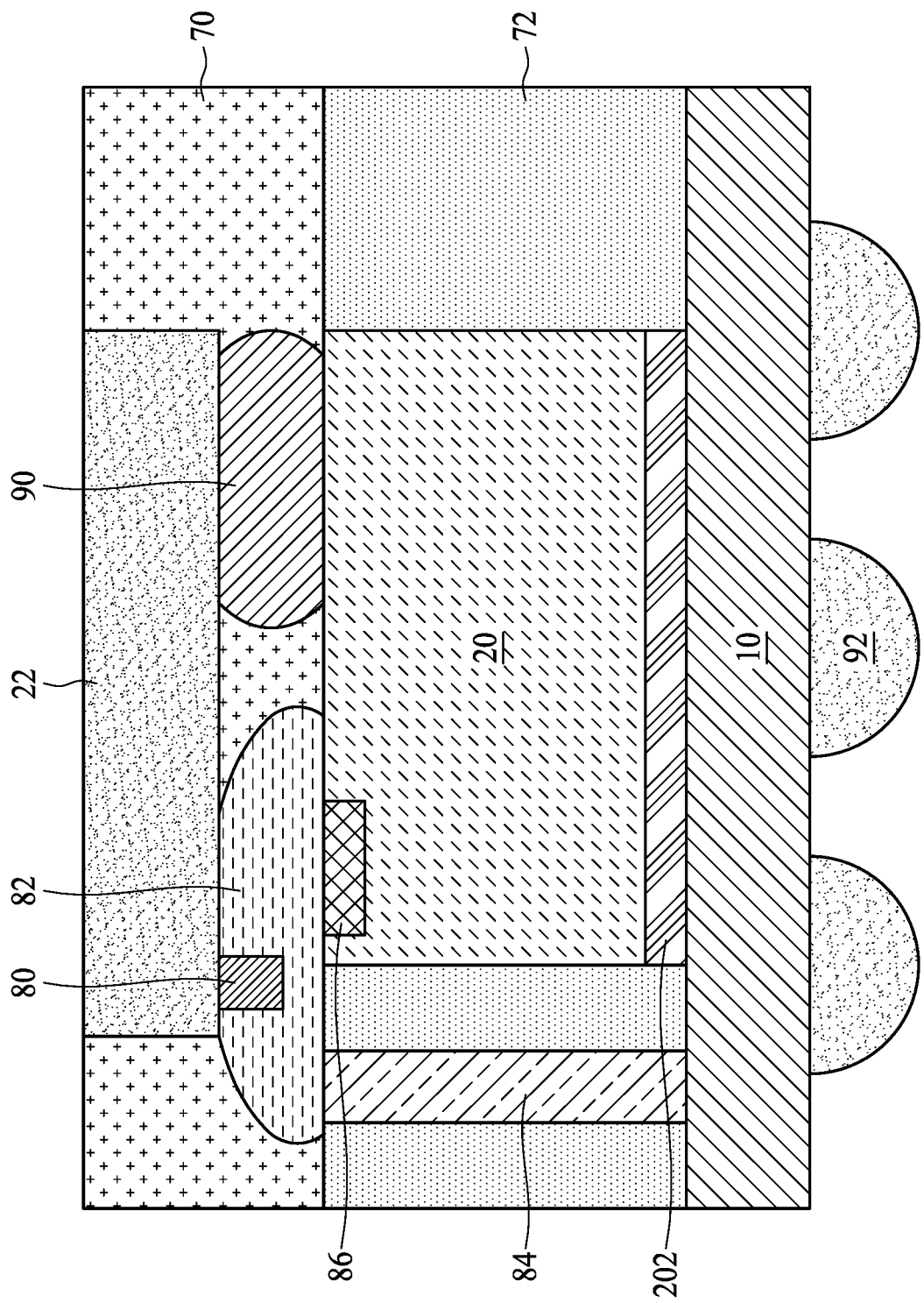

Referring to FIG. 5L, the carrier 102 and release layer 103 are removed. Referring to FIG. 5M, bumps 92 are attached to the bottom surface of the RDL structure 10 to obtain a semiconductor package 3 similar to the one illustrated in FIG. 4A.

Figure 6A:
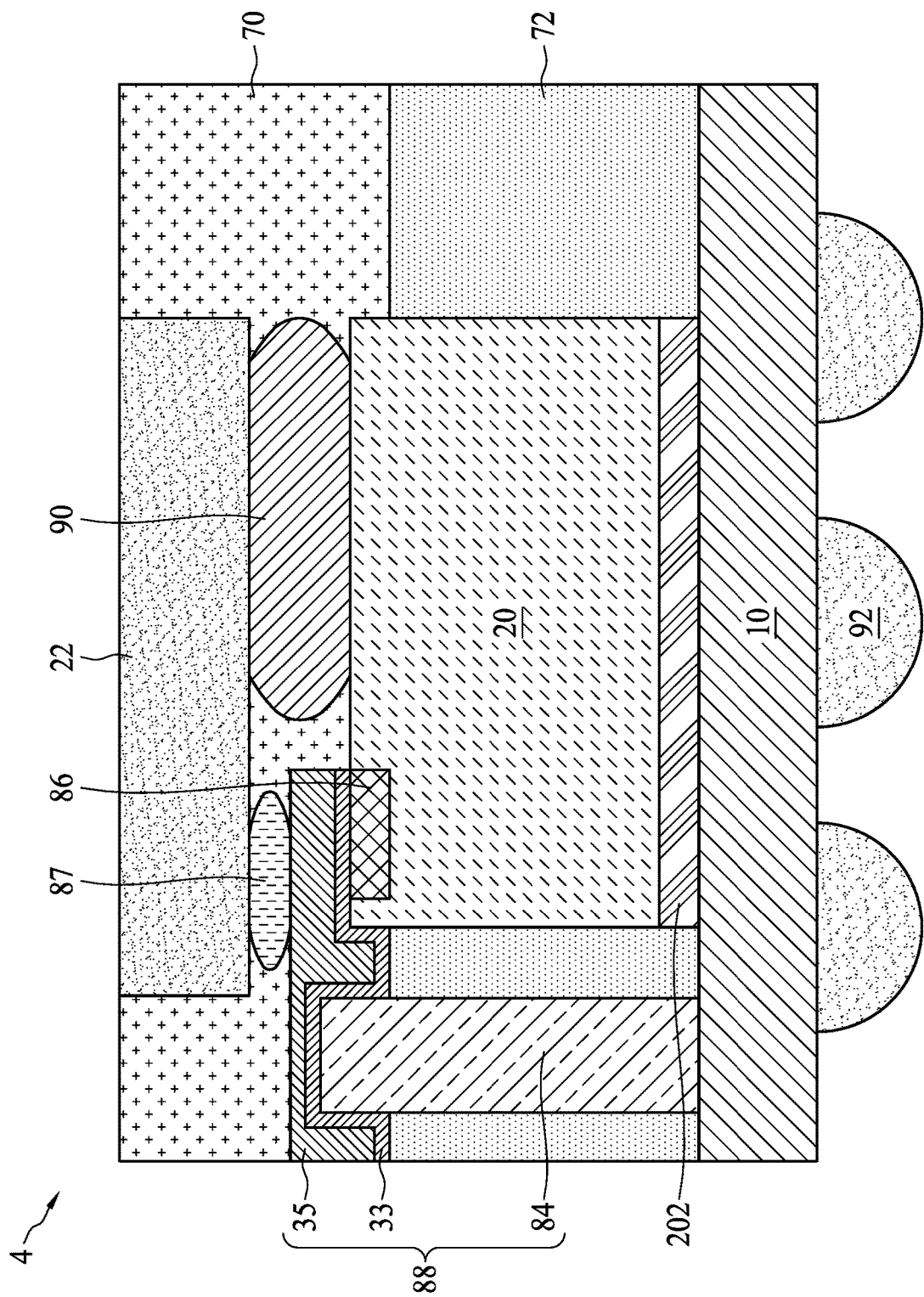
FIG. 6A is a cross-sectional view of a semiconductor package in accordance with an embodiment of the present disclosure.

FIG. 6A is a cross-sectional view of a semiconductor package 4 in accordance with an embodiment of the present disclosure. The semiconductor package 4 includes a RDL structure 10, dies 20 and 22, molding compound 73 and an interconnect structure 88, bumps 90 and 92. The structure of the semiconductor package 4 of FIG. 6A is similar to the structure of the semiconductor package 1 of FIG. 1A, except that the interconnect structure 88 includes conductive post 84, a seed layer 33 and a conductive layer 35. The die 22 includes a bump 87. In one or more embodiments, a material of the seed layer 33, conductive layer 35 may be, for example, Cu, another metal, an alloy, or other suitable conductive materials. In some embodiments, the conductive layer 35 may be formed by a plating operation. In one or more embodiments, the bump 87 may be a solder bump.

Figure 6B:
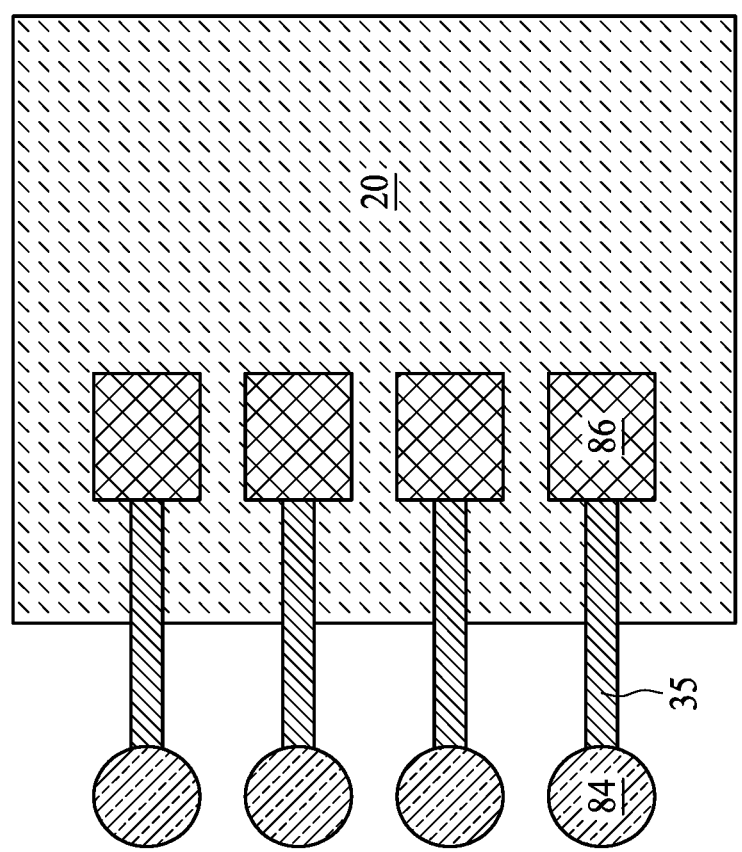
FIG. 6B is a top view of a semiconductor package in accordance with an embodiment of the present disclosure.

FIG. 6B is a top view of a semiconductor package 4 in accordance with an embodiment of the present disclosure. The interconnect structure 88 electrically connects the conductive post 84 to the die 20 through the conductive pad 86. The interconnect structure 88 contacts the conductive post 84 and the die 20. The interconnect structure 88 electrically connects the bump 87.

Figure 7A:
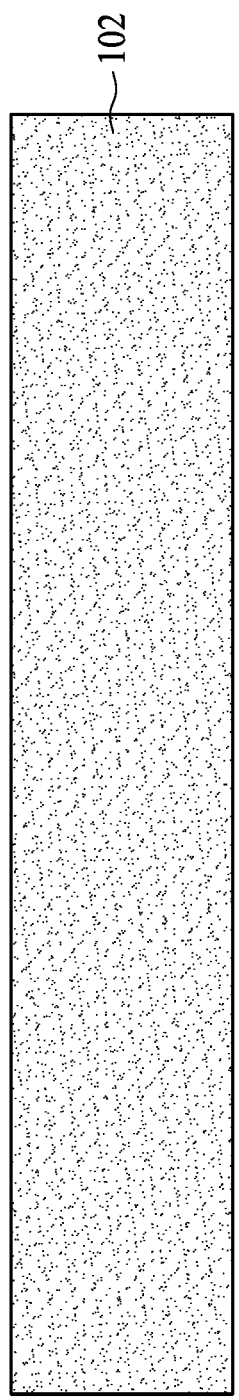
FIG. 7A, FIG. 7B, FIG. 7C, FIG. 7D, FIG. 7E, FIG. 7F, FIG. 7G, FIG. 7H, FIG. 7I, FIG. 7J, FIG. 7K, FIG. 7L, FIG. 7M, FIG. 7N, FIG. 7O, and FIG. 7P illustrate a method of manufacturing a semiconductor package in accordance with an embodiment of the present disclosure.
Figure 7B:
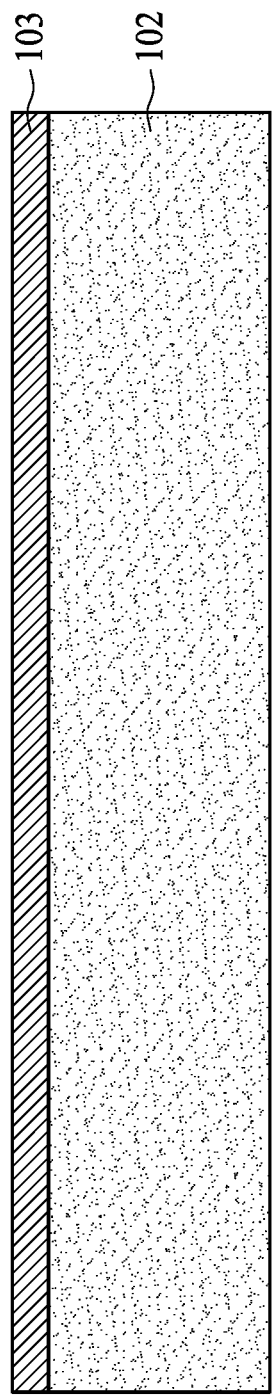
Figure 7C:
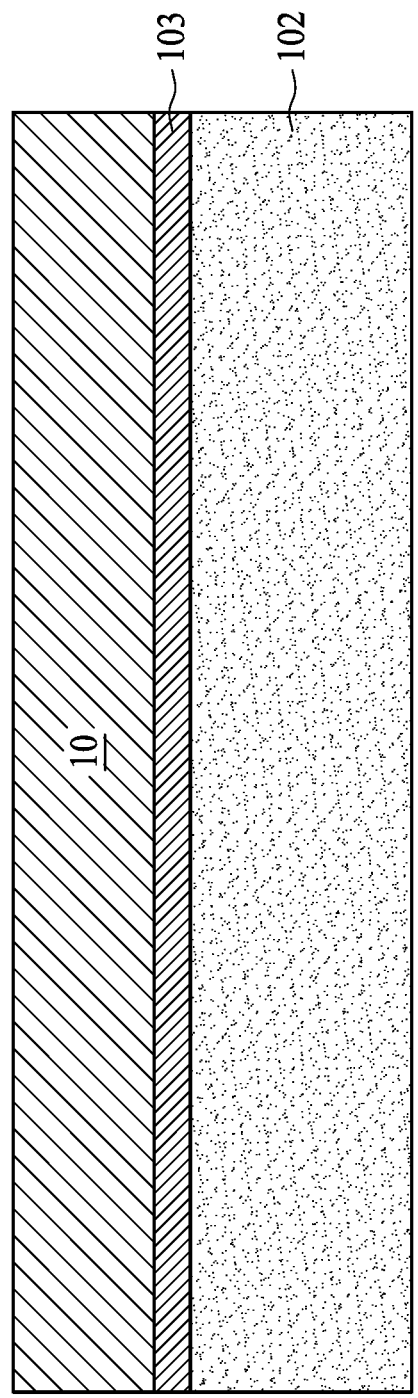
Figure 7D:
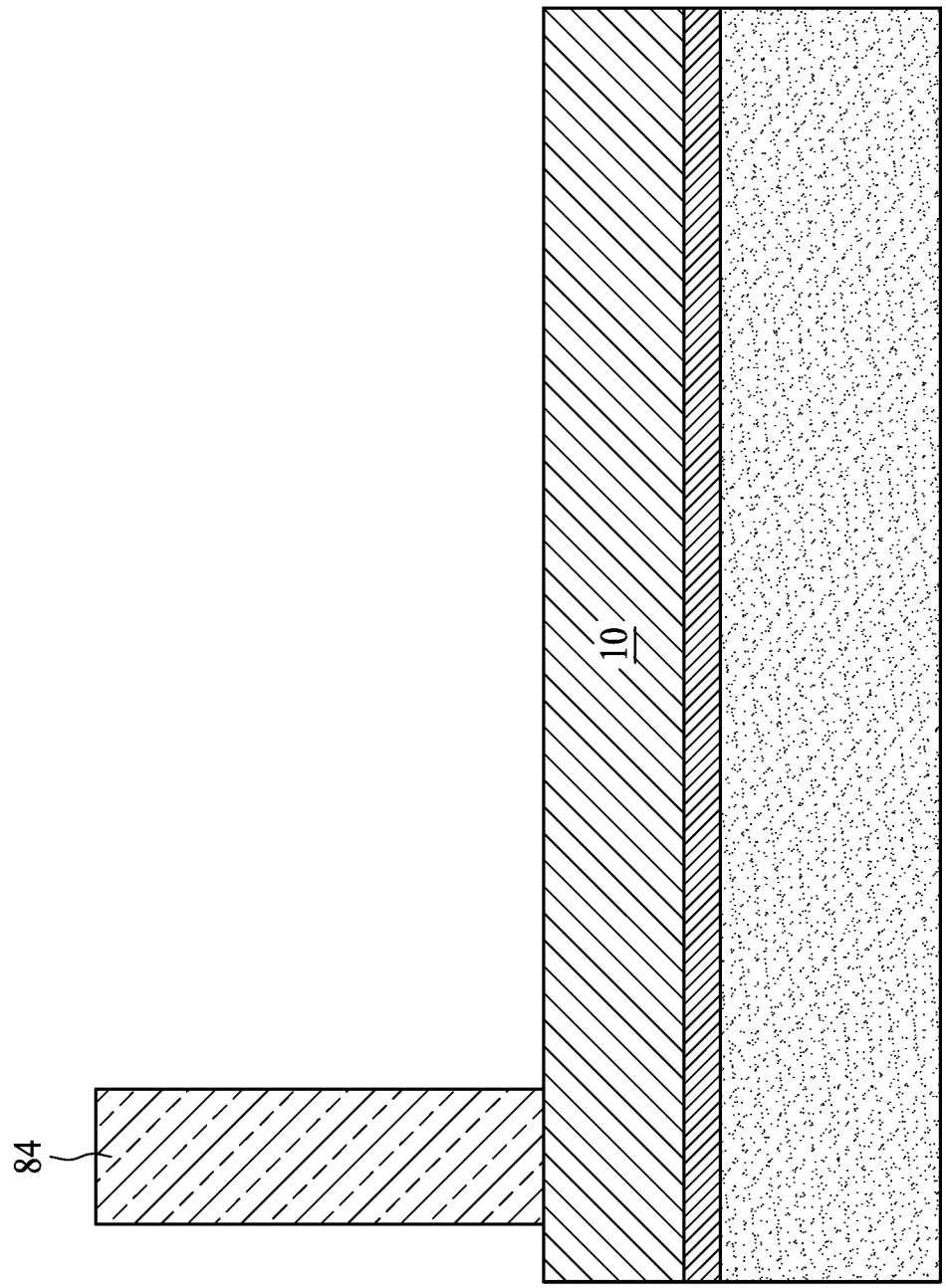
Figure 7E:
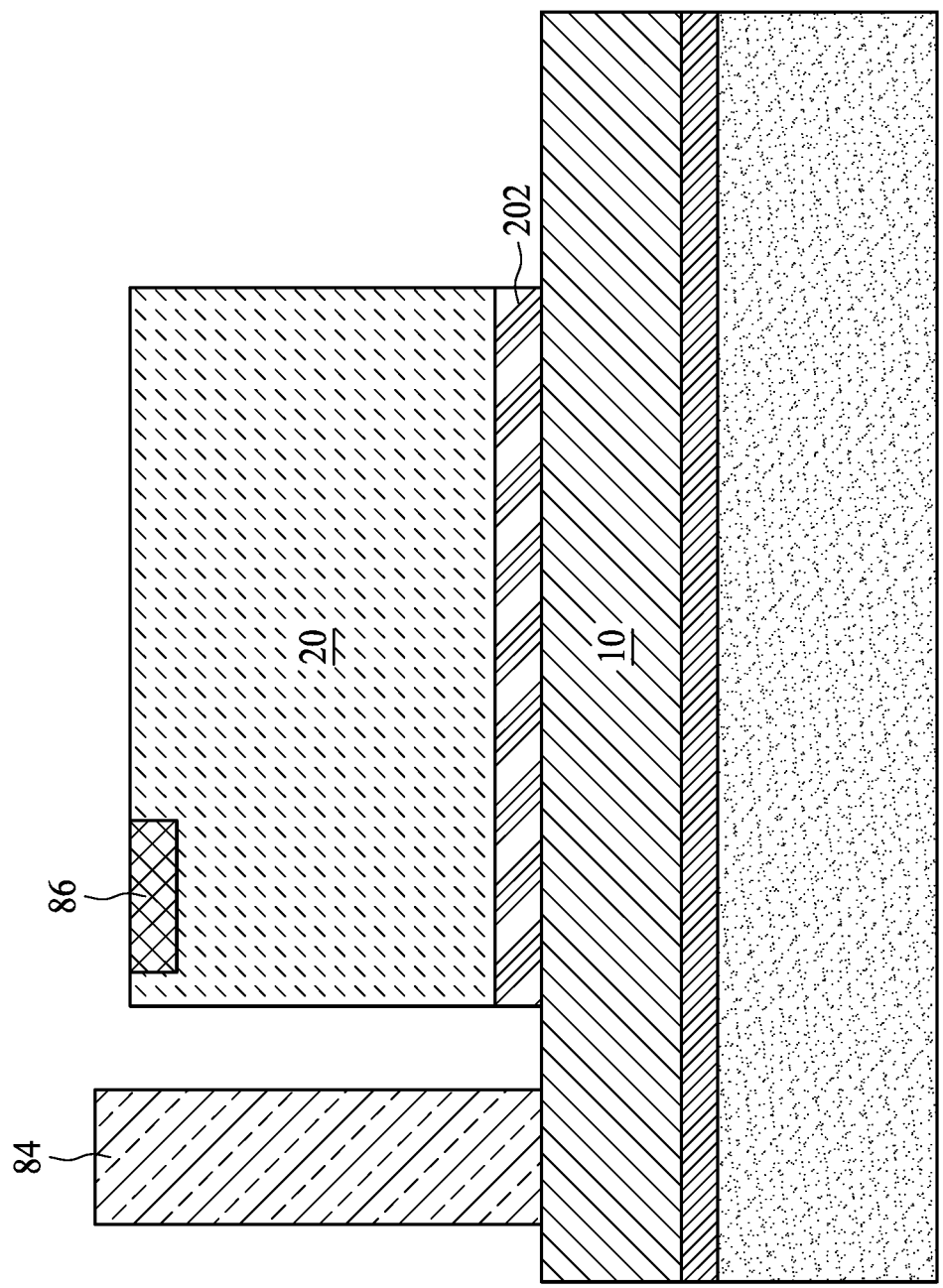
Figure 7F:
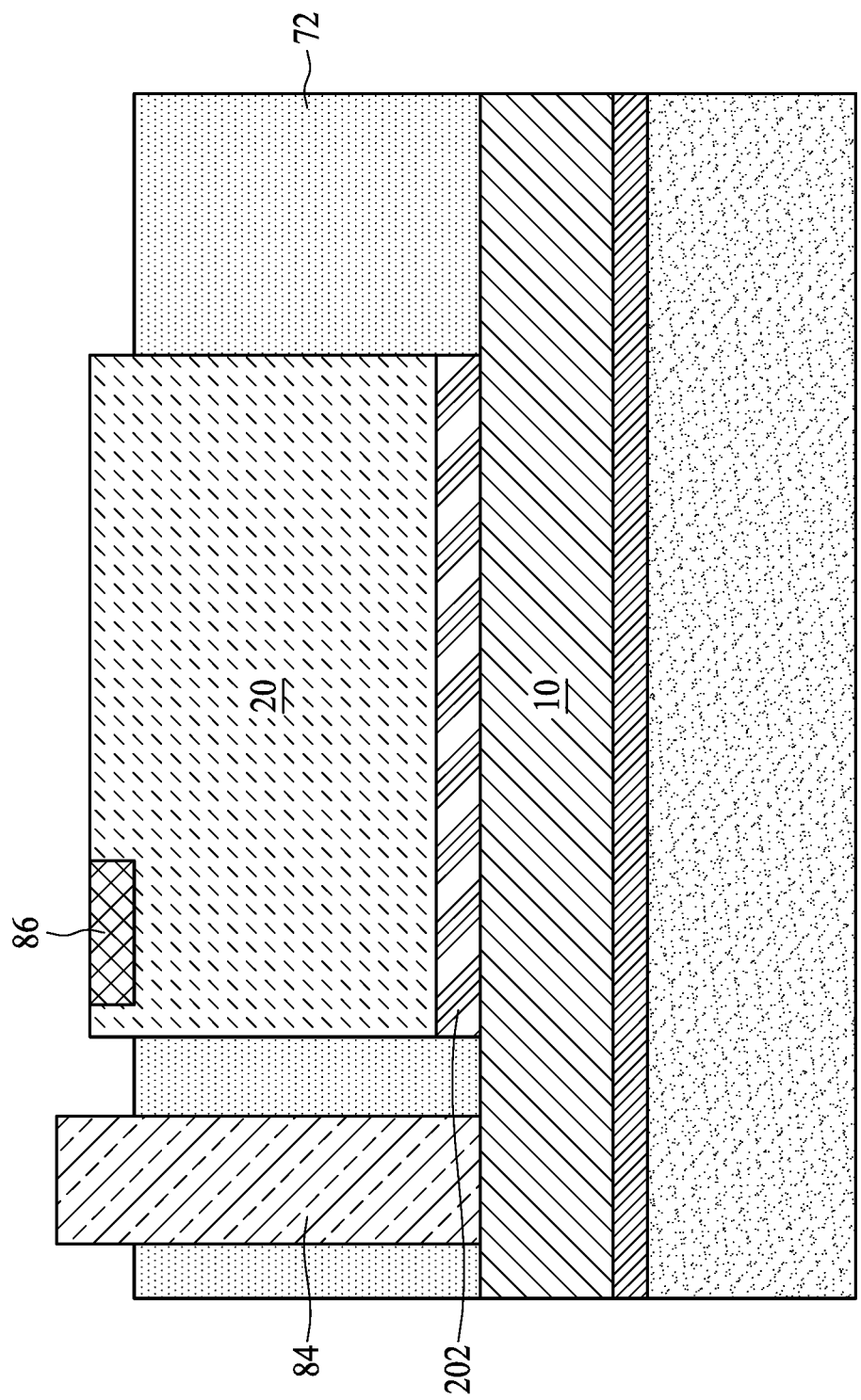
Figure 7G:
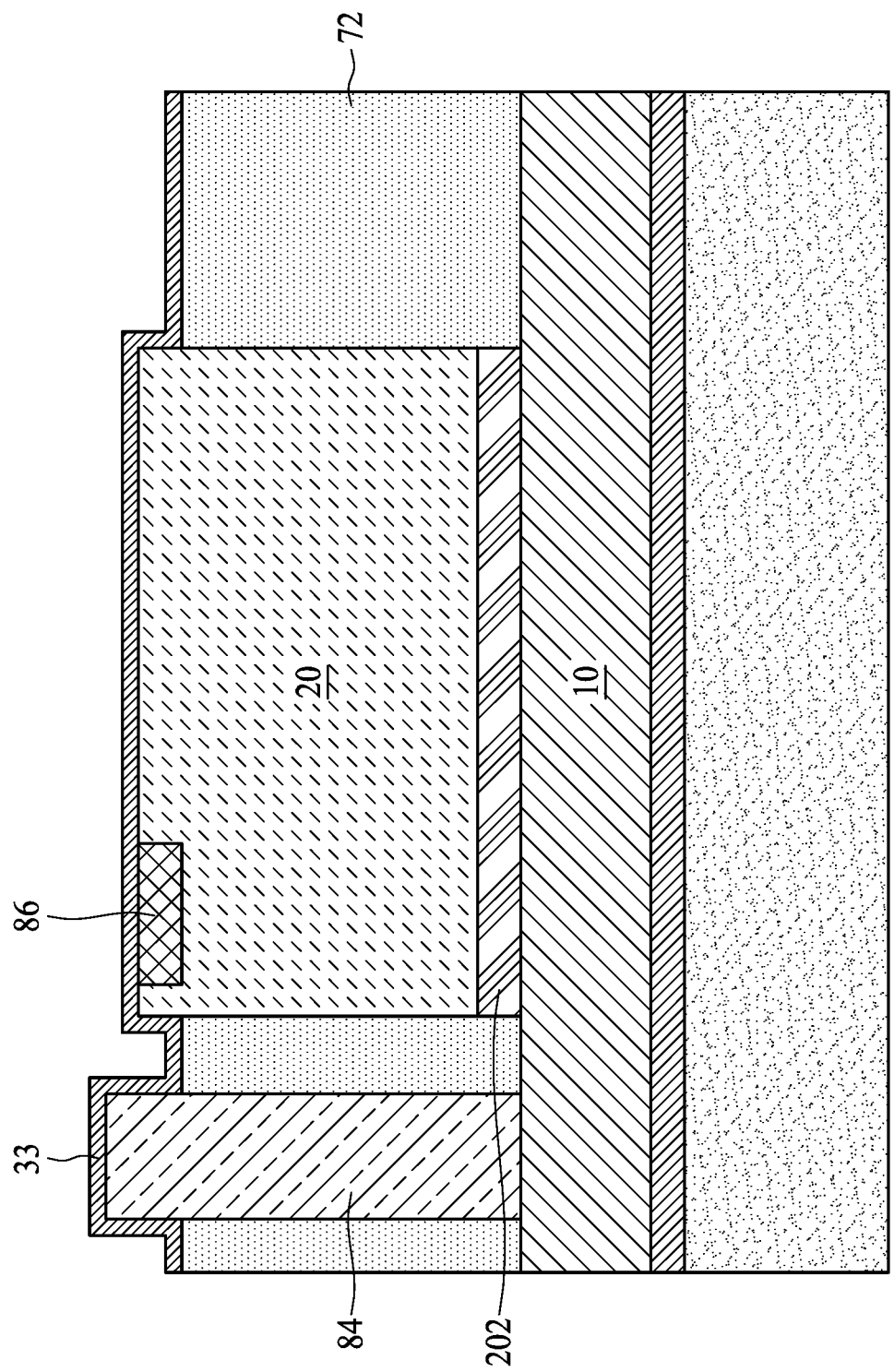
Figure 7H:
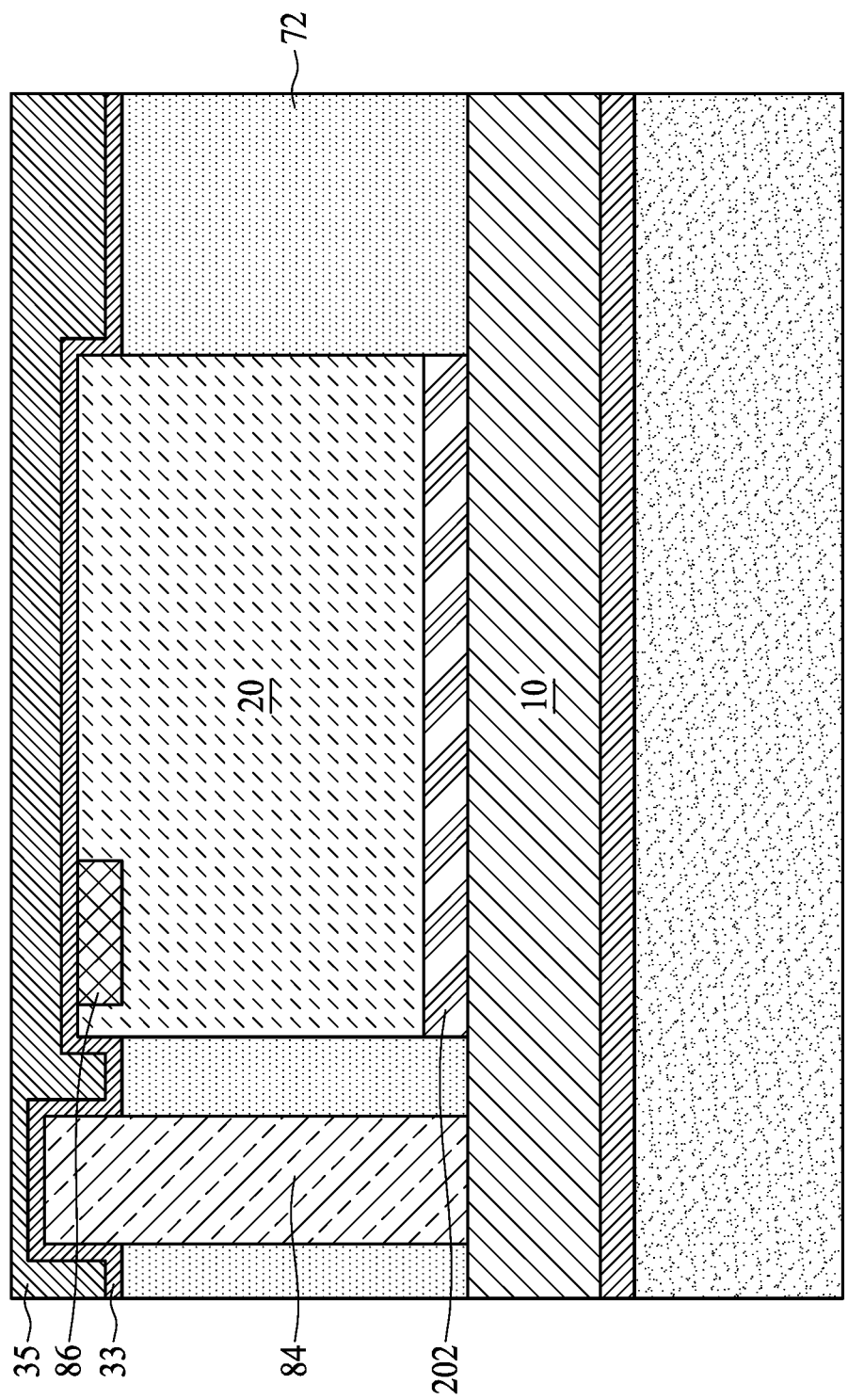
Figure 7I:
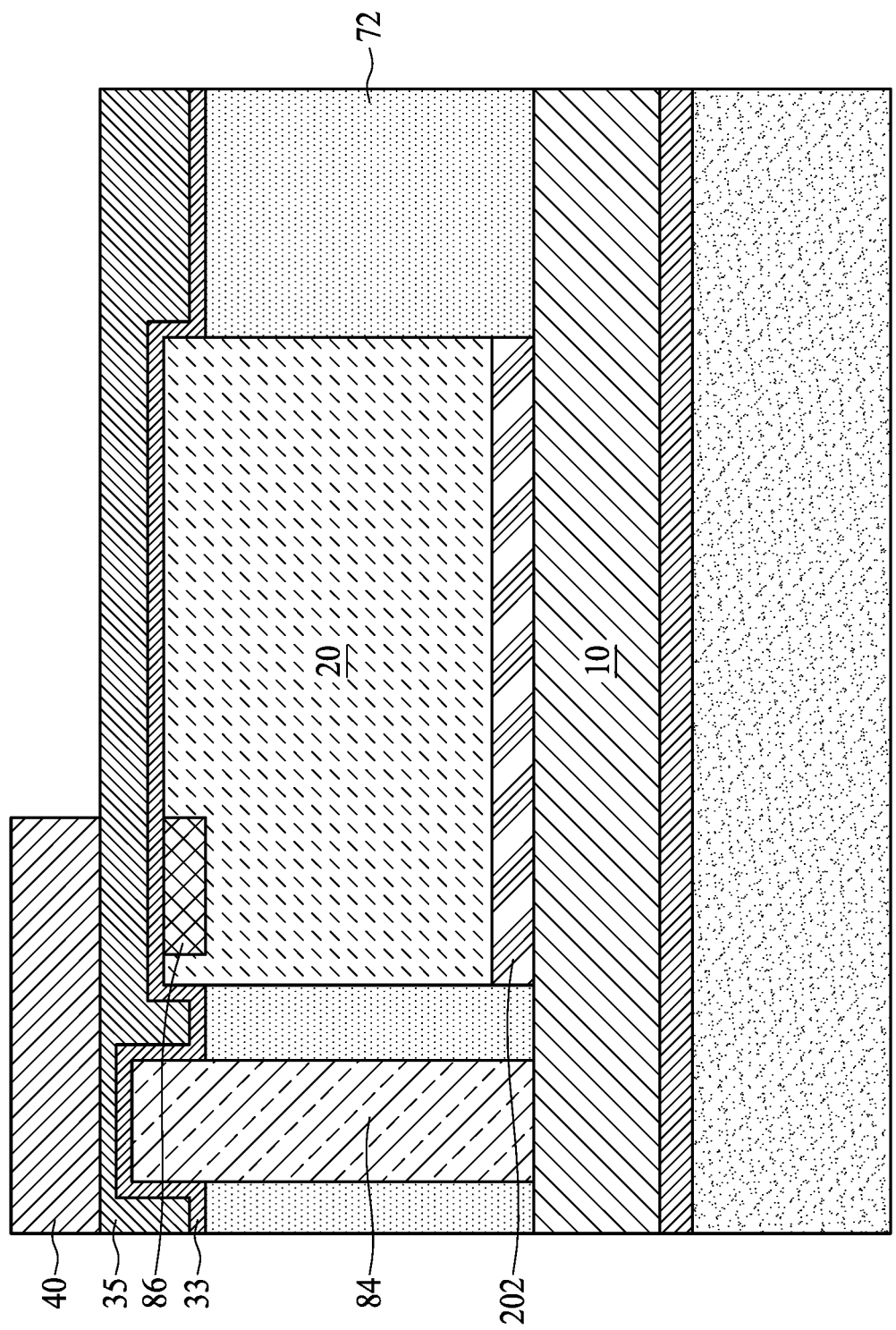
Figure 7J:
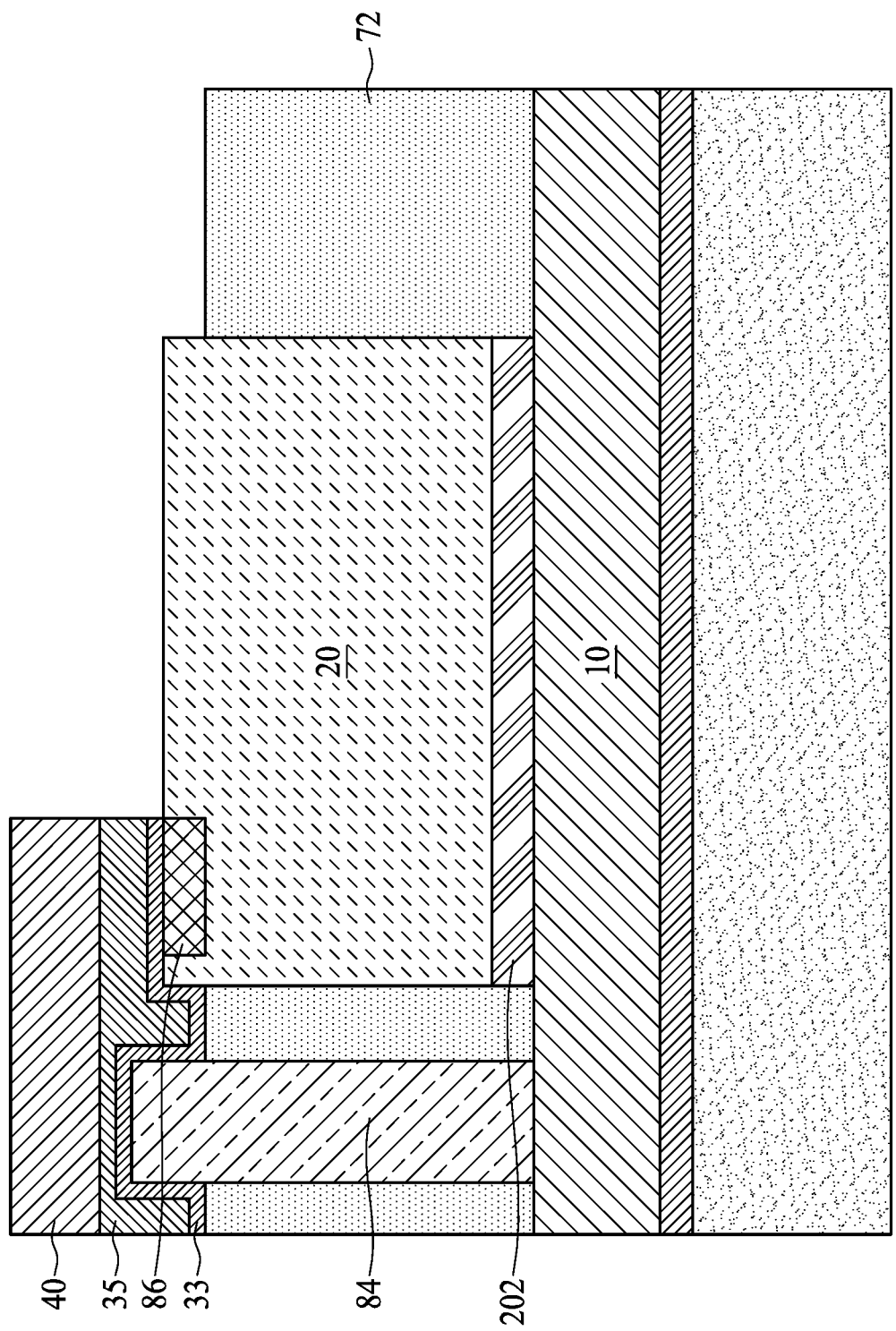
Figure 7K:
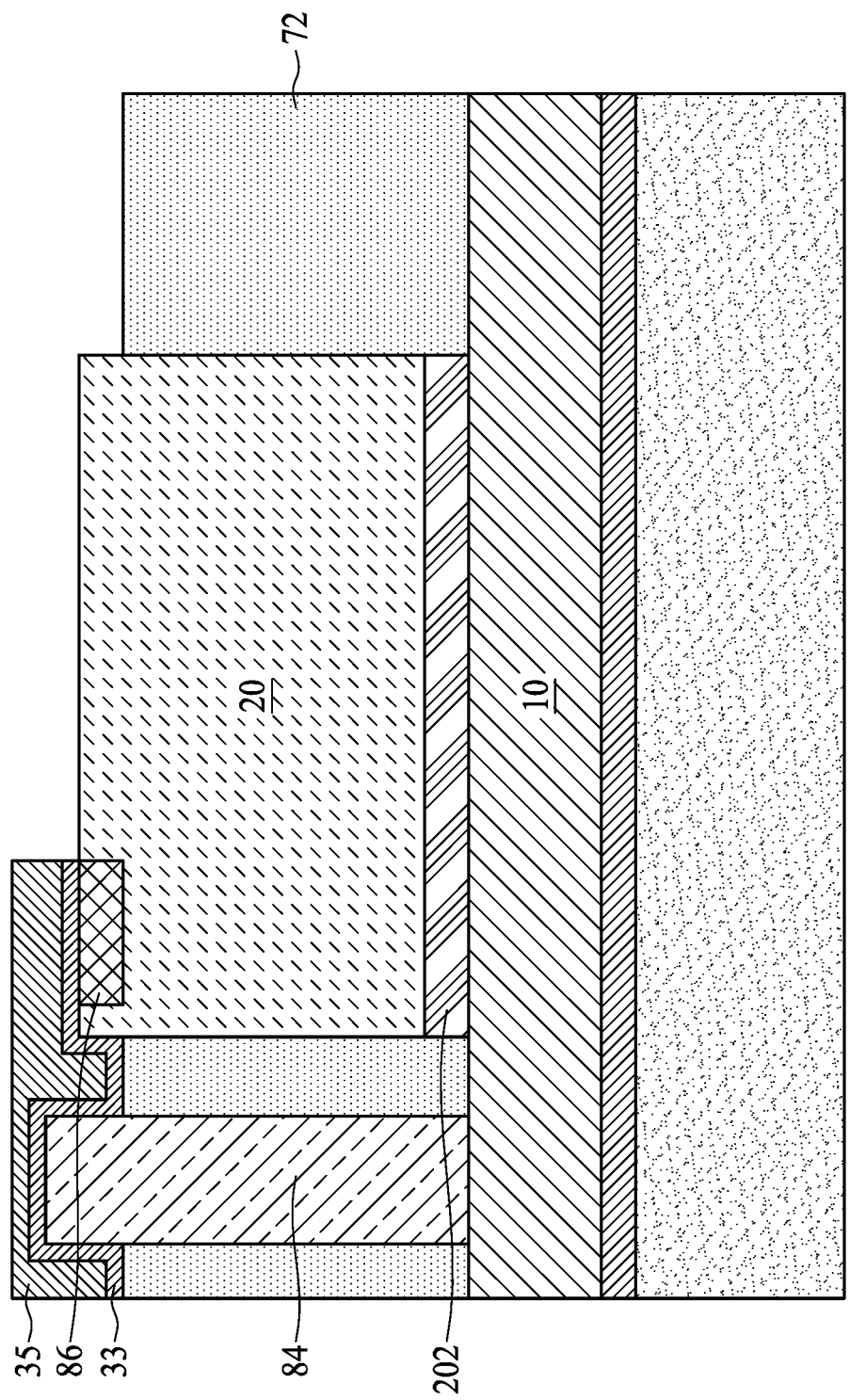
Figure 7L:
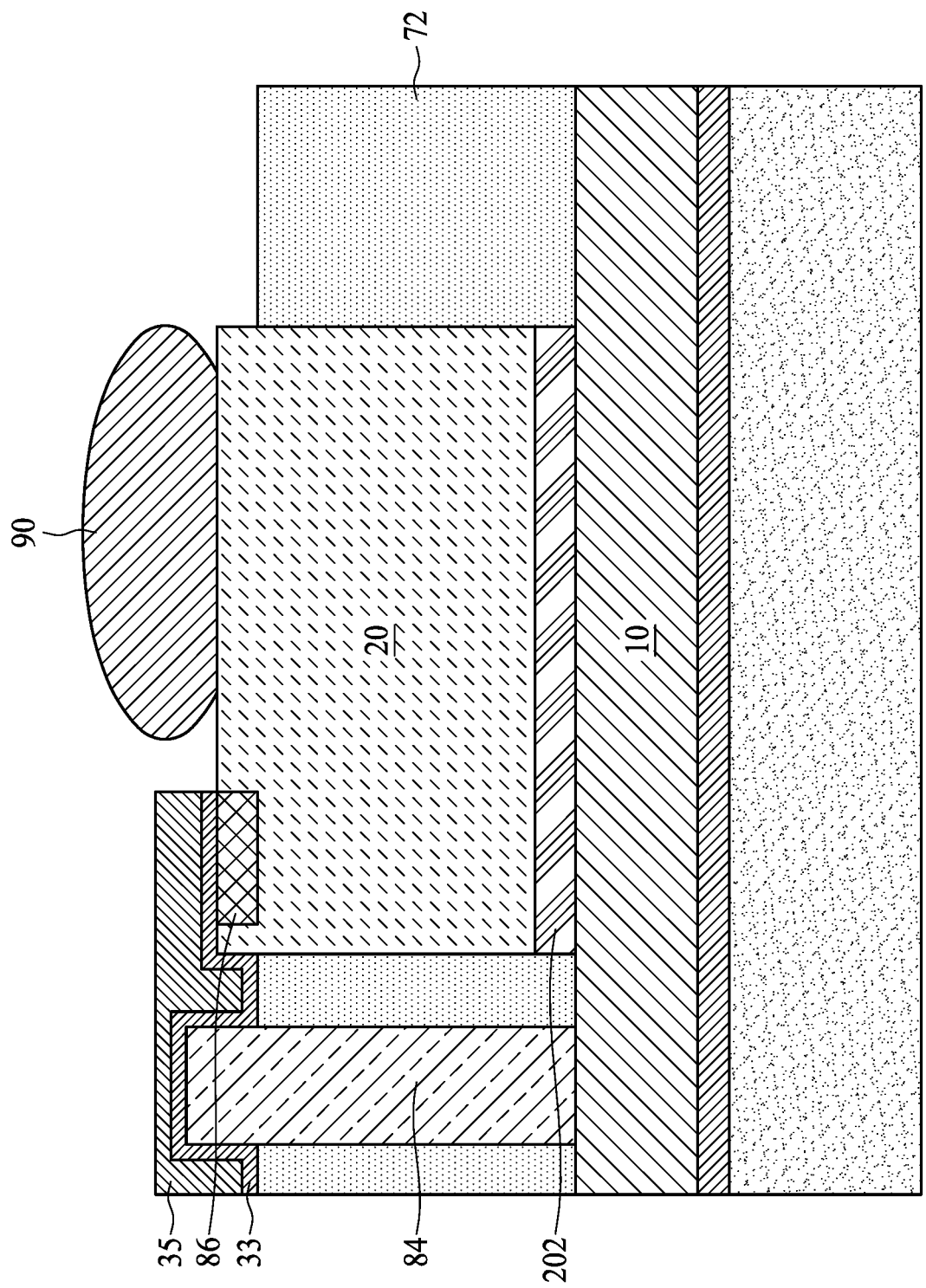
Figure 7M:
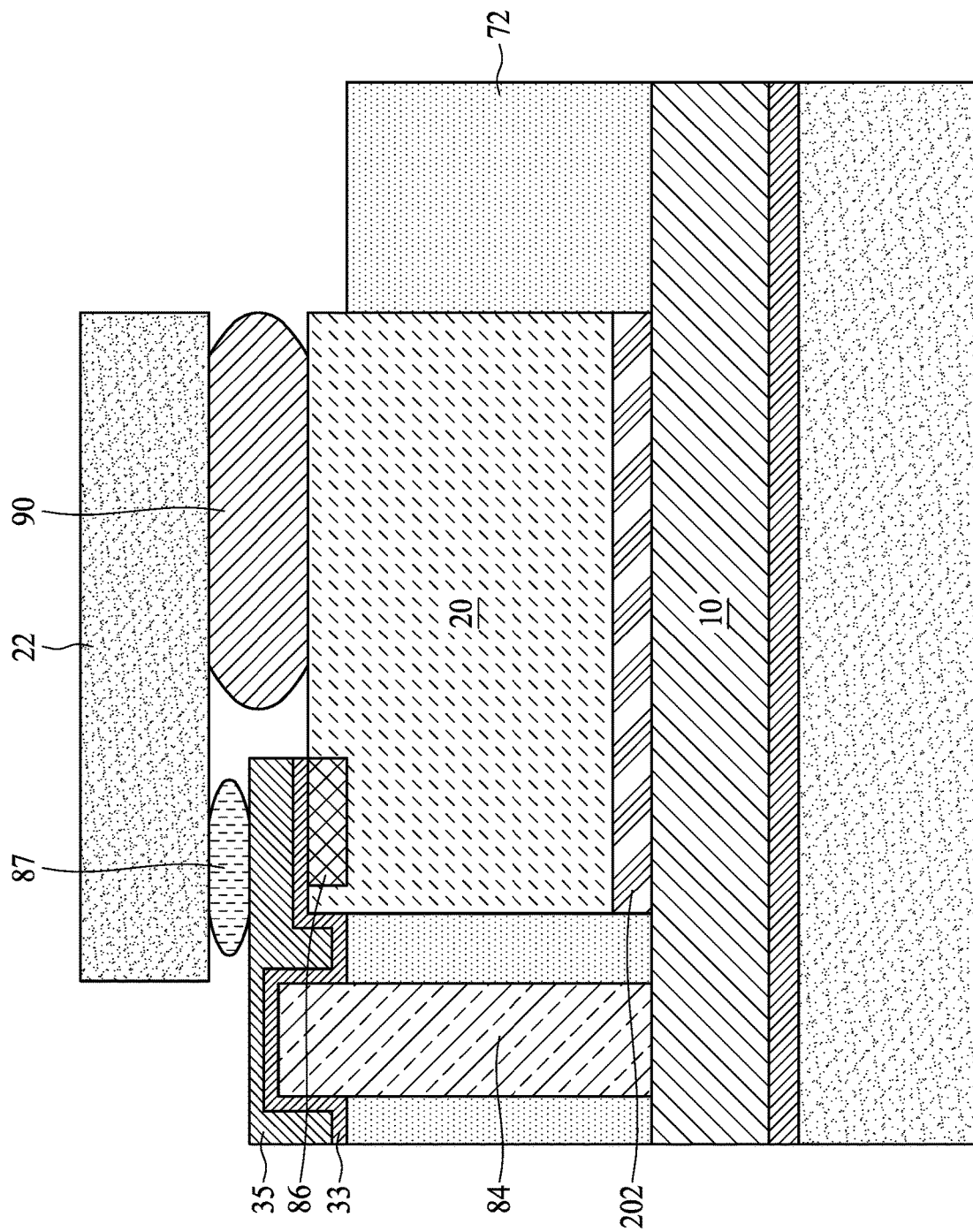
Figure 7N:
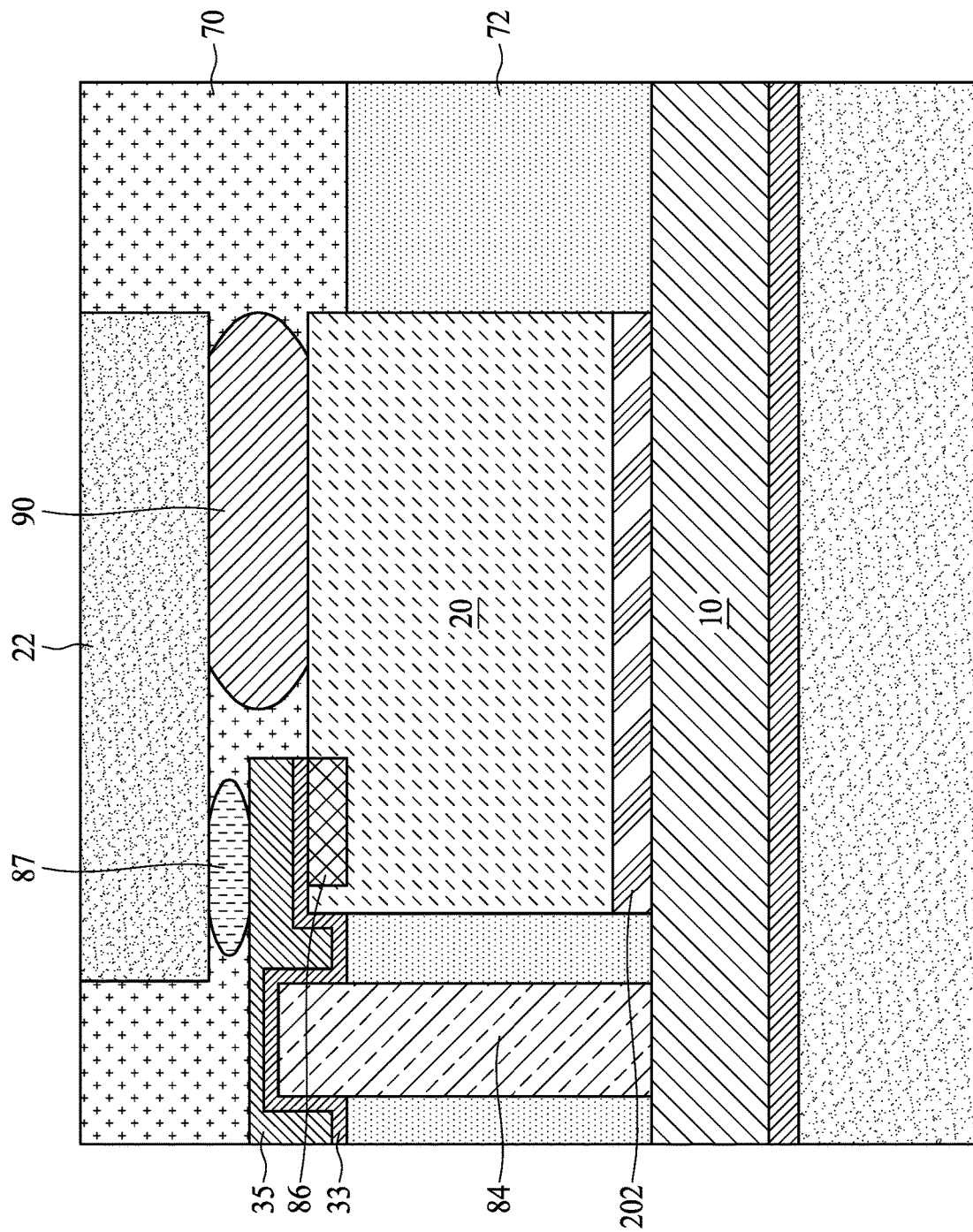
Figure 7O:
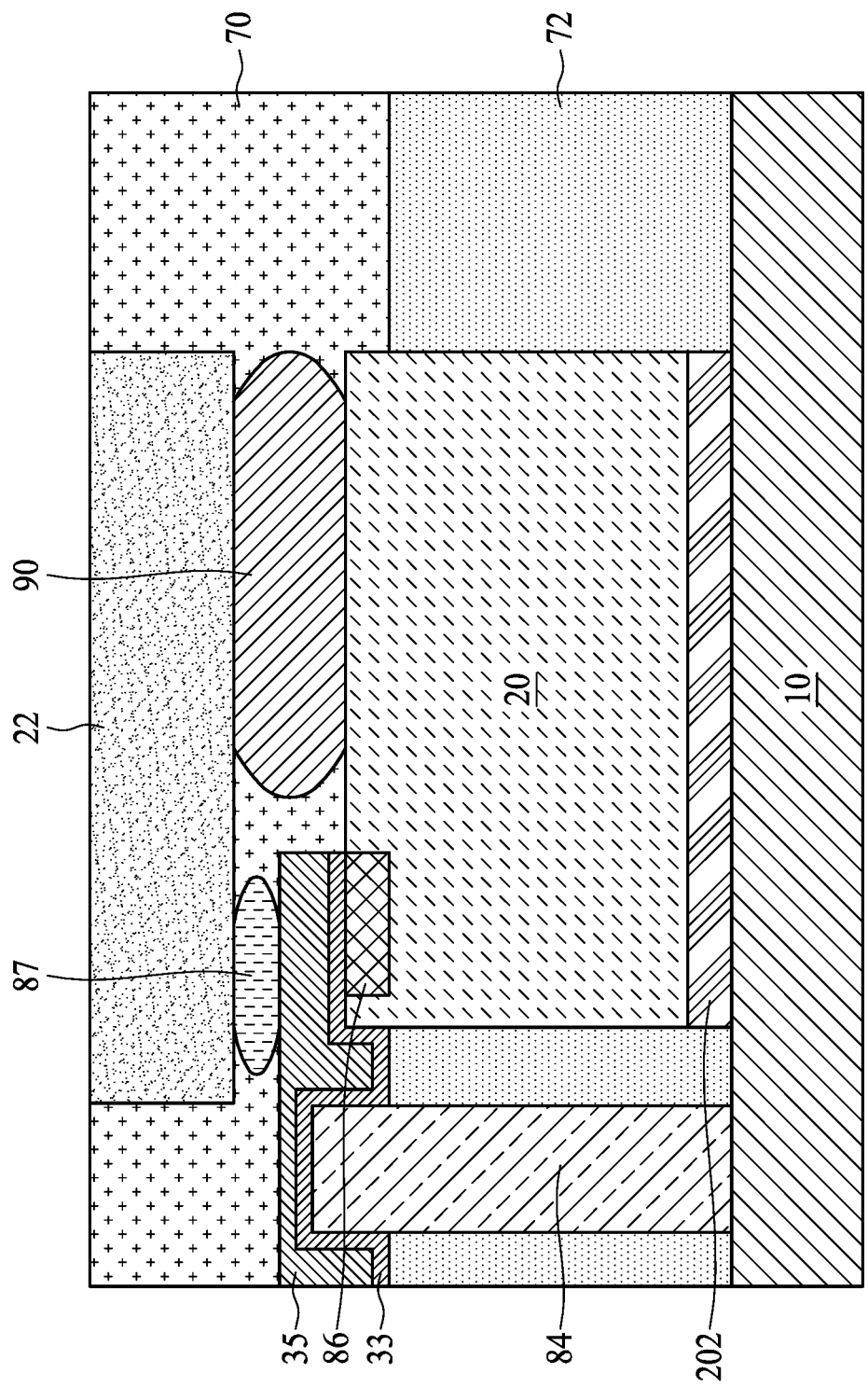
Figure 7P:
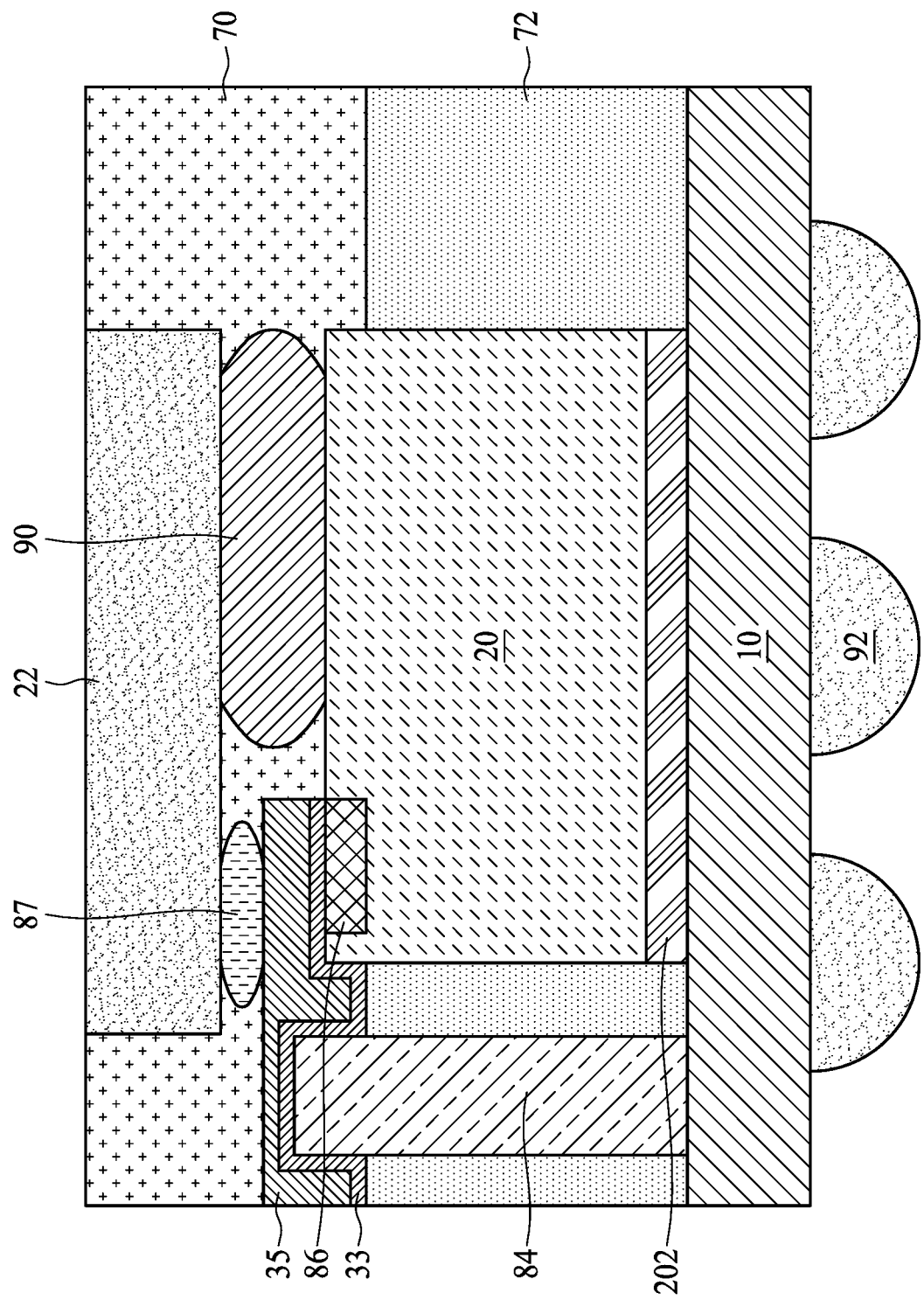

FIGS. 7A-7P illustrate a method of manufacturing a semiconductor package 4 in accordance with an embodiment of the present disclosure. Referring to FIG. 7A, a carrier 102 is provided. Referring to FIG. 7B, a release layer 103 is coated on the top surface of the carrier 102. Referring to FIG. 7C, a RDL structure 10 is disposed on the release layer 103.

Referring to FIG. 7D, a conductive post 84 is formed on the top surface of the RDL structure 10. Referring to FIG. 7E, a die 20 is disposed on the top surface of the RDL structure 10. The die 20 includes a conductive pad 86. In some embodiments, the top surface of the conductive post 84 may be greater than the top surface of the die 20.

Referring to FIG. 7F, a first molding compound 72 is formed on the RDL structure 10. The first molding compound 72 encapsulates a portion of the die 20 and a portion of the conductive post 84. Referring to FIG. 7G, a seed layer 33 is formed on the first molding compound 72, die 20 and conductive post 84.

Referring to FIG. 7H, a conductive layer 35 is formed on the seed layer 33. The conductive layer 35 may be formed by a plating operation.

Referring to FIG. 7I, a patterned photoresist 40 is formed on the conductive layer 35. Referring to FIG. 7J, a portion of the seed layer 33 and conductive layer 35 is removed. Referring to FIG. 7K, patterned photoresist 40 is removed. Referring to FIG. 7L, a bump 90 is formed on the die 20.

Referring to FIG. 7M, a die 22 is disposed on the bump 90 and conductive layer 35. The bump 87 contacts the conductive layer 35.

Referring to FIG. 7N, a second molding compound 70 is disposed on the first molding compound 72. The second molding compound 70 encapsulates the die 22, bump 90, seed layer 33 and conductive layer 35.

Referring to FIG. 7O, the carrier 102 and release layer 103 are removed. Referring to FIG. 7P, the bumps 92 are attached to the bottom surface of the RDL structure 10 to obtain a semiconductor package 4 similar to the one illustrated in FIG. 6A.

Figure 8A:
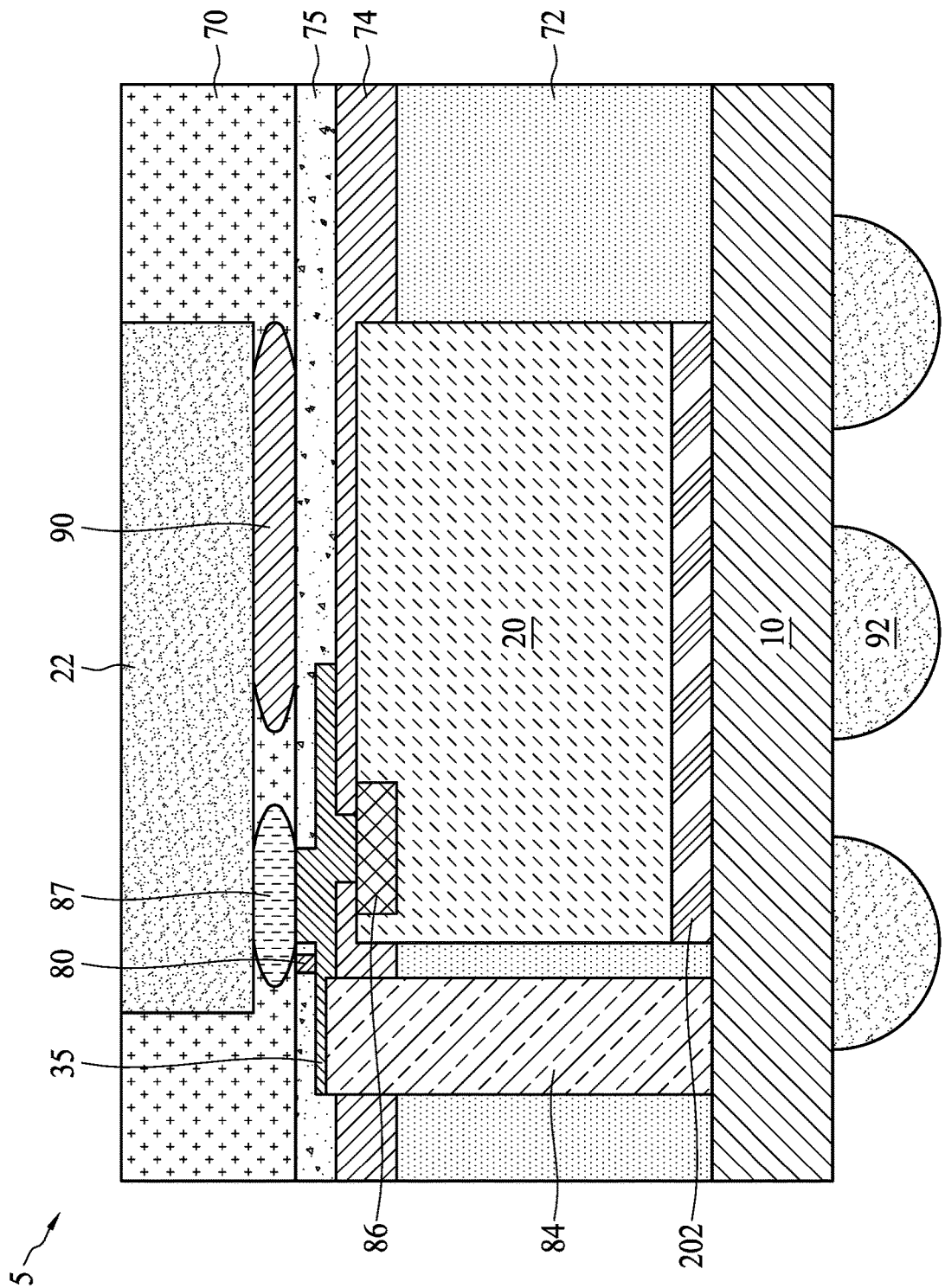
FIG. 8A is a cross-sectional view of a semiconductor package in accordance with an embodiment of the present disclosure.

FIG. 8A is a cross-sectional view of a semiconductor package 5 in accordance with an embodiment of the present disclosure. The semiconductor package 5 includes a RDL structure 10, dies 20 and 22, conductive layer 35, molding compounds 70 and 72, molding compounds 74 and 75 and conductive post 84, bumps 87, 90 and 92. The structure of the semiconductor package 5 of FIG. 8A is similar to the structure of the semiconductor package 4 of FIG. 6A, except that the molding compounds 74 and 75, conductive post 84 and the conductive layer 35 may together form a second RDL structure. In one or more embodiments, a material of the conductive layer 35 may be, for example, Cu, another metal, an alloy, or other suitable conductive materials. In some embodiments, the conductive layer 35 may be formed by a plating operation.

Figure 8B:
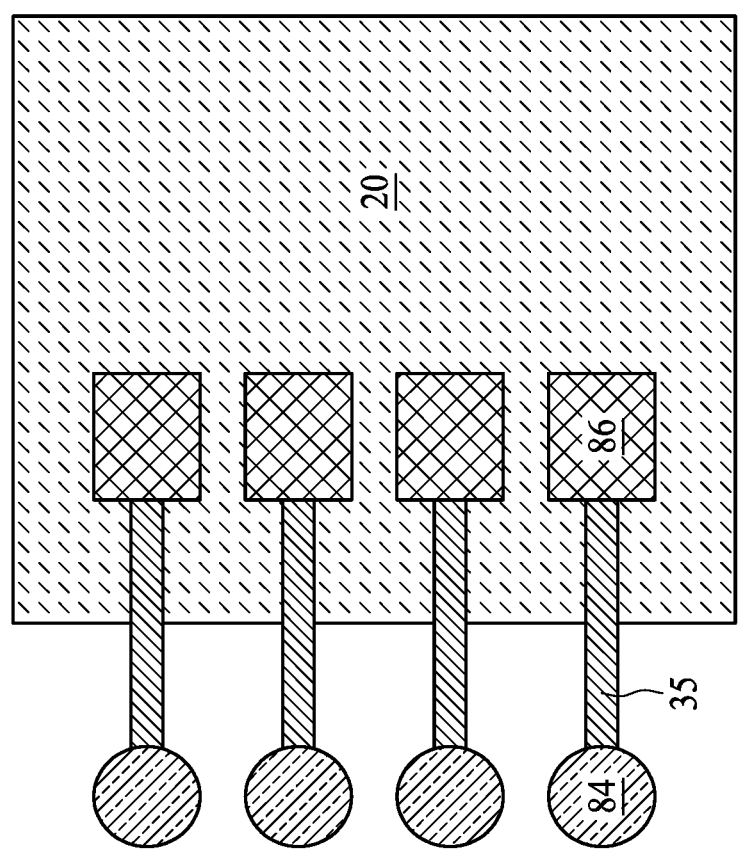
FIG. 8B is a top view of a semiconductor package in accordance with an embodiment of the present disclosure.

FIG. 8B is a top view of a semiconductor package 5 in accordance with an embodiment of the present disclosure. The conductive post 84 electrically connects the die 20 and 22 to the RDL structure 10 through the conductive layer 35. The conductive post 84 electrically connects the bump 87 through the conductive layer 35.

Figure 9A:
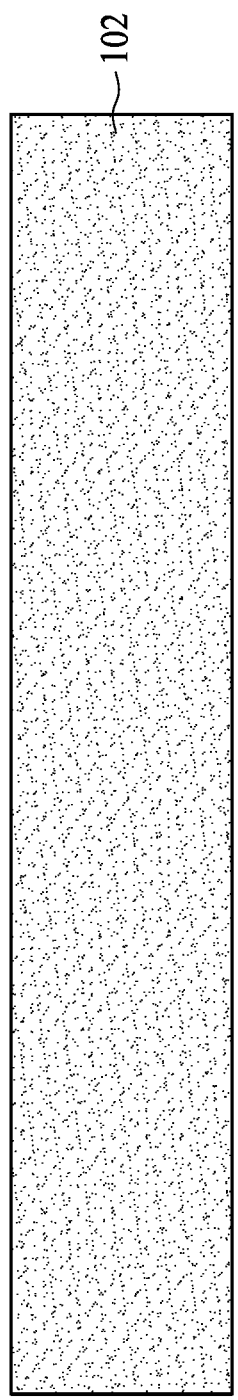
FIG. 9A, FIG. 9B, FIG. 9C, FIG. 9D, FIG. 9E, FIG. 9F, FIG. 9G, FIG. 9H, FIG. 9I, FIG. 9J, FIG. 9K, and FIG. 9L illustrate a method of manufacturing a semiconductor package in accordance with an embodiment of the present disclosure.
Figure 9B:
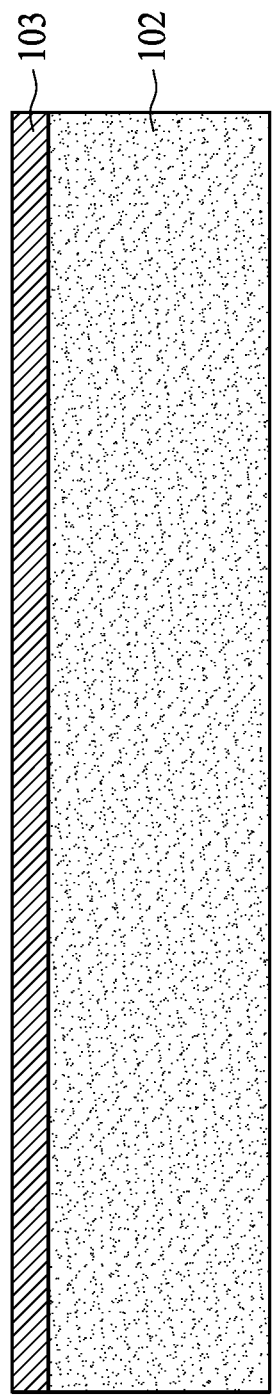
Figure 9C:
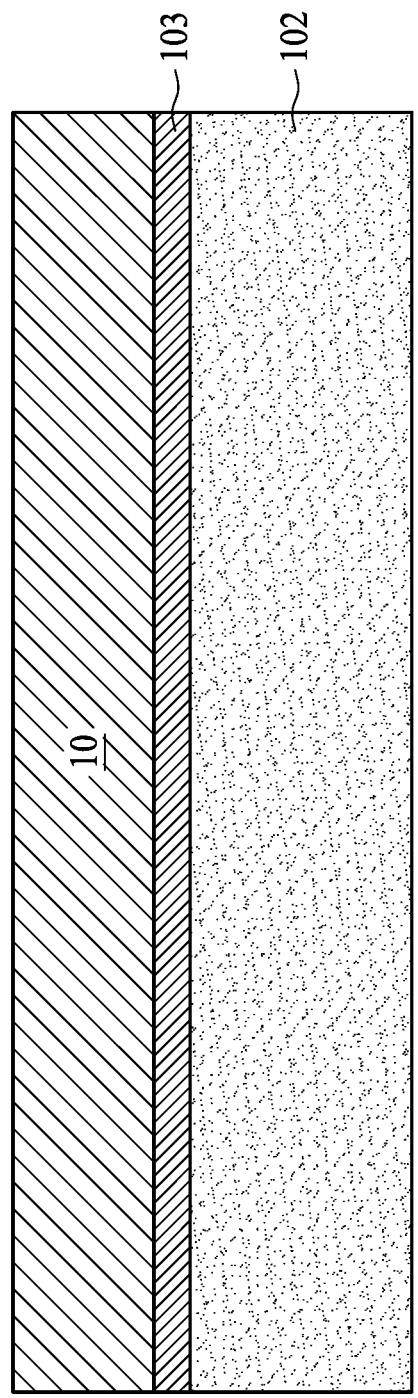

FIGS. 9A-9L illustrate a method of manufacturing a semiconductor package 5 in accordance with an embodiment of the present disclosure. Referring to FIG. 9A, a carrier 102 is provided. Referring to FIG. 9B, a release layer 103 is coated on the top surface of the carrier 102. Referring to FIG. 9C, a RDL structure 10 is disposed on the release layer 103.

Figure 9D:
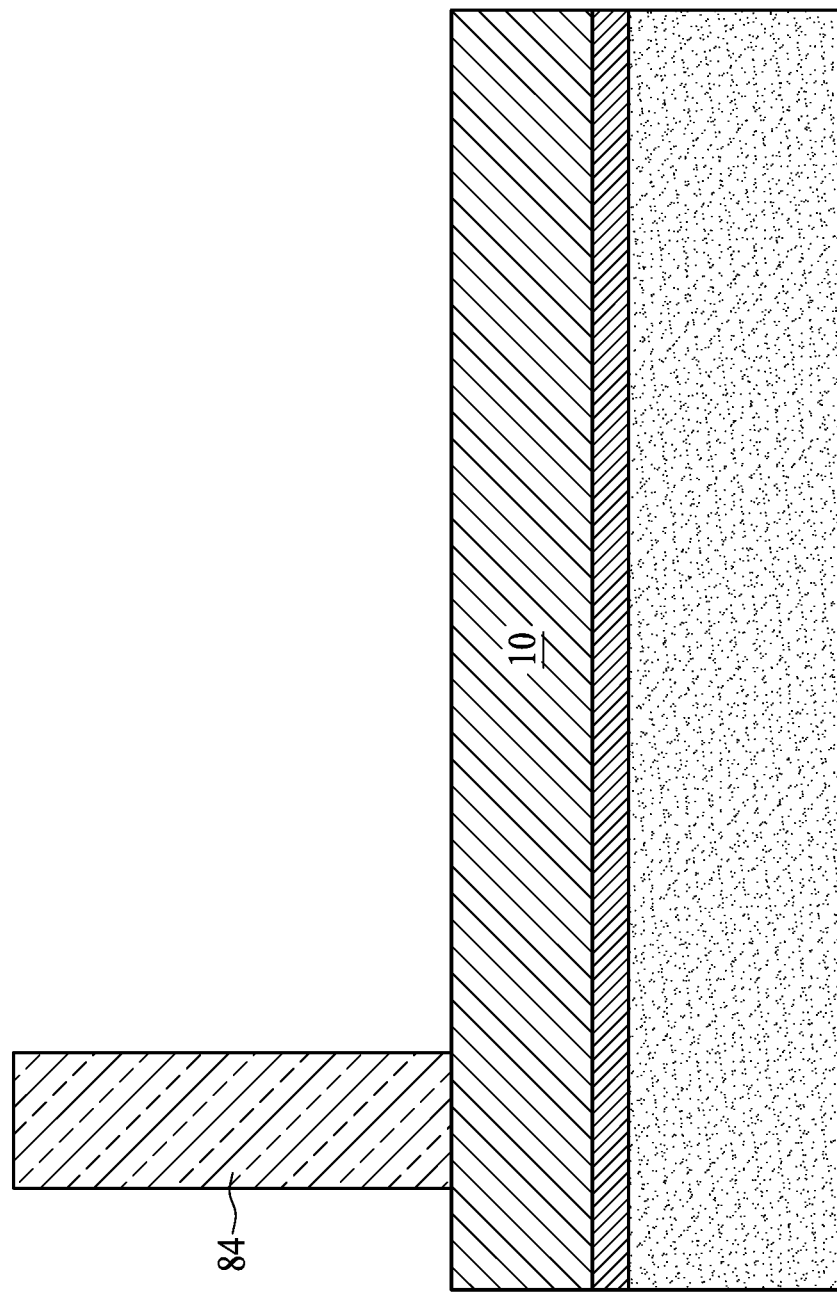
Figure 9E:
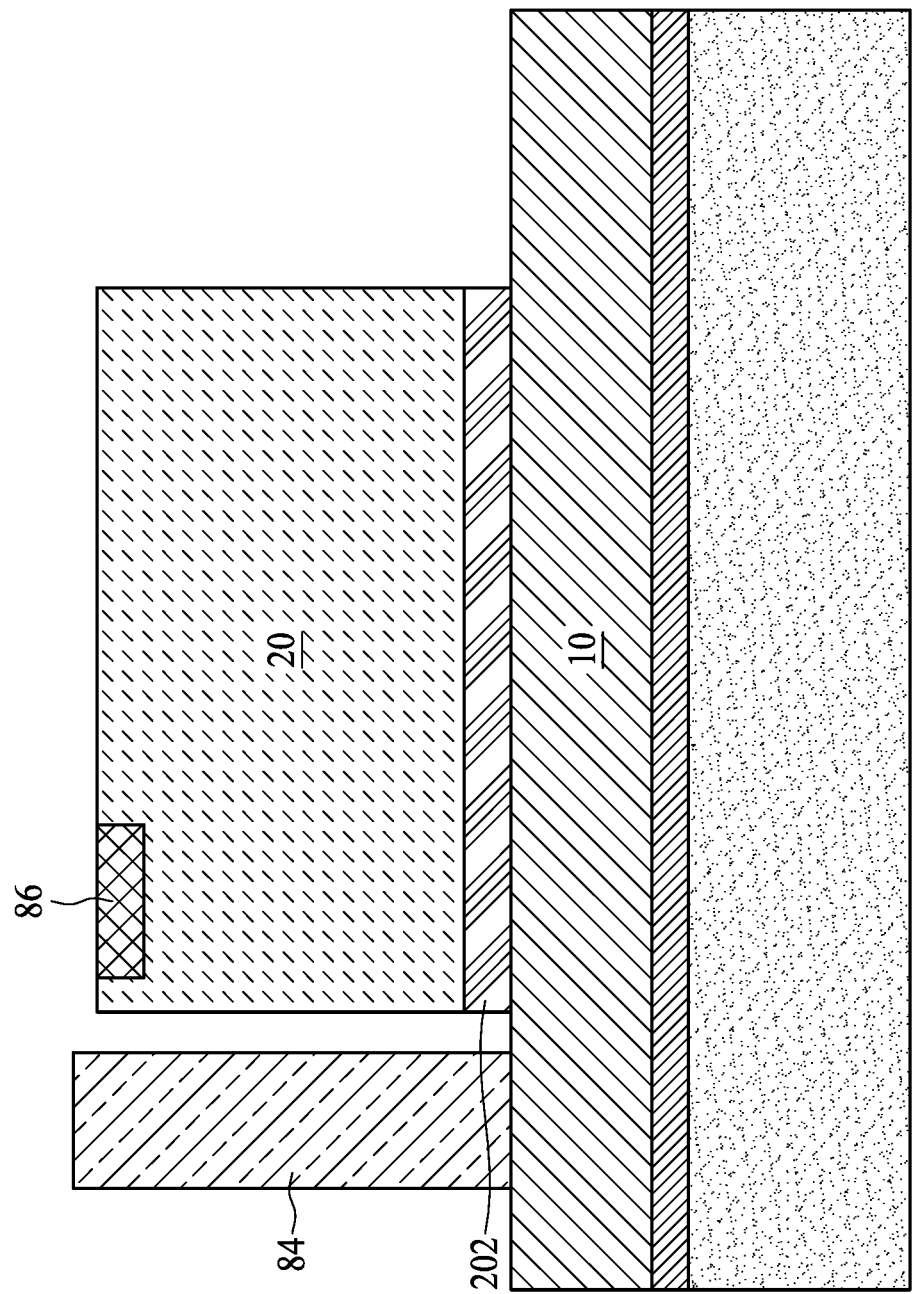

Referring to FIG. 9D, a conductive post 84 is formed on the top surface of the RDL structure 10. Referring to FIG. 9E, a die 20 is disposed on the top surface of the RDL structure 10.

Figure 9F:
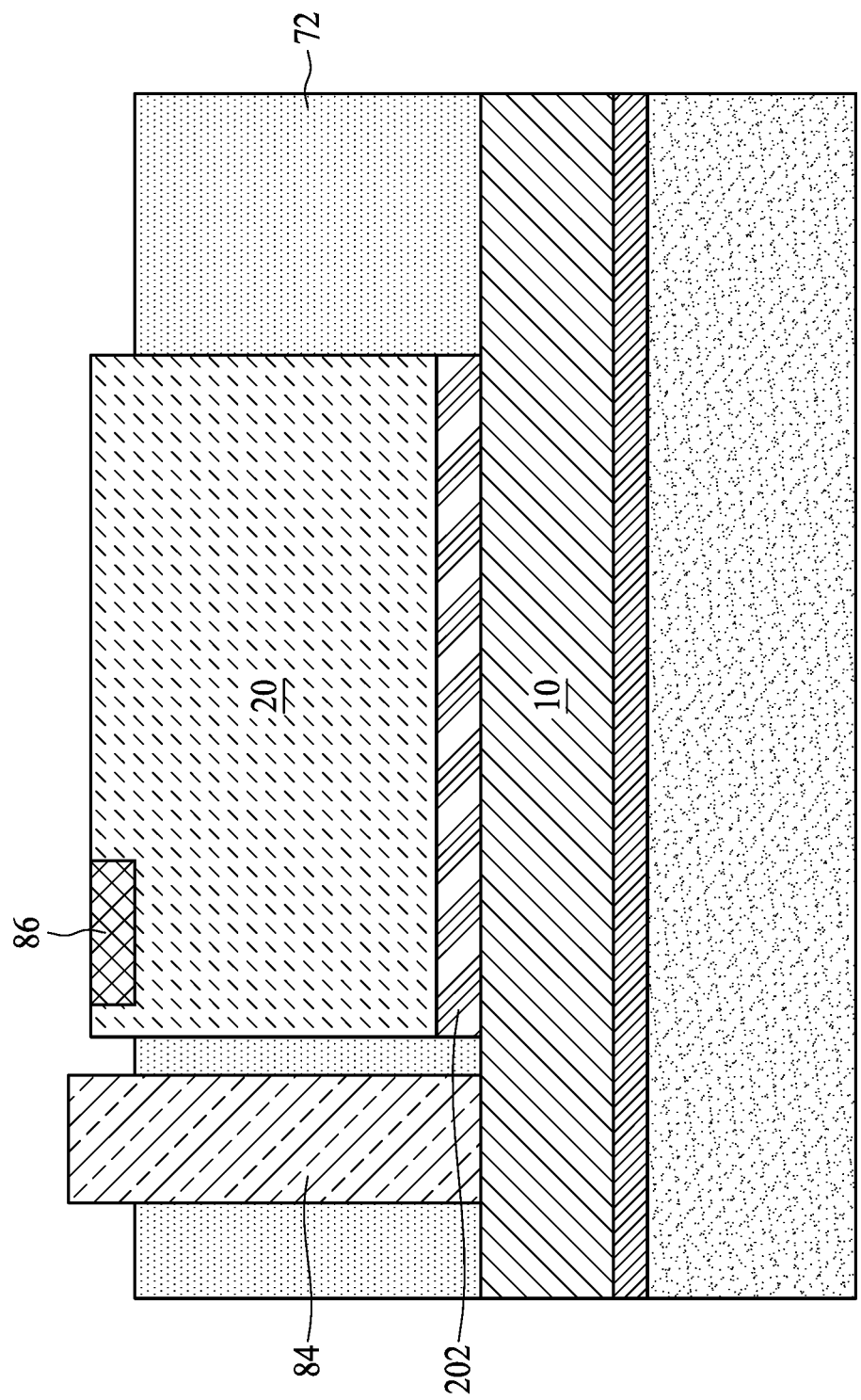
Figure 9G:
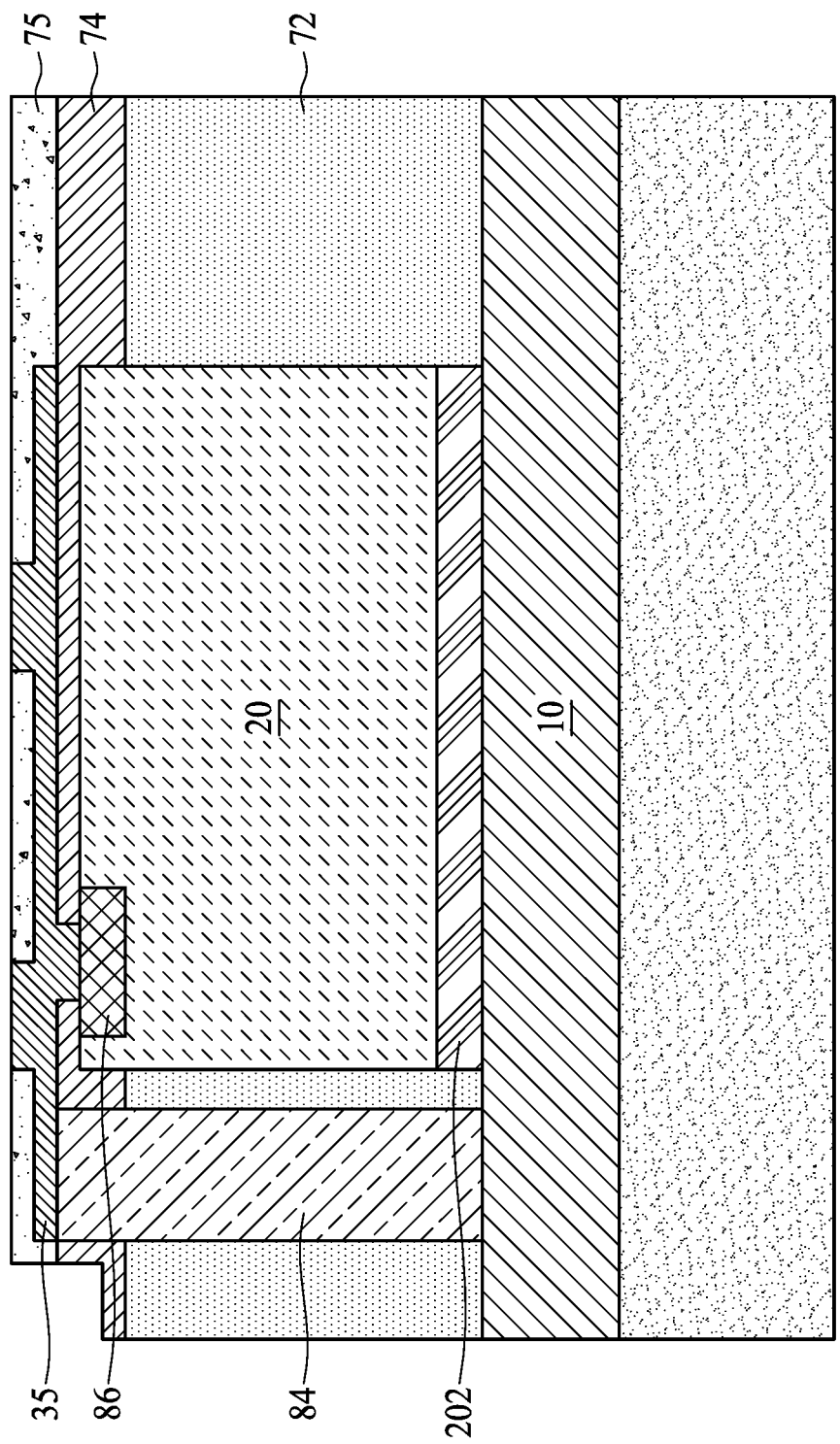

Referring to FIG. 9F, a first molding compound 72 is formed on the RDL structure 10. The first molding compound 72 encapsulates a portion of the die 20 and a portion of the conductive post 84. Referring to FIG. 9G, molding compound 74 and 75, a conductive layer 35 are formed on the first molding compound 72, die 20 and conductive post 84.

Figure 9H:
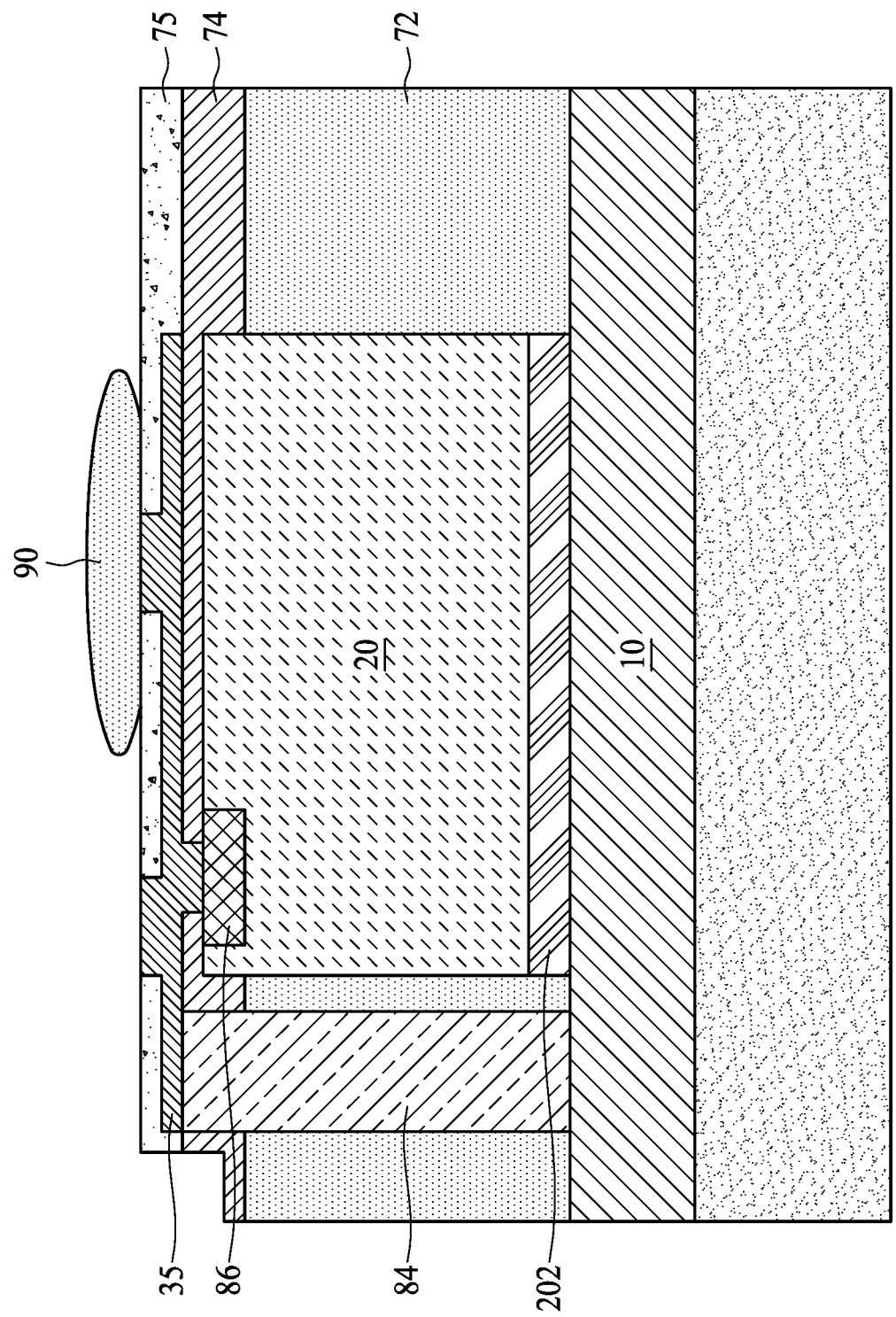

Referring to FIG. 9H, a bump 90 is formed on the molding compound 75.

Figure 9I:
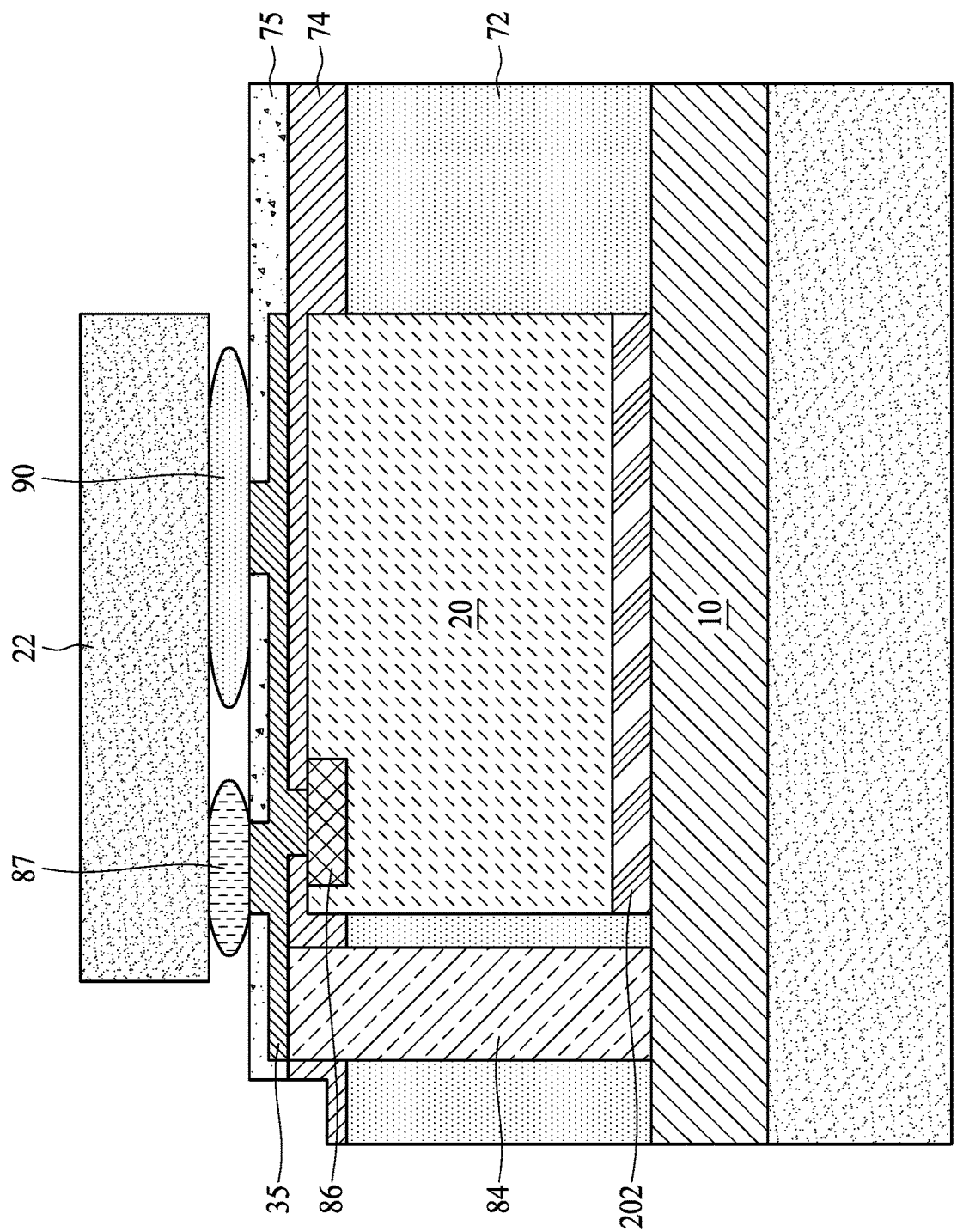
Figure 9J:
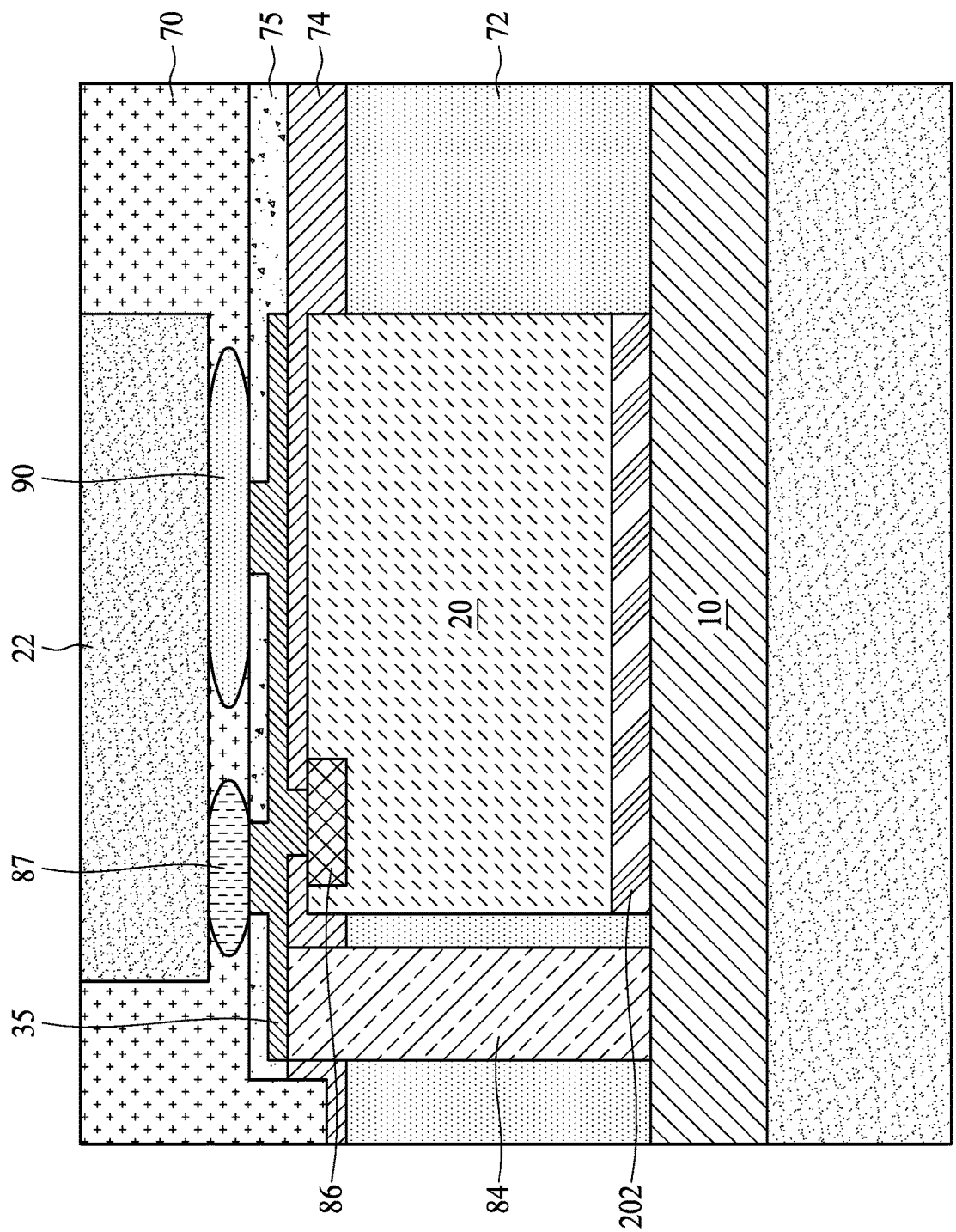

Referring to FIG. 9I, a die 22 is disposed on the bump 90. Referring to FIG. 9J, a second molding compound 70 is disposed on the molding compound 75. The second molding compound 70 encapsulates the die 22, bump 90, and molding compounds 74 and 75.

Figure 9K:
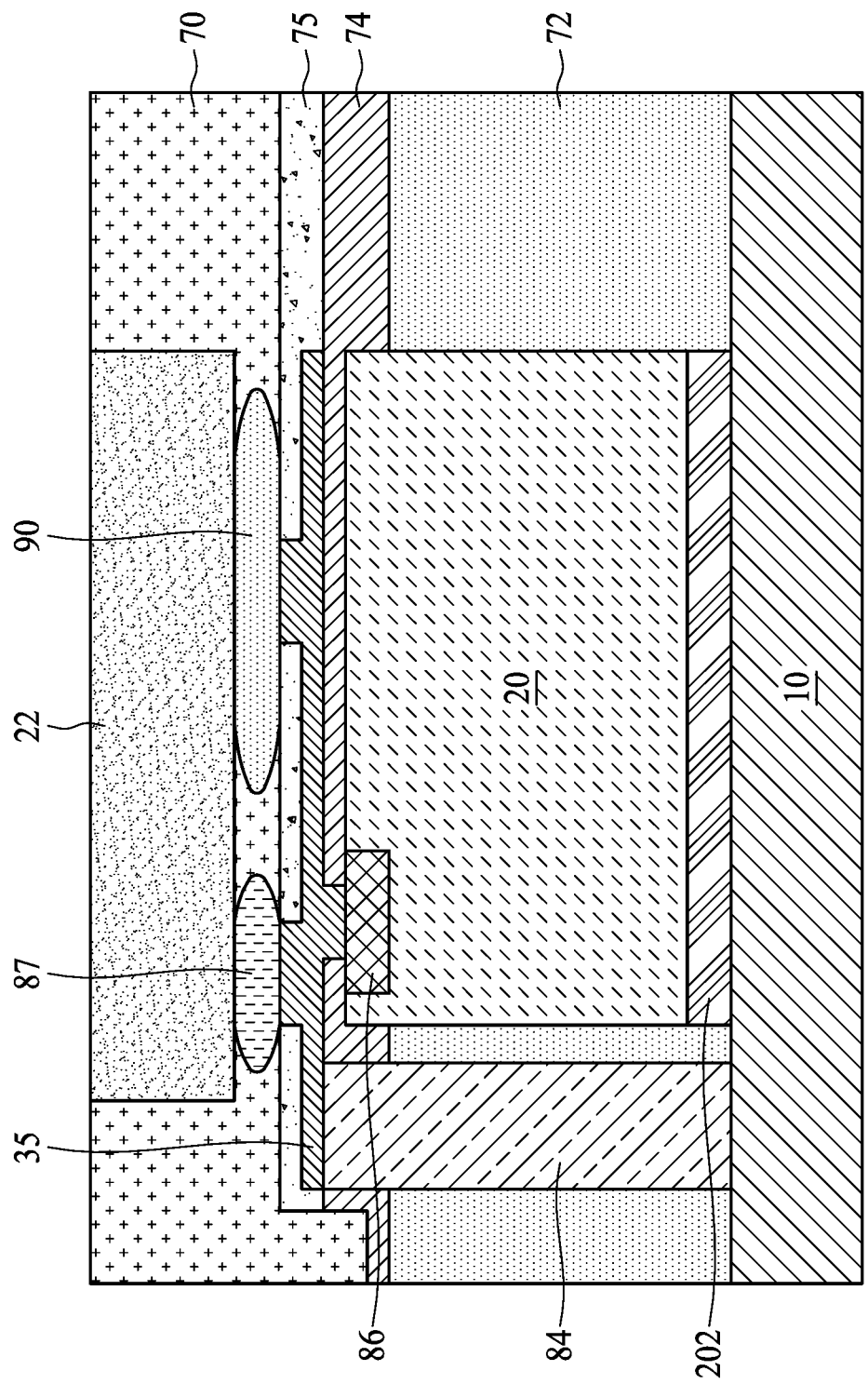
Figure 9L:
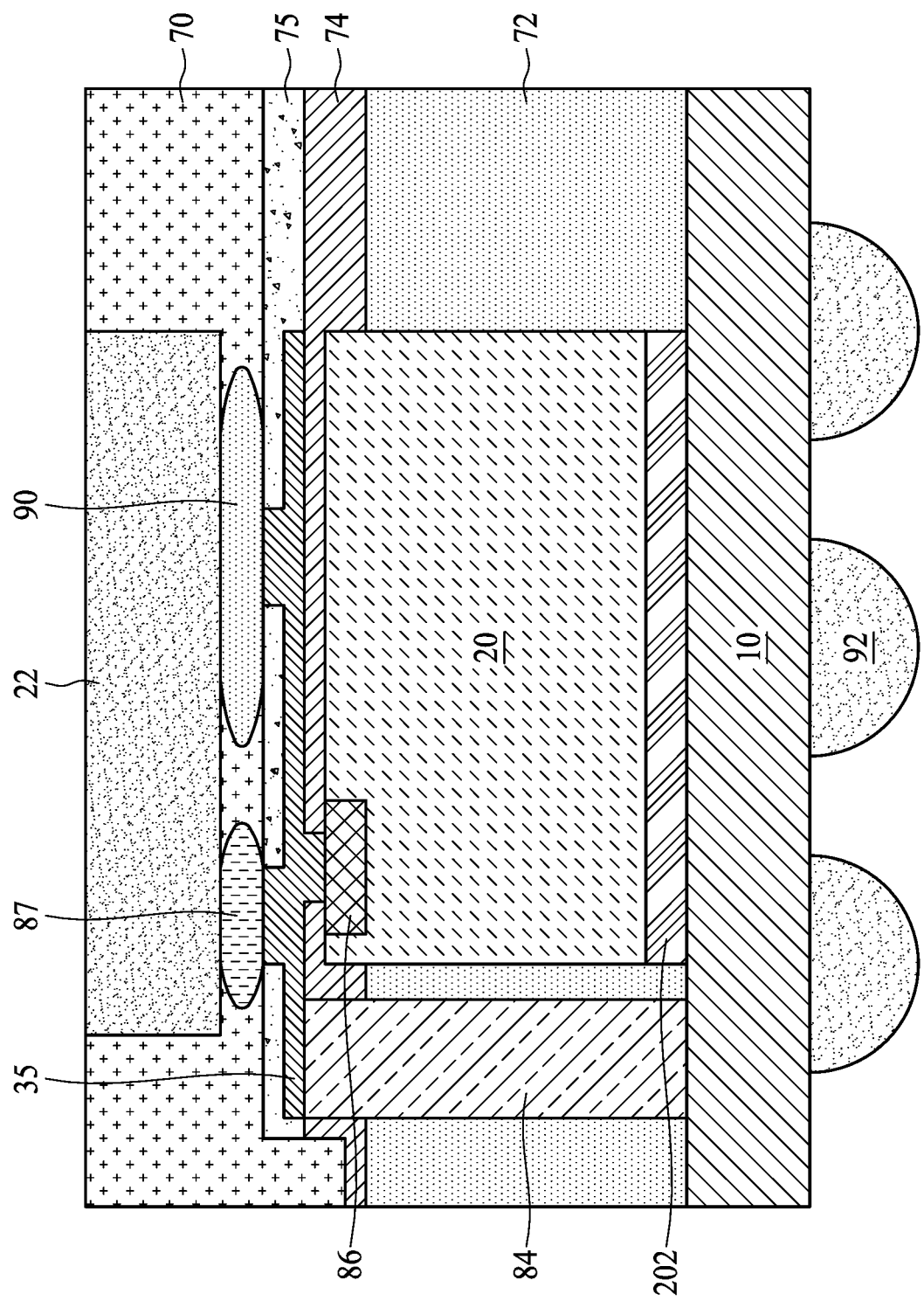

Referring to FIG. 9K, the carrier 102 and release layer 103 are removed. Referring to FIG. 9L, the bumps 92 are attached to the bottom surface of the RDL structure 10 to obtain a semiconductor package 5 similar to the one illustrated in FIG. 8A.

Figure 10A:
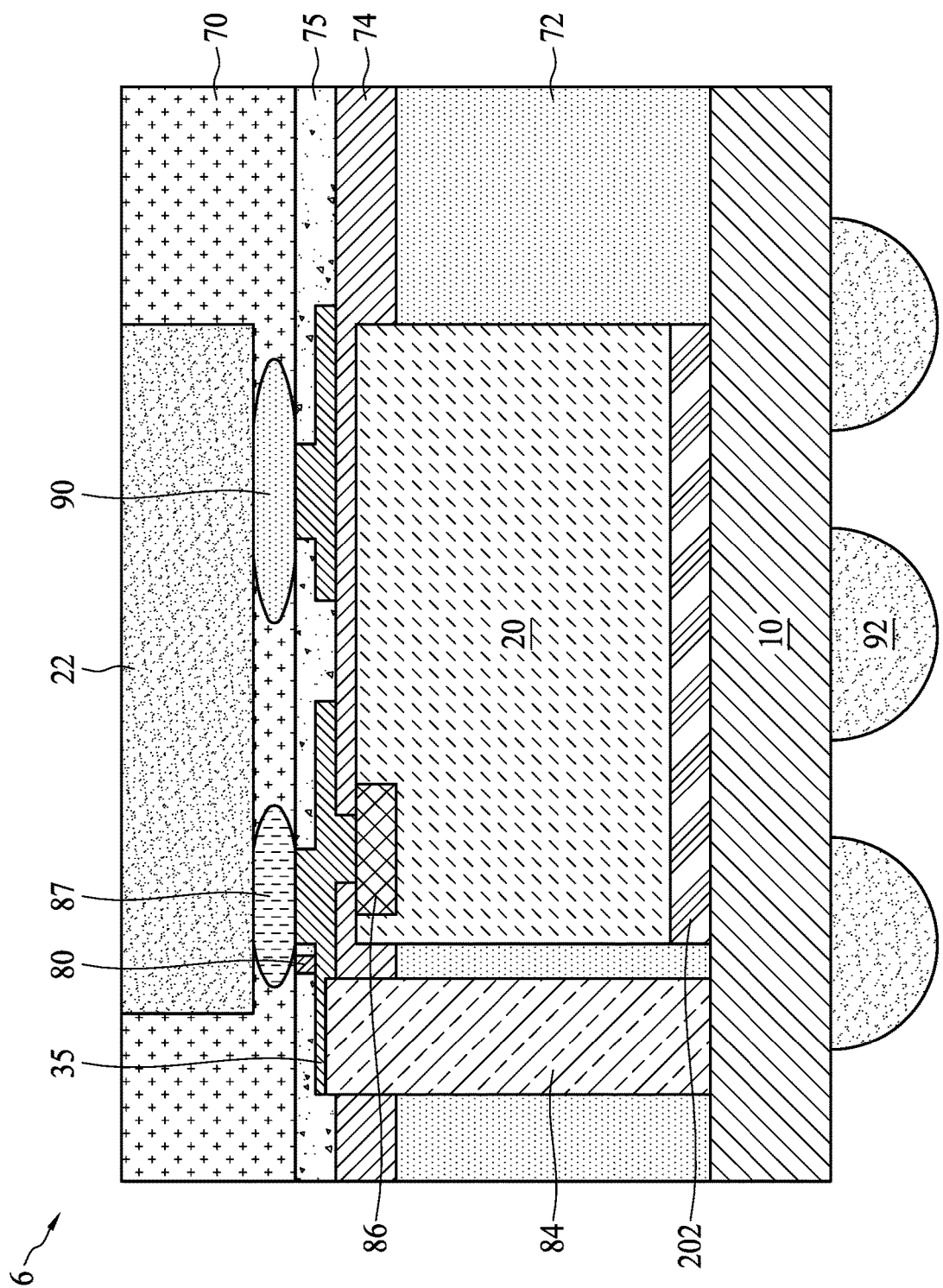
FIG. 10A is a cross-sectional view of a semiconductor package in accordance with an embodiment of the present disclosure.

FIG. 10A is a cross-sectional view of a semiconductor package 6 in accordance with an embodiment of the present disclosure. The semiconductor package 6 includes a RDL structure 10, dies 20 and 22, conductive layer 35, molding compounds 70 and 72, molding compounds 74 and 75 and conductive post 84, bumps 87, 90 and 92. The structure of the semiconductor package 6 of FIG. 10A is similar to the structure of the semiconductor package 5 of FIG. 8A, except that a bump 90 is formed on the second molding compound 70 and electrically connected to the conductive layer 35. In one or more embodiments, the bump 90 may be a solder bump.

Figure 10B:
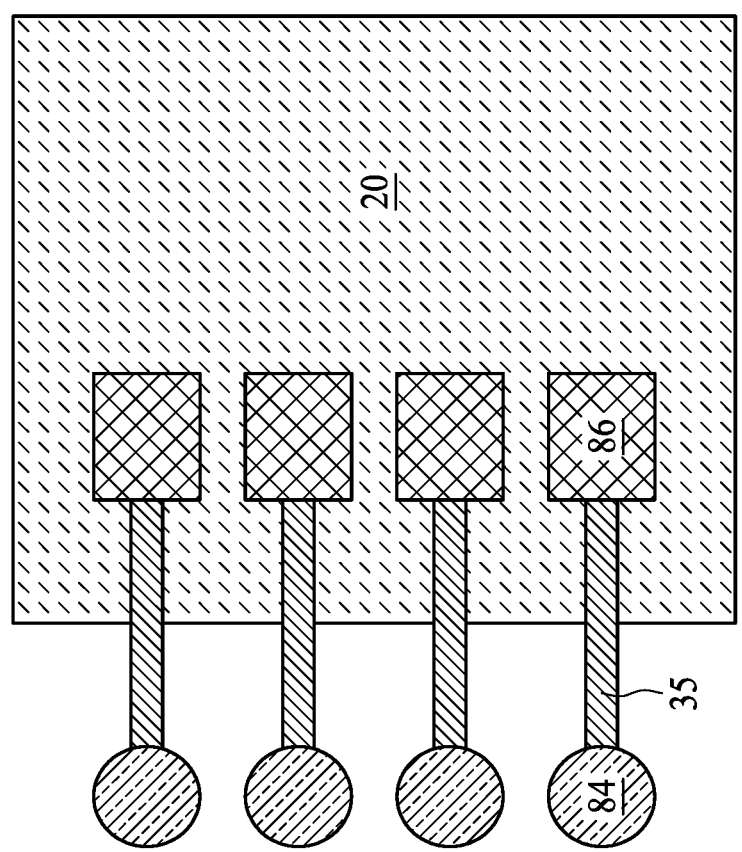
FIG. 10B is a top view of a semiconductor package in accordance with an embodiment of the present disclosure.

FIG. 10B is a top view of a semiconductor package 6 in accordance with an embodiment of the present disclosure. The conductive post 84 electrically connects the die 20 and 22 to the RDL structure 10 through the conductive layer 35.

Figure 11A:
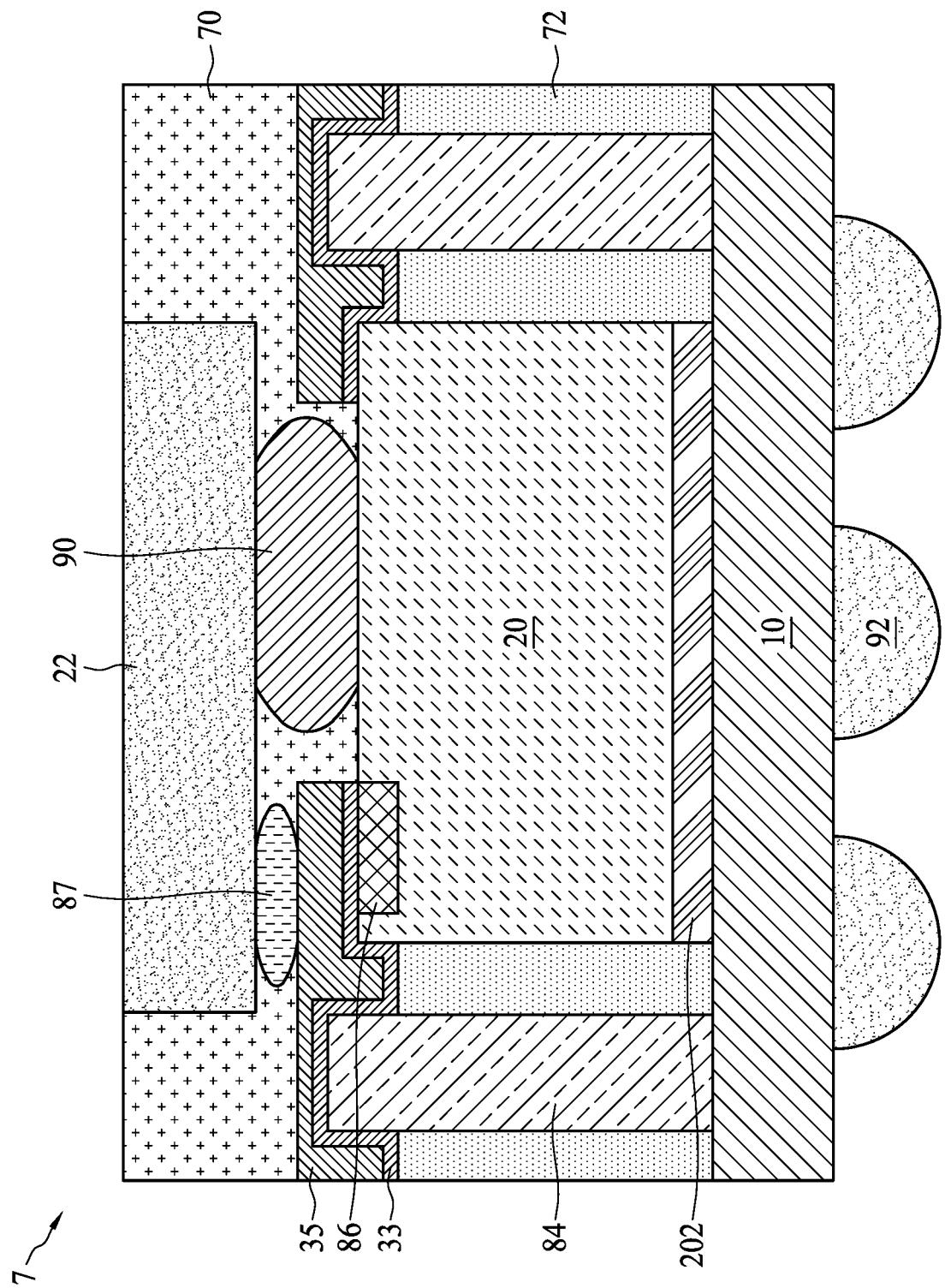
FIG. 11A is a cross-sectional view of a semiconductor package in accordance with an embodiment of the present disclosure.

FIG. 11A is a cross-sectional view of a semiconductor package 7 in accordance with an embodiment of the present disclosure. The semiconductor package 7 includes a RDL structure 10, dies 20 and 22, molding compound 73 and an interconnect structure 88, bumps 90 and 92. The structure of the semiconductor package 7 of FIG. 11A is similar to the structure of the semiconductor package 4 of FIG. 6A, except that there are two interconnect structures 88 formed on the top surface of the RDL structure 10.

As used herein, the terms "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, a first angle may be approximately the same as a second angle if a difference between the first angle and the second angle is less than or equal to ±10°, such as ±5°, ±4°, ±3°, ±2°, ±1°, ±0.5°, ±0.1°, or ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a redistribution layer (RDL) structure;
   a first die disposed on the RDL structure, wherein the first die comprises a conductive pad;
   a molding compound disposed on the RDL structure; and
   an interconnect structure electrically connecting the conductive pad of the first die to the RDL structure,
   wherein the interconnect structure includes a solder paste and a conductive post, and
   wherein the top surface of the conductive post is higher than the top surface of the first die.

2. The semiconductor package of claim 1, wherein the molding compound encapsulates the first die and the conductive post.

3. The semiconductor package of claim 2, wherein the molding compound comprises a first molding compound and a portion of the first die and the conductive post is exposed from the first molding compound.

4. The semiconductor package of claim 3, wherein the top surface of the first molding compound is non-coplanar with the top surface of the first die.

5. The semiconductor package of claim 3, wherein the top surface of the first molding compound is coplanar with the top surface of the first die.

6. The semiconductor package of claim 3, further comprising a second die disposed on the first die and wherein the molding compound further comprises a second molding compound disposed on the first molding compound, wherein the top surface of the second molding compound is coplanar with the top surface of the second die.

7. The semiconductor package of claim 1, further comprising a second die disposed on the first die and a bump disposed between the first die and the second die.

8. The semiconductor package of claim 1, further comprising a second RDL structure on the first die and the conductive post.

9. The semiconductor package of claim 1, wherein the solder paste is a lateral conductive structure extending from the conductive post to a conductive terminal of the first die.

10. A semiconductor package, comprising:
    a redistribution layer (RDL) structure;
    a first die disposed on the RDL structure;
    a second die disposed on the first die; and
    an interconnect structure contact with a side of the first die and providing electrical connection between the first die, the second die and the RDL structure,
    wherein the interconnect structure includes a solder paste and a conductive post.

11. The semiconductor package of claim 10, further comprising a first molding compound disposed on the RDL structure, wherein the top surface of the first molding compound includes a wax material.

12. The semiconductor package of claim 11, wherein the first molding compound encapsulates the first die and the conductive post.

13. The semiconductor package of claim 11, wherein a portion of the first die and the conductive post is exposed from the first molding compound.

14. The semiconductor package of claim 11, wherein the top surface of the first molding compound is non-coplanar with the top surface of the first die.

15. The semiconductor package of claim 11, further comprising a bump disposed between the second die and the first molding compound.

16. The semiconductor package of claim 10, wherein the solder paste is a lateral conductive structure extending from the conductive post to a conductive terminal of the first die.

17. A method for manufacturing a semiconductor package, comprising:
    providing a redistribution layer (RDL) structure having a first surface;
    providing a first die on the first surface of the RDL structure;
    forming a conductive post on and electrically connected to the RDL structure, wherein the conductive post is extended from a direction perpendicular to the first surface of RDL structure;
    using a mold to encapsulate the first die and the conductive post by a first molding compound, wherein a portion of the first die and a portion of the conductive post are exposed from the first molding compound through a release film of the mold; and
    forming a lateral conductive structure extending from the conductive post to a conductive terminal of the first die, wherein the lateral conductive structure includes a solder paste.

18. The method of claim 17, further comprising forming a bump on the first die.

19. The method of claim 18, further comprising electrically connecting a second die to the bump.

20. The method of claim 17, wherein a portion of the conductive post is surrounded by the release film of the mold when encapsulating the first die and the conductive post.

* * * * *